(12) United States Patent
Endo et al.

(10) Patent No.: US 10,699,904 B2
(45) Date of Patent: Jun. 30, 2020

(54) SEMICONDUCTOR DEVICE AND METHOD FOR MANUFACTURING THEREOF

(71) Applicant: Semiconductor Energy Laboratory Co., Ltd., Kanagawa-ken (JP)

(72) Inventors: Yuta Endo, Kanagawa (JP); Kosei Noda, Kanagawa (JP); Yuichi Sato, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/488,854

(22) Filed: Apr. 17, 2017

(65) Prior Publication Data

US 2017/0221707 A1 Aug. 3, 2017

Related U.S. Application Data

(63) Continuation of application No. 14/451,854, filed on Aug. 5, 2014, now Pat. No. 9,634,149.

(30) Foreign Application Priority Data

Aug. 7, 2013 (JP) .................................. 2013-163811

(51) Int. Cl.
*H01L 29/786* (2006.01)
*H01L 29/66* (2006.01)
(Continued)

(52) U.S. Cl.
CPC .. *H01L 21/02554* (2013.01); *H01L 21/02565* (2013.01); *H01L 21/02576* (2013.01);
(Continued)

(58) Field of Classification Search
CPC ........... H01L 29/7869; H01L 29/78696; H01L 29/78606; H01L 21/02694; H01L 21/324;
(Continued)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Zandra V Smith
*Assistant Examiner* — Jeremy J Joy
(74) *Attorney, Agent, or Firm* — Husch Blackwell LLP

(57) ABSTRACT

A transistor that is formed using an oxide semiconductor film is provided. A transistor that is formed using an oxide semiconductor film with reduced oxygen vacancies is provided. A transistor having excellent electrical characteristics is provided. A semiconductor device includes a first insulating film, a first oxide semiconductor film, a gate insulating film, and a gate electrode. The first insulating film includes a first region and a second region. The first region is a region that transmits less oxygen than the second region does. The first oxide semiconductor film is provided at least over the second region.

12 Claims, 35 Drawing Sheets

(51) Int. Cl.
   *H01L 29/49*      (2006.01)
   *H01L 29/06*      (2006.01)
   *H01L 21/8238*    (2006.01)
   *H01L 21/8234*    (2006.01)
   *H01L 21/461*     (2006.01)
   *H01L 21/3115*    (2006.01)
   *H01L 21/02*      (2006.01)

(52) U.S. Cl.
   CPC .. *H01L 21/02579* (2013.01); *H01L 21/31155* (2013.01); *H01L 21/461* (2013.01); *H01L 21/823437* (2013.01); *H01L 21/823857* (2013.01); *H01L 29/0653* (2013.01); *H01L 29/4908* (2013.01); *H01L 29/4933* (2013.01); *H01L 29/6659* (2013.01); *H01L 29/66969* (2013.01); *H01L 29/7869* (2013.01); *H01L 29/78603* (2013.01); *H01L 29/78606* (2013.01); *H01L 29/78696* (2013.01)

(58) Field of Classification Search
   CPC ......... H01L 21/02664; H01L 29/42316; H01L 29/66462; H01L 29/7787
   See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 * | 5/2007 | Shih ................. H01L 29/78633 257/13 |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,440,510 B2 | 5/2013 | Yamazaki |
| 8,519,387 B2 | 8/2013 | Endo et al. |
| 8,530,289 B2 | 9/2013 | Yamazaki |
| 8,547,771 B2 | 10/2013 | Koyama |
| 8,624,650 B2 | 1/2014 | Ishii |
| 8,637,348 B2 | 1/2014 | Endo et al. |
| 8,664,118 B2 | 3/2014 | Ishizuka et al. |
| 8,669,148 B2 | 3/2014 | Yamazaki |
| 8,748,240 B2 | 6/2014 | Yamazaki |
| 8,809,992 B2 | 8/2014 | Yamazaki et al. |
| 8,975,115 B2 | 3/2015 | Endo et al. |
| 9,012,905 B2 | 4/2015 | Yamazaki |
| 9,023,684 B2 | 5/2015 | Suzawa et al. |
| 9,099,303 B2 | 8/2015 | Yamazaki |
| 9,219,161 B2 * | 12/2015 | Yamazaki ........... H01L 29/7869 |
| 9,385,238 B2 | 7/2016 | Yamazaki |
| 9,431,545 B2 | 8/2016 | Saito et al. |
| 9,768,279 B2 | 9/2017 | Noda et al. |
| 9,837,548 B2 | 12/2017 | Yamazaki |
| 9,893,196 B2 | 2/2018 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0228457 A1 * | 10/2007 | Mori ................. H01L 29/66757 257/324 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 * | 2/2008 | Takechi ............... H01L 29/4908 438/151 |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 * | 12/2008 | Ryu ................. H01L 21/02554 257/43 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140053 A1 * | 6/2009 | Yamazaki ........... H01L 27/1218 235/492 |
| 2009/0152506 A1 | 6/2009 | Umeda et al. |
| 2009/0152541 A1 | 6/2009 | Maekawa et al. |
| 2009/0236600 A1 * | 9/2009 | Yamazaki ............... H01L 29/04 257/59 |
| 2009/0278120 A1 * | 11/2009 | Lee ..................... H01L 29/7869 257/43 |
| 2009/0278122 A1 | 11/2009 | Hosono et al. |
| 2009/0280600 A1 | 11/2009 | Hosono et al. |
| 2009/0321732 A1 * | 12/2009 | Kim ................. H01L 29/78606 257/43 |

(56) References Cited

U.S. PATENT DOCUMENTS

| | | | |
|---|---|---|---|
| 2010/0038641 A1* | 2/2010 | Imai | H01L 29/7869 257/57 |
| 2010/0065844 A1 | 3/2010 | Tokunaga | |
| 2010/0072516 A1* | 3/2010 | Tamura | H01L 21/30617 257/192 |
| 2010/0092800 A1 | 4/2010 | Itagaki et al. | |
| 2010/0109002 A1 | 5/2010 | Itagaki et al. | |
| 2010/0213461 A1* | 8/2010 | Akimoto | H01L 27/1225 257/43 |
| 2011/0101351 A1 | 5/2011 | Yamazaki | |
| 2011/0108835 A1* | 5/2011 | Kim | H01L 29/7869 257/43 |
| 2011/0111558 A1 | 5/2011 | Yamazaki et al. | |
| 2011/0121911 A1 | 5/2011 | Kamata | |
| 2011/0140100 A1* | 6/2011 | Takata | H01L 29/7869 257/43 |
| 2011/0147738 A1* | 6/2011 | Yamazaki | H01L 21/425 257/43 |
| 2011/0148497 A1 | 6/2011 | Ishii | |
| 2011/0240987 A1* | 10/2011 | Lee | H01L 29/78648 257/43 |
| 2011/0240990 A1* | 10/2011 | Yamazaki | H01L 29/786 257/43 |
| 2011/0309411 A1* | 12/2011 | Takemura | H01L 29/7869 257/192 |
| 2012/0018727 A1* | 1/2012 | Endo | H01L 29/66742 257/57 |
| 2012/0132903 A1* | 5/2012 | Yamazaki | H01L 21/02565 257/43 |
| 2012/0161126 A1 | 6/2012 | Yamazaki | |
| 2012/0187396 A1* | 7/2012 | Yamazaki | H01L 29/66742 257/43 |
| 2012/0187397 A1 | 7/2012 | Yamazaki et al. | |
| 2012/0223305 A1 | 9/2012 | Sato et al. | |
| 2012/0225520 A1* | 9/2012 | Suzawa | H01L 29/4908 438/104 |
| 2012/0256178 A1* | 10/2012 | Yamazaki | H01L 29/78603 257/43 |
| 2012/0258575 A1 | 10/2012 | Sato et al. | |
| 2012/0286278 A1* | 11/2012 | Kondo | H01L 29/45 257/60 |
| 2012/0313114 A1* | 12/2012 | Park | H01L 29/41733 257/88 |
| 2012/0315735 A1 | 12/2012 | Koezuka et al. | |
| 2012/0319102 A1* | 12/2012 | Yamazaki | H01L 29/7869 257/43 |
| 2013/0009148 A1* | 1/2013 | Yamazaki | H01L 29/7869 257/43 |
| 2013/0009209 A1* | 1/2013 | Yamazaki | H01L 27/1225 257/192 |
| 2013/0011961 A1 | 1/2013 | Ishizuka et al. | |
| 2013/0056727 A1 | 3/2013 | Yamade et al. | |
| 2013/0164920 A1 | 6/2013 | Yamazaki | |
| 2013/0244374 A1* | 9/2013 | Okazaki | H01L 29/4908 438/104 |
| 2013/0292675 A1* | 11/2013 | Tsubuku | H01L 29/66969 257/57 |
| 2014/0027762 A1* | 1/2014 | Tsurume | H01L 29/24 257/43 |
| 2014/0111262 A1 | 4/2014 | Ishii | |
| 2014/0151688 A1 | 6/2014 | Yamazaki | |
| 2014/0154837 A1 | 6/2014 | Yamazaki | |
| 2014/0291673 A1* | 10/2014 | Yamazaki | H01L 29/7869 257/43 |
| 2014/0319517 A1 | 10/2014 | Noda et al. | |
| 2014/0362652 A1* | 12/2014 | Luo | G11C 11/404 365/191 |
| 2015/0001534 A1* | 1/2015 | Chang | H01L 29/66969 257/43 |
| 2015/0037932 A1 | 2/2015 | Yamazaki et al. | |
| 2015/0228802 A1 | 8/2015 | Suzawa et al. | |
| 2018/0090619 A1 | 3/2018 | Yamazaki | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-243974 A | 12/2011 |
| JP | 2011-258939 A | 12/2011 |
| JP | 2012-049513 A | 3/2012 |
| JP | 2012-169605 A | 9/2012 |
| JP | 2012-199527 A | 10/2012 |
| JP | 2012-227521 A | 11/2012 |
| JP | 2012-227523 A | 11/2012 |
| JP | 2012-257187 A | 12/2012 |
| JP | 2013-038402 A | 2/2013 |
| JP | 2013-102131 A | 5/2013 |
| JP | 2013-149968 A | 8/2013 |
| JP | 2014-232867 A | 12/2014 |
| WO | WO 2004/114391 A1 | 12/2004 |
| WO | WO 2011/142467 A1 | 11/2011 |
| WO | WO 2013/008407 A1 | 1/2013 |
| WO | WO 2014/178357 A1 | 11/2014 |

OTHER PUBLICATIONS

Asaoka, Y. et al., "29.1:Polarizer-Free Reflective LCD Combined With Ultra Low-Power Driving Technology," SID Digest '09 : SID International Symposium Digest of Technical Papers, May 31, 2009, pp. 395-398.

Chern, H.N. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D.H. et al., "21.2:Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S.J. et al., "First Principles Methods Using CASTEP," Zeitschrift fur Kristallographie, 2005, vol. 220, pp. 567-570.

Coates, D. et al., "Optical Studies of the Amorphous Liquid-Cholesteric Liquid Crystal Transition:The Blue Phase," Physics Letters, Sep. 10, 1973, vol. 45A, No. 2, pp. 115-116.

Costello, M.J. et al., "Electron Microscopy of a Cholesteric Liquid Crystal and Its Blue Phase," Physical Review. A, May 1, 1984, vol. 29, No. 5, pp. 2957-2959.

Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E.M.C. et al., "Wide-Bandgap High-Mobility ZnO Thin-Film Transistors Produced at Room Temperature," Applied Physics Letters, Sep. 27, 2004, vol. 85, No. 13, pp. 2541-2543.

Fung, T.C. et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H. et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

(56) References Cited

OTHER PUBLICATIONS

Godo, H. et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R. et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T. et al., "Novel Top-Gate Zinc Oxide Thin-Film Transistors (ZnO TFTs) for AMLCDS," Journal of the Society for Information Display, 2007, vol. 15, No. 1, pp. 17-22.

Hosono, H. et al., "Working hypothesis to explore novel wide band gap electrically conducting amorphous oxides and examples," Journal of Non-Crystalline Solids, 1996, vol. 198-200, pp. 165-169.

Hosono, H., "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H-H. et al., "P-29: Modeling of Amorphous Oxide Semiconductor Thin Film Transistors and Subgap Density of States," SID Digest '08 : SID International Symposium Digest of Technical Papers, May 20, 2008, vol. 39, pp. 1277-1280.

Ikeda, T. et al., "Full-Functional System Liquid Crystal Display Using CG-Silicon Technology," SID Digest '04 : SID International Symposium Digest of Technical Papers, 2004, vol. 35, pp. 860-863.

Janotti, A. et al., "Native Point Defects in ZnO," Physical Review. B, Oct. 4, 2007, vol. 76, No. 16, pp. 165202-1-165202-22.

Janotti, A. et al., "Oxygen Vacancies in ZnO," Applied Physics Letters, 2005, vol. 87, pp. 122102-1-122102-3.

Jeong, J.K. et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D-U. et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H. et al., "White Stacked Electrophosphorecent Organic Light-Emitting Devices Employing MOO3 as a Charge-Generation Layer," Advanced Materials, 2006, vol. 18, No. 3, pp. 339-342.

Kikuchi, H. et al., "39.1:Invited Paper:Optically Isotropic Nano-Structured Liquid Crystal Composites for Display Applications," SID Digest '09 : SID International Symposium Digest of Technical Papers, May 31, 2009, pp. 578-581.

Kikuchi, H. et al., "62.2:Invited Paper:Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H. et al., "Polymer-Stabilized Liquid Crystal Blue Phases," Nature Materials, Sep. 2, 2002, vol. 1, pp. 64-68.

Kim, S. et al., "High-Performance Oxide Thin Film Transistors Passivated by Various Gas Plasmas," 214th ECS Meeting, 2008, No. 2317, ECS.

Kimizuka, N. et al., "Spinel,YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000°C," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H-S. et al., "Observation of Blue Phases in Chiral Networks," Liquid Crystals, 1993, vol. 14, No. 3, pp. 911-916.

Kurokawa, Y. et al., "UHF RFCPUS on Flexible and Glass Substrates for Secure RFID Systems," Journal of Solid-State Circuits, 2008, vol. 43, No. 1, pp. 292-299.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Lee, H.N. et al., "Current Status of, Challenges to, and Perspective View of AM-OLED," IDW '06 : Proceedings of the 13th International Display Workshops, Dec. 7, 2006, pp. 663-666.

Lee, J-H. et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M-H. et al., "15.4:Excellent Performance of Indium-Oxide-Based Thin-Film Transistors by DC Sputtering," SID Digest '09 : SID International Symposium Digest of Technical Papers, May 31, 2009, pp. 191-193.

Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S. et al., "Transparent thin film transistors using ZnO as an active channel layer and their electrical properties," Journal of Applied Physics, Feb. 1, 2003, vol. 93, No. 3, pp. 1624-1630.

Meiboom, S. et al., "Theory of the Blue Phase of Cholesteric Liquid Crystals," Physical Review Letters, May 4, 1981, vol. 46, No. 18, pp. 1216-1219.

Miyasaka, M., "SUFTLA Flexible Microelectronics on Their Way to Business," SID Digest '07 : SID International Symposium Digest of Technical Papers, 2007, vol. 38, pp. 1673-1676.

Mo, Y-G. et al., "Amorphous Oxide TFT Backplanes for Large Size AMOLED Displays," IDW '08 : Proceedings of the 6th International Display Workshops, Dec. 3, 2008, pp. 581-584.

Nakamura, M. et al., "The phase relations in the In2O3-Ga2ZnO4-ZnO system at 1350°C.," Journal of Solid State Chemistry, Aug. 1, 1991, vol. 93, No. 2, pp. 298-315.

Nakamura, M., "Synthesis of Homologous Compound with New Long-Period Structure," NIRIM Newsletter, Mar. 1, 1995, vol. 150, pp. 1-4.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Nomura, K. et al., "Carrier transport in transparent oxide semiconductor with intrinsic structural randomness probed using single-crystalline InGaO3(ZnO)5 films," Applied Physics Letters, Sep. 13, 2004, vol. 85, No. 11, pp. 1993-1995.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Nowatari, H. et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F. et al., "Defect energetics in ZnO: A hybrid Hartree-Fock density functional study," Physical Review. B, 2008, vol. 77, pp. 245202-1-245202-6.

Oh, M.S. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ohara, H. et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

Ohara, H. et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M. et al., "Amorphous transparent conductive oxide InGaO3(ZnO)m (m<4):a Zn4s conductor," Philosophical Magazine, 2001, vol. 81, No. 5, pp. 501-515.

Orita, M. et al., "Mechanism of Electrical Conductivity of Transparent InGaZnO4," Physical Review. B, Jan. 15, 2000, vol. 61, No. 3, pp. 1811-1816.

(56) References Cited

OTHER PUBLICATIONS

Osada, T. et al., "15.2: Development of Driver-Integrated Panel using Amorphous In—Ga—Zn-Oxide TFT," SID Digest '09 : SID International Symposium Digest of Technical Papers, May 31, 2009, vol. 40, pp. 184-187.

Osada, T. et al., "Development of Driver-Integrated Panel Using Amorphous In—Ga—Zn-Oxide TFT," AM-FPD '09 Digest of Technical Papers, Jul. 1, 2009, pp. 33-36.

Park, J-S. et al., "Amorphous Indium-Gallium-Zinc Oxide TFTs and Their Application for Large Size AMOLED," AM-FPD '08 Digest of Technical Papers, Jul. 2, 2008, pp. 275-278.

Park, J.S. et al., "Dry etching of ZnO films and plasma-induced damage to optical properties," Journal of Vacuum Science & Technology B, Mar. 1, 2003, vol. 21, No. 2, pp. 800-803.

Park, J-S. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

Park, J.C. et al., "High performance amorphous oxide thin film transistors with self-aligned top-gate structure," IEDM 09: Technical Digest of International Electron Devices Meeting, Dec. 7, 2009, pp. 191-194.

Park, J-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, S. et al., "Challenge to Future Displays: Transparent AM-OLED Driven by Peald Grown ZnO TFT," IMID '07 Digest, 2007, pp. 1249-1252.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Prins, M.W.J. et al., "A Ferroelectric Transparent Thin-Film Transistor," Applied Physics Letters, Jun. 17, 1996, vol. 68, No. 25, pp. 3650-3652.

Sakata, J. et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K.-S. et al., "42.4L: Late-News Paper: 4 Inch QVGA AMOLED Driven by the Threshold Voltage Controlled Amorphous GIZO (Ga2O3-In2O3-ZnO) TFT," SID Digest '08 ; SID International Symposium Digest of Technical Papers, May 20, 2008, vol. 39, pp. 633-636.

Takahashi, M. et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K. et al., "Ultra Low Power Consumption Technologies for Mobile TFT-LCDs," IDW '02 : Proceedings of the 9th International Display Workshops, Dec. 4, 2002, pp. 295-298.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

Van de Walle, C.G., "Hydrogen as a Cause of Doping in Zinc Oxide," Physical Review Letters, Jul. 31, 2000, vol. 85, No. 5, pp. 1012-1015.

* cited by examiner

FIG. 2A1
FIG. 2A2
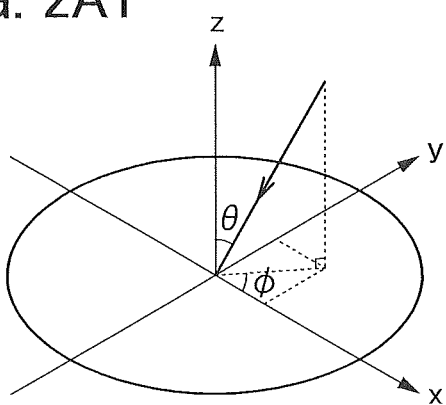
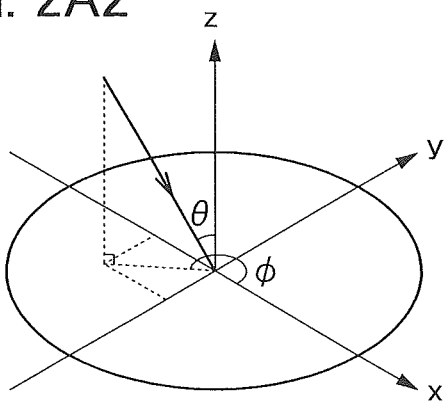
FIG. 2B
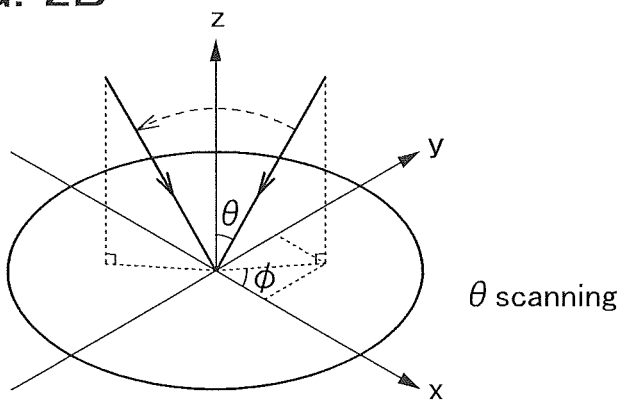
θ scanning
FIG. 2C
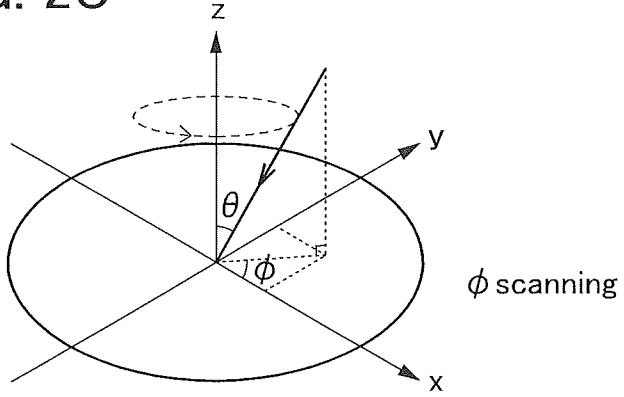
φ scanning

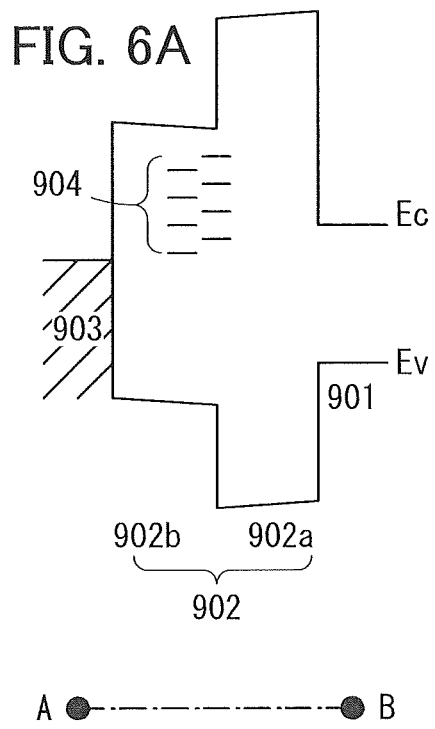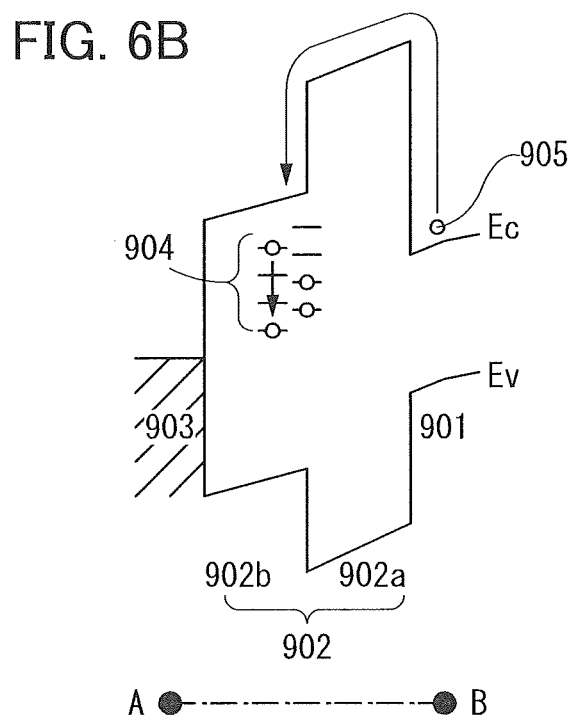

906 before electron trapping
907 after electron trapping

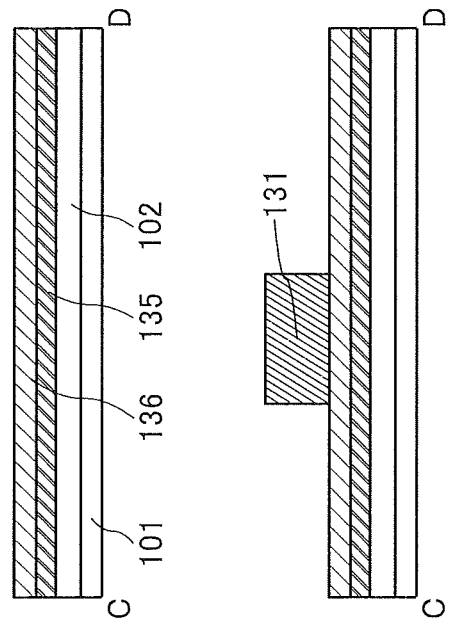
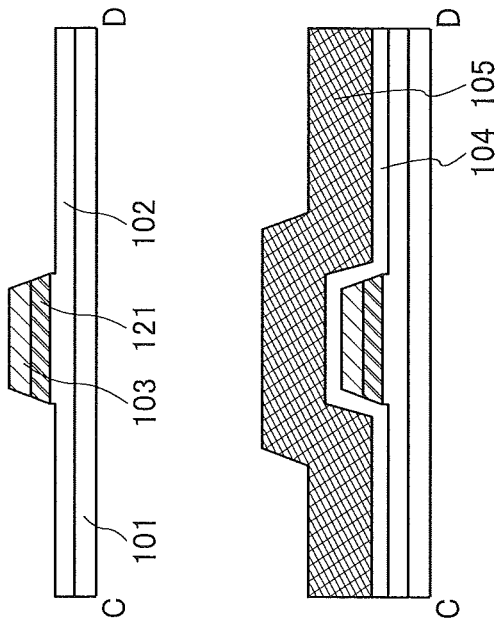
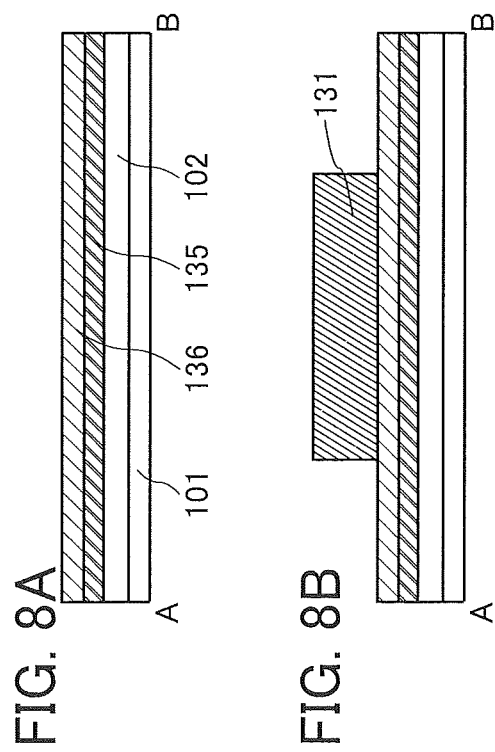
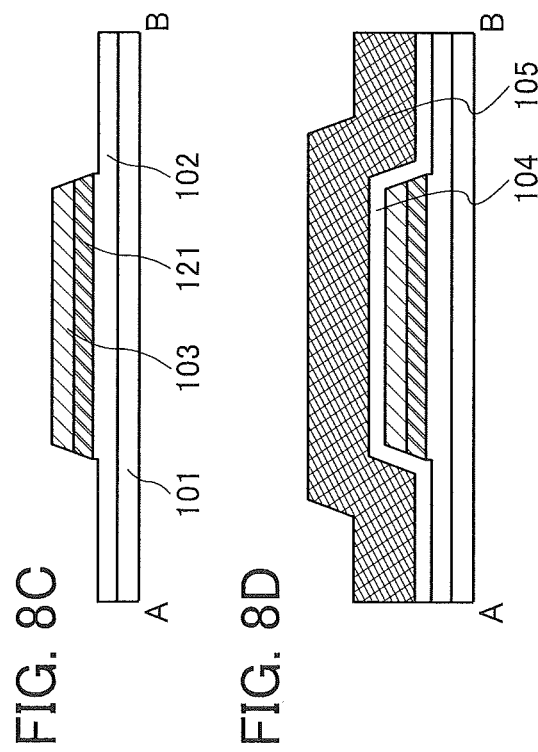

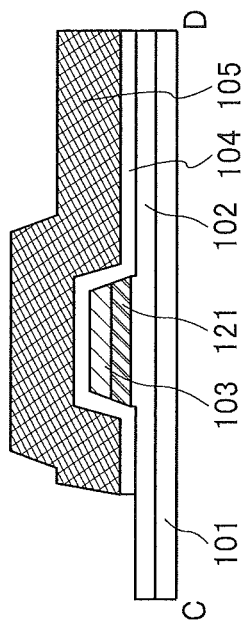
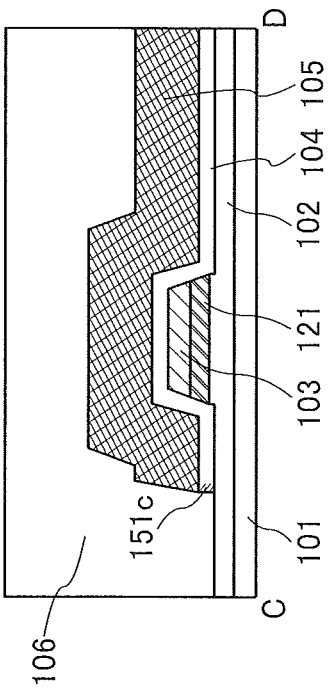
FIG. 9A
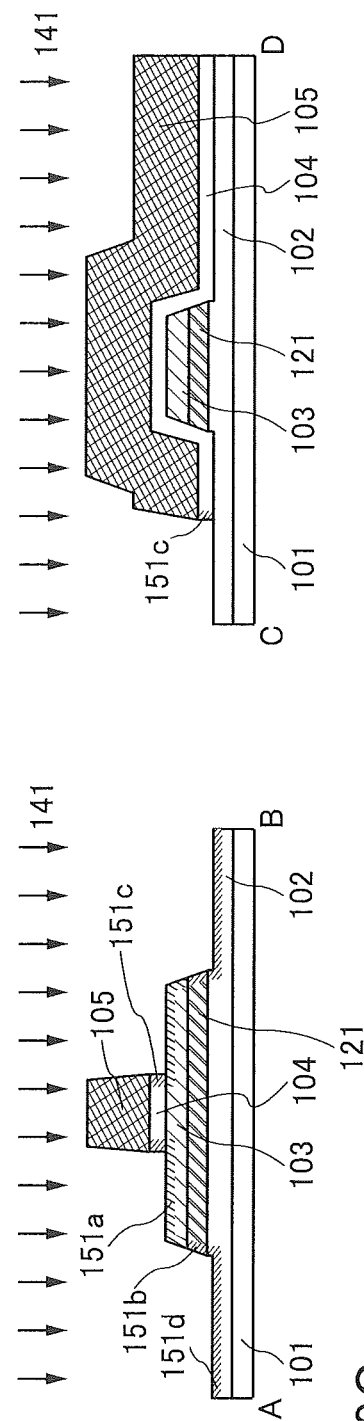
FIG. 9B
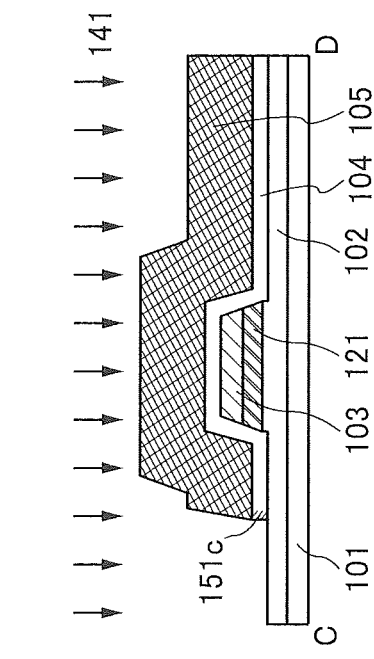
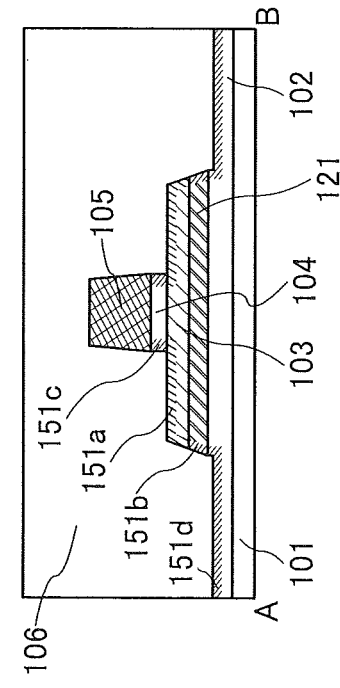
FIG. 9C

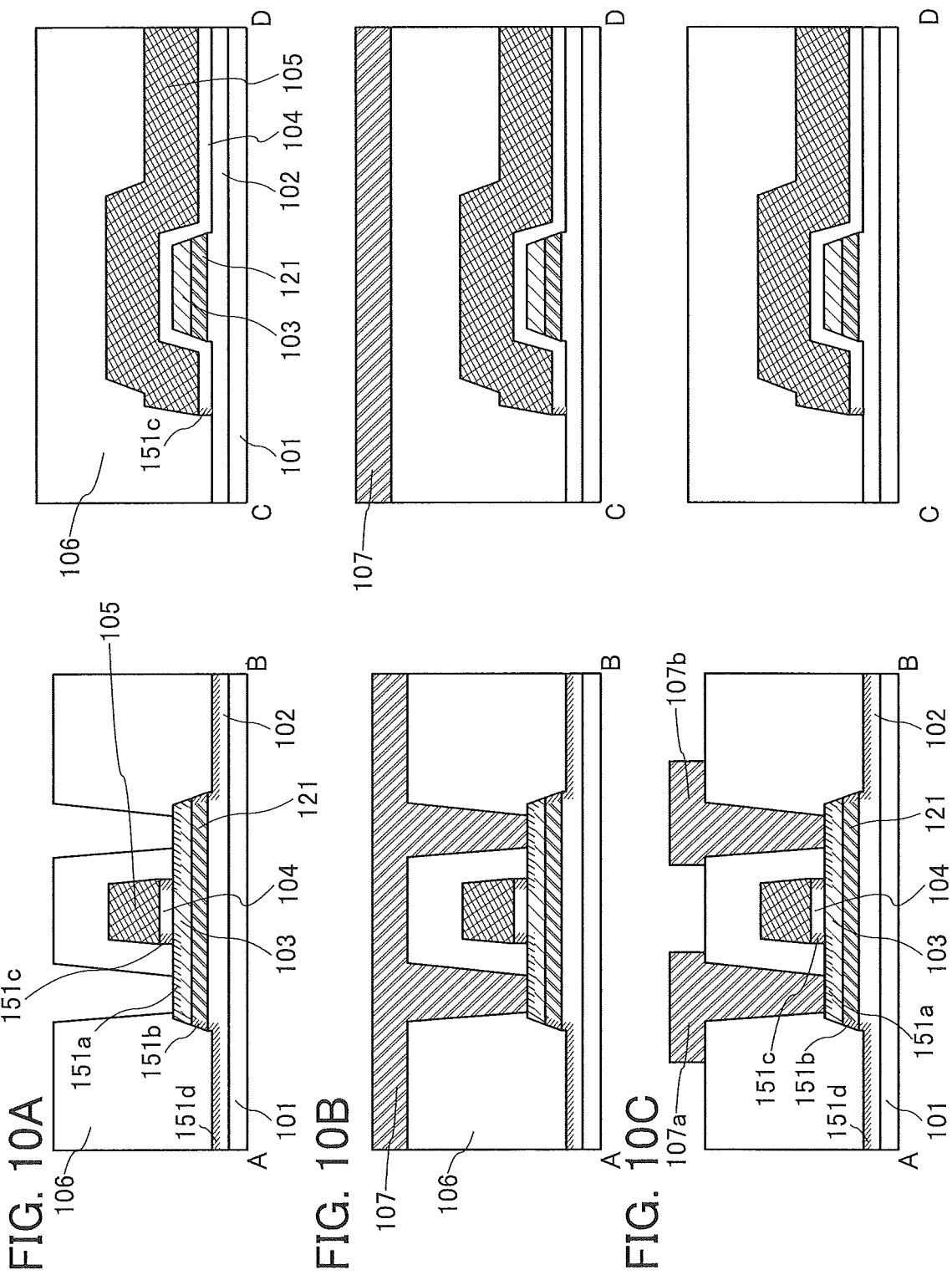

FIG. 12A 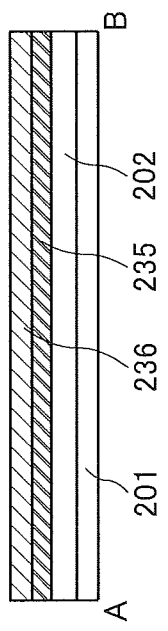 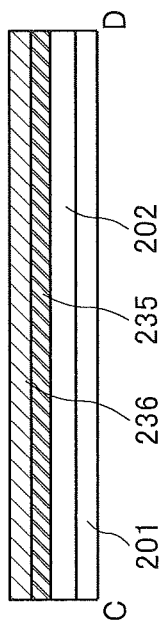
FIG. 12B 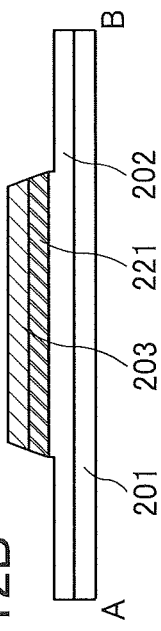 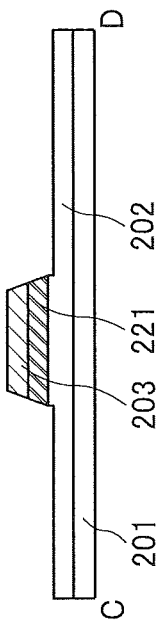
FIG. 12C 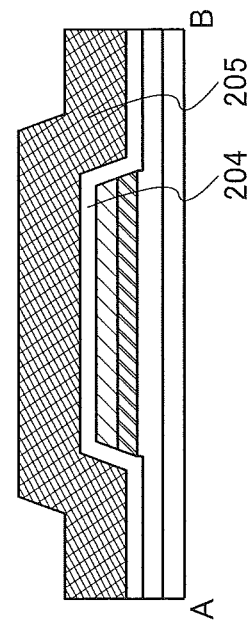 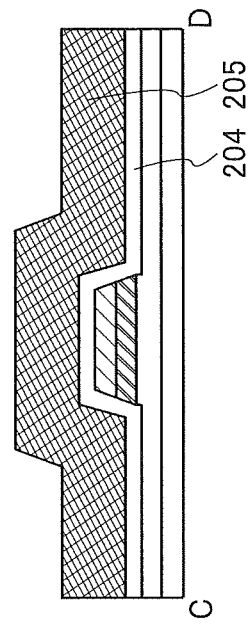

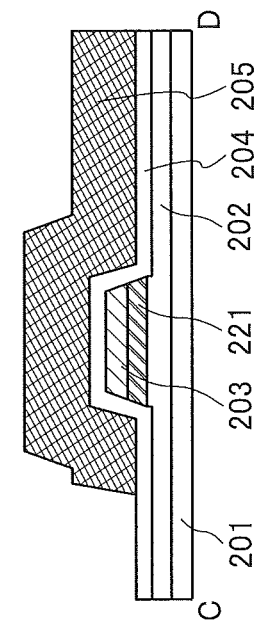
FIG. 13A
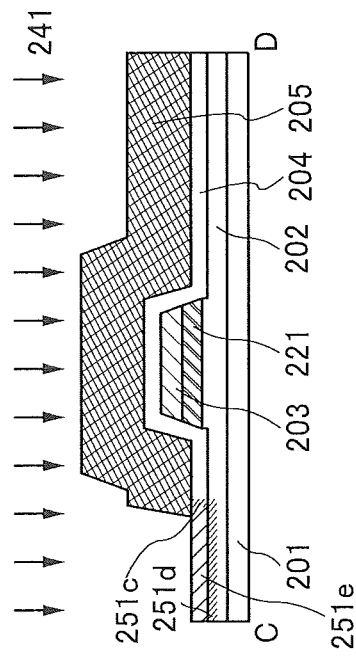
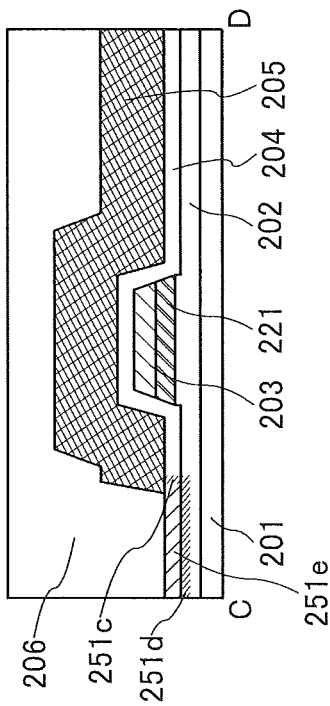
FIG. 13B
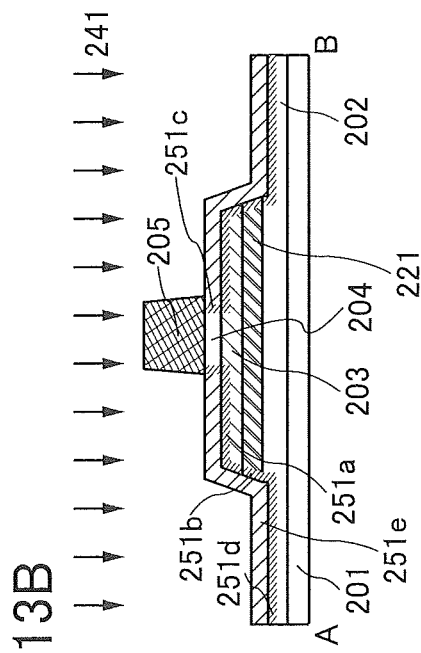
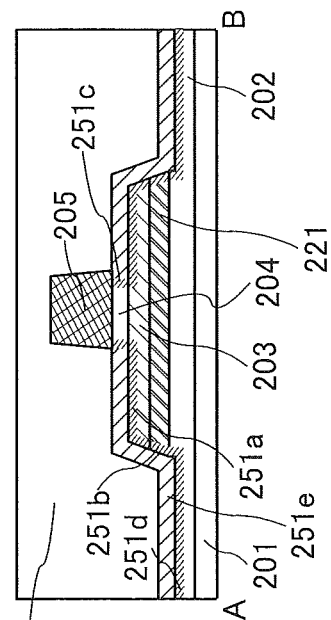
FIG. 13C

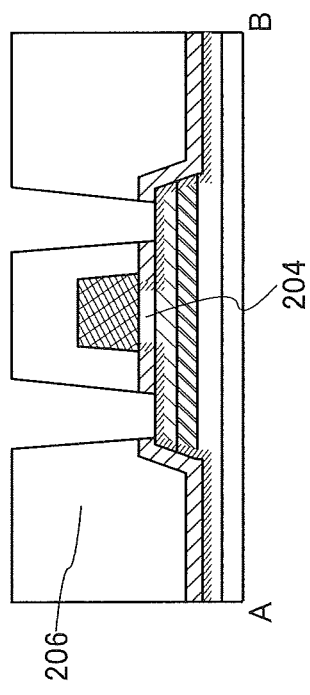
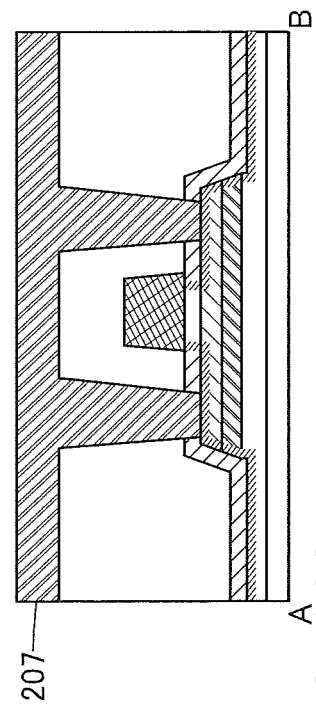
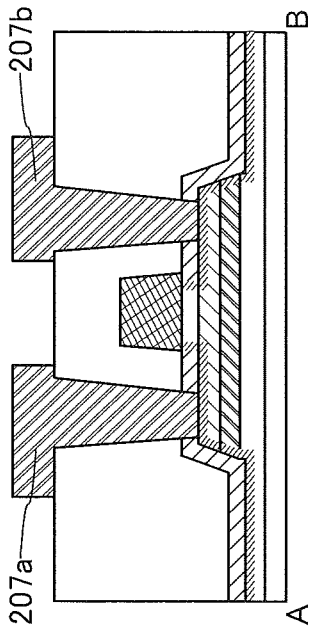

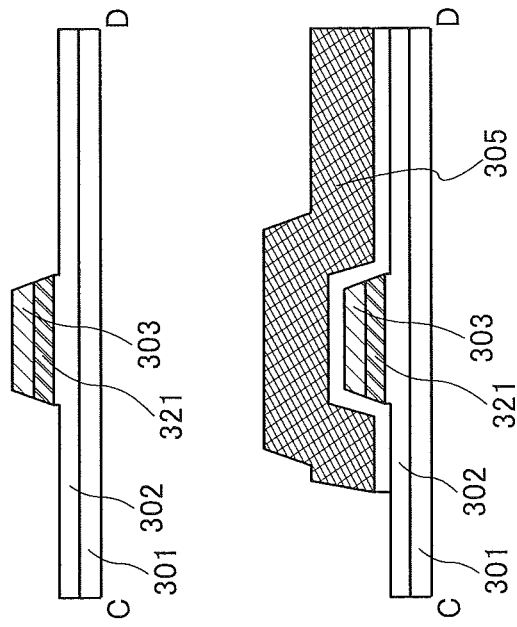
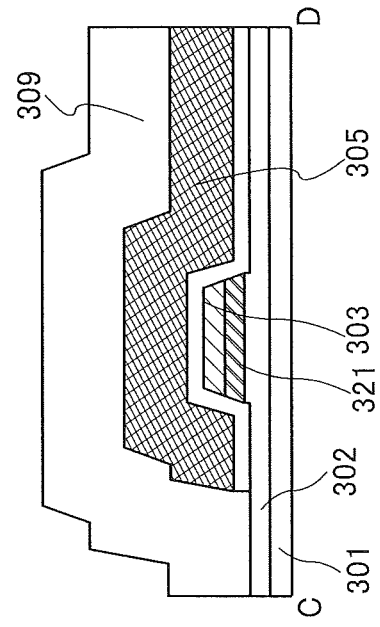
FIG. 27A
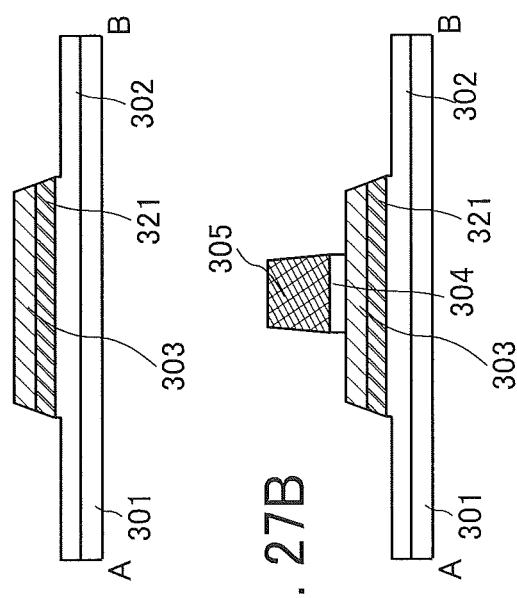
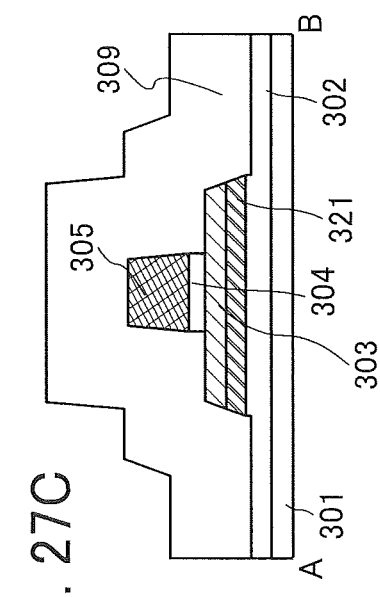
FIG. 27B
FIG. 27C

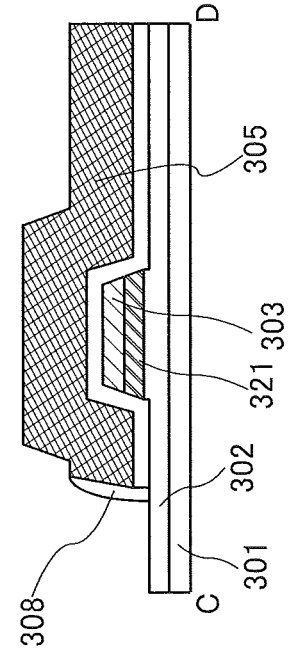
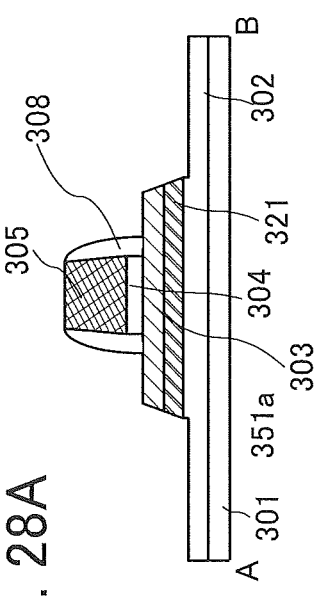
FIG. 28A
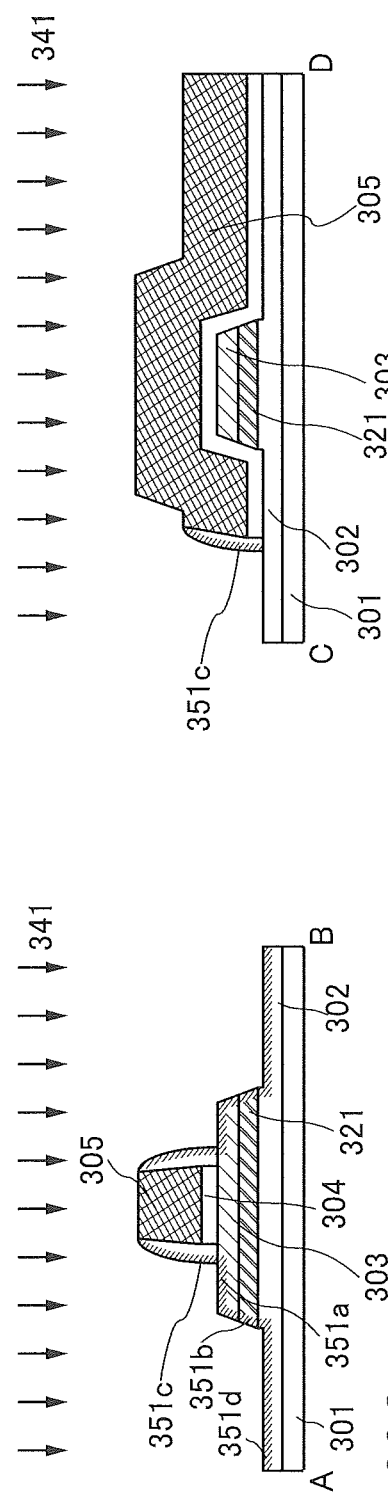
FIG. 28B
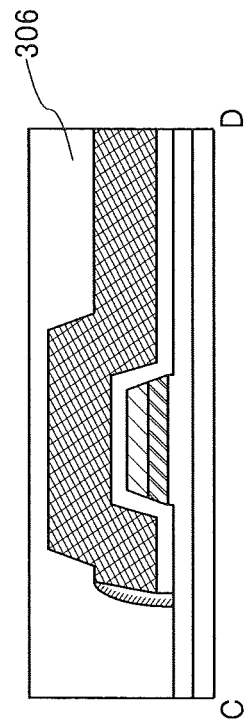
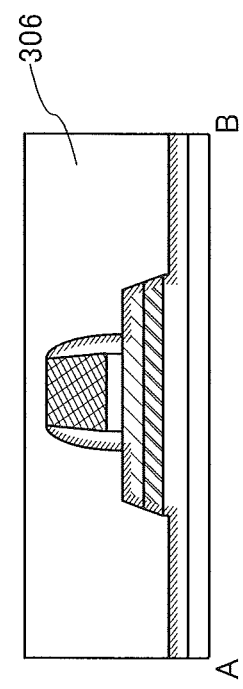
FIG. 28C

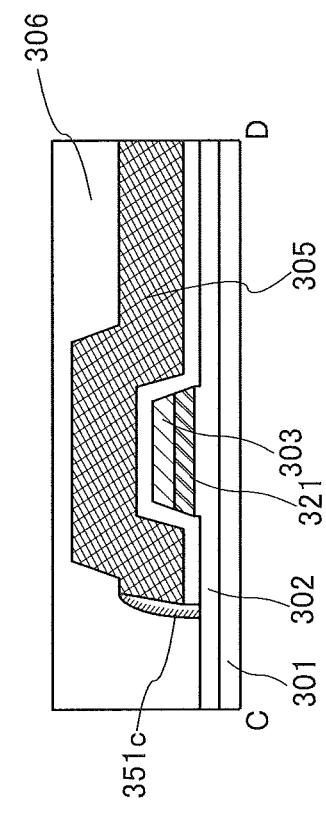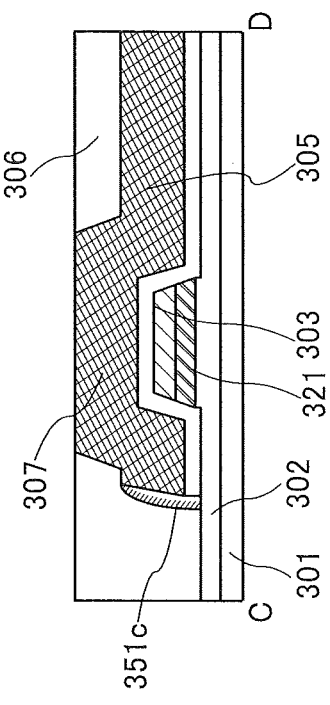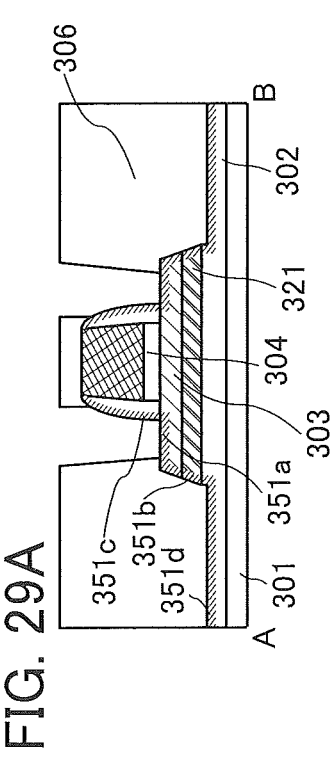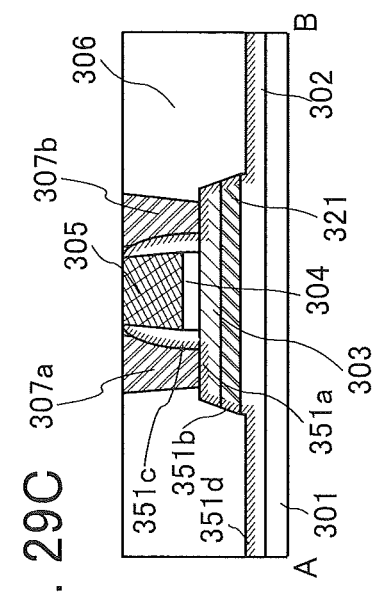

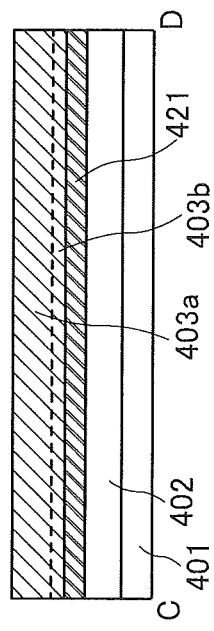
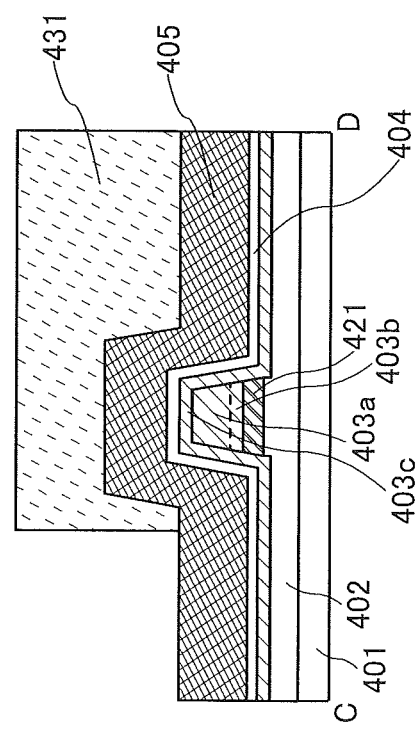
FIG. 32A
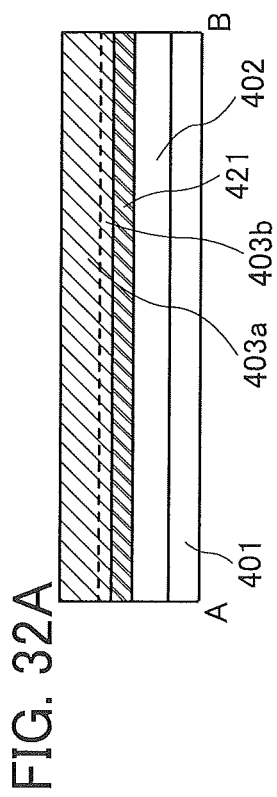
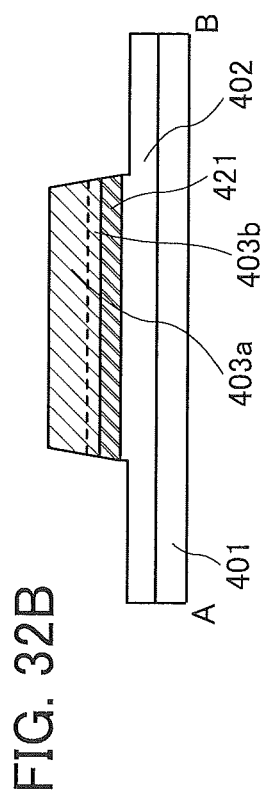
FIG. 32B
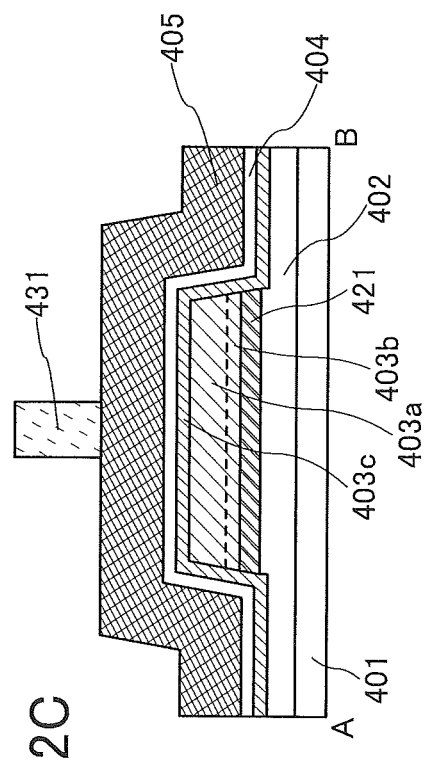
FIG. 32C

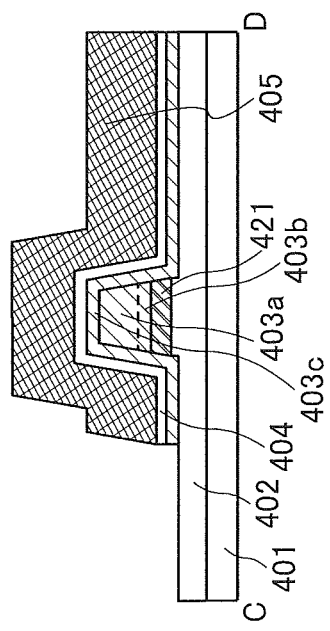
FIG. 33A
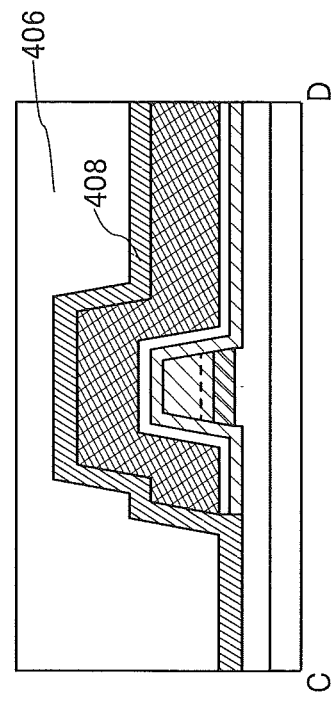
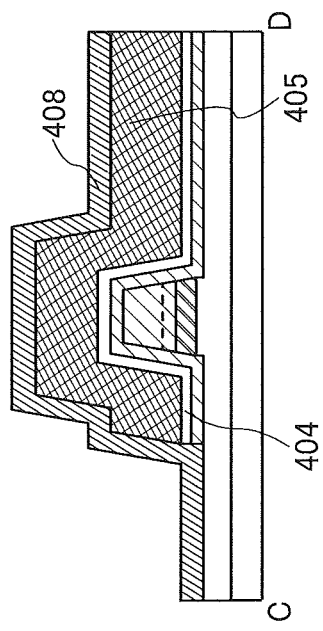
FIG. 33B
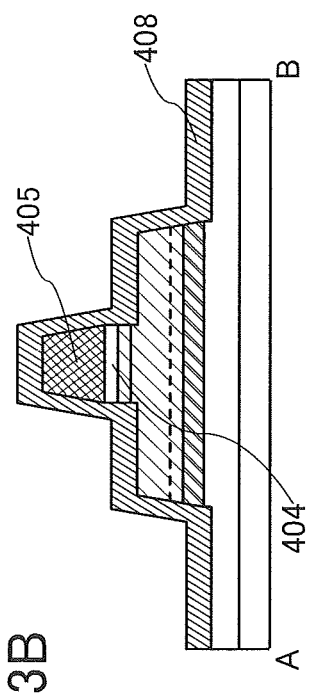
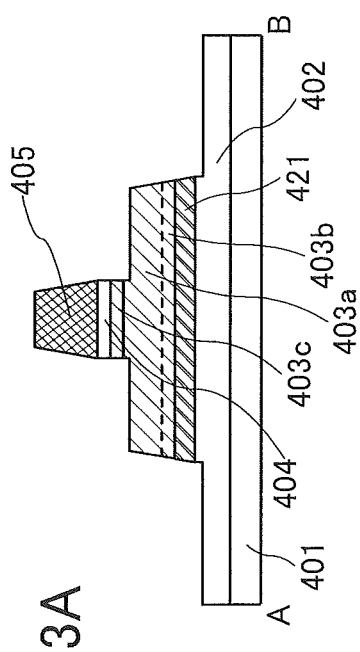
FIG. 33C
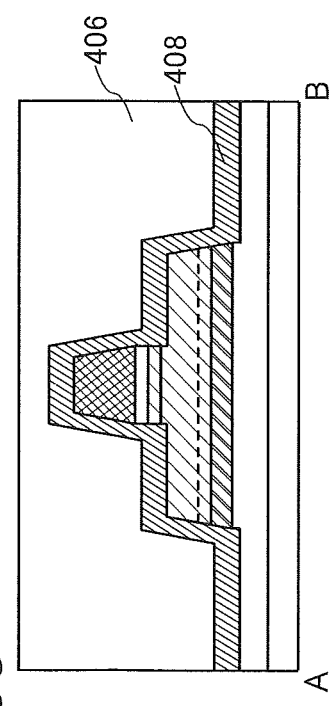

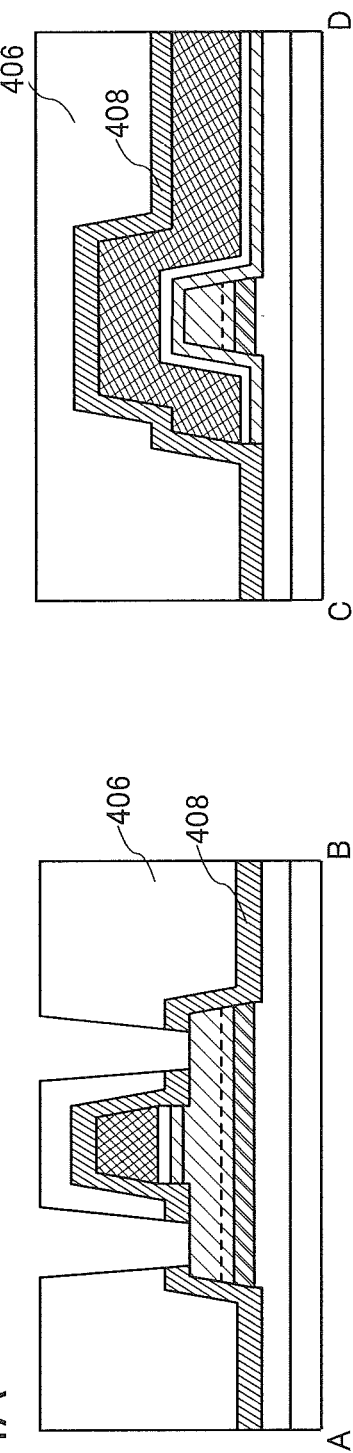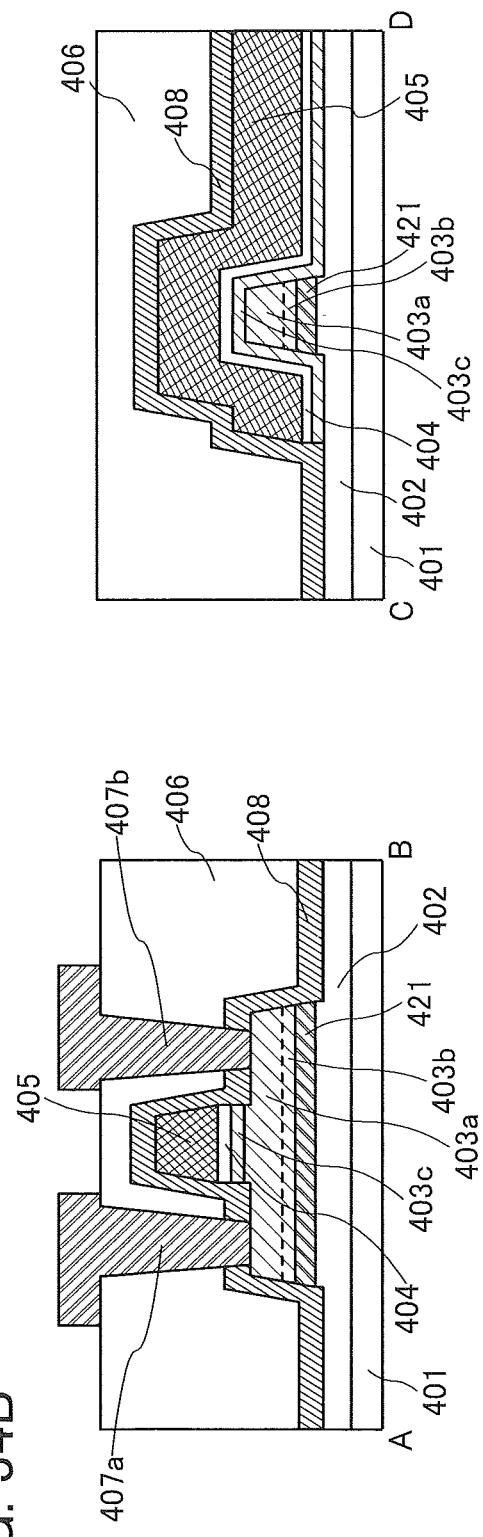
FIG. 34A
FIG. 34B

SEMICONDUCTOR DEVICE AND METHOD FOR MANUFACTURING THEREOF

This application is a continuation of copending U.S. application Ser. No. 14/451,854, filed on Aug. 5, 2014 which is incorporated herein by reference.

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to a semiconductor device, a display device, a liquid crystal display device, a light-emitting device, a driving method thereof, or a manufacturing method thereof, for example. Furthermore, the present invention relates to a semiconductor device, a display device, a light-emitting device, or a driving method thereof, for example. The present invention relates to an electronic device or the like including the semiconductor device, the display device, or the light-emitting device, for example.

In this specification, the semiconductor device indicates all the devices that can function by utilizing semiconductor characteristics. A display device, a light-emitting device, an electro-optical device, a semiconductor circuit, an electronic device, and the like include a semiconductor device in some cases.

2. Description of the Related Art

Attention has been focused on a technique for forming a transistor using a semiconductor film that is formed on a substrate having an insulating surface. The transistor is applied to a wide range of semiconductor devices such as an integrated circuit and a display device. A silicon film is known as a semiconductor film applicable to a transistor.

As a silicon film used as a semiconductor film of a transistor, either an amorphous silicon film or a polycrystalline silicon film is used depending on the purpose. For example, in the case of a transistor included in a large display device, it is preferable to use an amorphous silicon film, which can be formed using the established technique for forming a film on a large substrate. On the other hand, in the case of a transistor included in a high-performance display device where driver circuits are formed over the same substrate, it is preferable to use a polycrystalline silicon film, which can be used to form a transistor having a high field-effect mobility. As a method for forming a polycrystalline silicon film, high-temperature heat treatment or laser light treatment that is performed on an amorphous silicon film has been known.

In recent years, a transistor that includes an oxide semiconductor film containing indium, gallium, and zinc has attracted attention.

An oxide semiconductor film can be formed by a sputtering method or the like, and thus can be used for a transistor included in a large display device. Further, a transistor including an oxide semiconductor film has a high field-effect mobility; therefore, the use of the transistor allows fabrication of a high-performance display device where driver circuits are formed over the same substrate. In addition, there is an advantage that capital investment can be reduced because part of production equipment for a transistor including an amorphous silicon film can be retrofitted and utilized.

As a method for providing a transistor including an oxide semiconductor film with stable electrical characteristics, a technique where an insulating film in contact with an oxide semiconductor film is doped with oxygen is disclosed (see Patent Document 1). The technique disclosed in Patent Document 1 enables oxygen vacancies in an oxide semiconductor film to be reduced. As a result, variation in electrical characteristics of a transistor including an oxide semiconductor film can be reduced and reliability can be improved.

A transistor including an oxide semiconductor film is known to have an extremely low leakage current in an off state. For example, a low-power CPU and the like utilizing the low leakage current of a transistor including an oxide semiconductor film are disclosed (see Patent Document 2).

REFERENCE

Patent Document

[Patent Document 1] Japanese Published Patent Application No. 2011-243974
[Patent Document 2] Japanese Published Patent Application No. 2012-257187

SUMMARY OF THE INVENTION

One object is to provide a transistor that is formed using an oxide semiconductor film. Another object is to provide a transistor that is formed using an oxide semiconductor film with reduced oxygen vacancies.

Another object is to provide a transistor having excellent electrical characteristics. Another object is to provide a transistor having a miniaturized structure. Another object is to provide a transistor having a large on-state current. Another object is to provide a transistor having stable electrical characteristics. Another object is to provide a transistor having improved switching characteristics.

Another object is to provide a transistor having a small off-state current. Another object is to provide a semiconductor device or the like including the transistor. Another object is to provide a novel semiconductor device or the like.

Another object is to provide an insulating film including regions having different oxygen diffusion coefficients. Another object is to provide an oxide semiconductor film including a high resistance region and a low resistance region.

Another object is to separately form regions having different oxygen diffusion coefficients in an insulating film.

Note that the descriptions of these objects do not disturb the existence of other objects. Note that one embodiment of the present invention does not necessarily achieve all the objects. Objects other than the above objects are apparent from and can be derived from the descriptions of the specification, the drawings, the claims, and the like.

Even in the case of an insulating film having a large oxygen diffusion coefficient, adding impurities into the insulating film can form a region having a small oxygen diffusion coefficient, that is, a region that blocks oxygen (also referred to as an oxygen blocking region) in some cases. For example, adding phosphorus or boron to an oxide insulating film typified by a silicon oxide film or a silicon oxynitride film can form an oxygen blocking region in the insulating film.

An oxygen blocking region has an oxygen (including an oxygen atom and a molecule having an oxygen atom) diffusion coefficient smaller than that of the other region. Therefore, the oxygen blocking region permits less oxygen permeation than the other region when oxygen is thermally diffused in an insulating film. For example, the amount of oxygen that permeates an insulating film including an oxygen blocking region can be less than 20%, less than 15%, less than 10%, less than 5%, less than 2%, or less than 1% of the amount of oxygen that permeates an insulating film not including an oxygen blocking region.

An oxygen blocking region included in part of a semiconductor device can reduce oxygen vacancies in an oxide semiconductor film in some cases.

By the existence of the oxygen blocking region, for example, release of oxygen from the oxide semiconductor film and diffusion of oxygen to the outside of the semiconductor device (also referred to as outward diffusion) can be suppressed in some cases. Furthermore, by the existence of the oxygen blocking region, when excess oxygen is contained in a film or the like in contact with the oxide semiconductor film, outward diffusion of excess oxygen can be reduced and excess oxygen can be efficiently supplied to the oxide semiconductor film in some cases.

Excess oxygen means oxygen that can be released (is released) by heating. Heat means heat applied in a manufacturing process of a semiconductor device. That is, excess oxygen in this specification means oxygen released by heat at a temperature lower than a temperature in a manufacturing process of a semiconductor device. Excess oxygen can move inside a film or a layer. Excess oxygen moves between atoms in a film or a layer, or replaces oxygen that is a constituent of a film or a layer and moves like a billiard ball.

In a film containing excess oxygen, in some cases, the following amount of oxygen is detected by thermal desorption spectroscopy (TDS): greater than or equal to $1\times10^{18}$ atoms/cm$^3$, greater than or equal to $1\times10^{19}$ atoms/cm$^3$, or greater than or equal to $1\times10^{20}$ atoms/cm$^3$ (converted into the number of oxygen atoms).

Alternatively, a film containing excess oxygen contains a peroxide radical in some cases. Specifically, the spin density attributed to the peroxide radical of the film is higher than or equal to $5\times10^{17}$ spins/cm$^3$. Note that a film containing a peroxide radical may have a signal having asymmetry at a g value of around 2.01 in electron spin resonance (ESR).

One embodiment of the present invention is a semiconductor device including a first insulating film having an island shape over a substrate, a first oxide semiconductor film over the first insulating film, a gate insulating film over the first oxide semiconductor film, and a gate electrode over the gate insulating film. The first insulating film includes a first region and a second region. The first region is a region that transmits less oxygen than the second region does. The first oxide semiconductor film is positioned at least over the second region.

Another embodiment of the present invention is a semiconductor device including a first insulating film over a substrate, a first oxide semiconductor film over the first insulating film, a gate insulating film over the first oxide semiconductor film, and a gate electrode over the gate insulating film. The first insulating film includes a first region and a second region. The first region is a region that transmits less oxygen than the second region does. The first insulating film has a projecting portion. The projecting portion comprises at least part of the second region. The first oxide semiconductor film is positioned over the second region.

In the above structures, the second region preferably overlaps with the gate electrode. Part of the first oxide semiconductor film preferably includes a high resistance region and a low resistance region. The first region preferably contains phosphorus or boron. The low resistance region preferably contains phosphorus or boron.

Another embodiment of the present invention is a semiconductor device including a first insulating film having an island shape over a substrate, a first oxide semiconductor film over the first insulating film, a gate insulating film over the first oxide semiconductor film, a gate electrode over the gate insulating film, and a protective insulating film. The protective insulating film is positioned over the first oxide semiconductor film and the gate electrode. The protective insulating film is in contact with the first insulating film and the gate insulating film, and is a film through which oxygen does not readily pass.

Another embodiment of the present invention is a semiconductor device including a first insulating film over a substrate, a first oxide semiconductor film over the first insulating film, a second insulating film over the first oxide semiconductor film, a gate electrode over the second insulating film, and a protective insulating film. The first insulating film has a projecting portion. The protective insulating file is positioned over the first insulating film, the first oxide semiconductor film, and the gate electrode. The protective insulating film is in contact with the first insulating film and the gate insulating film, and is a film through which oxygen does not readily pass.

In the above structures, the first insulating film preferably contains excess oxygen. The first insulating film preferably has a greater thickness than the gate insulating film. A second oxide semiconductor film is provided below the first oxide semiconductor film. The sum of thicknesses of the second oxide semiconductor film and the first insulating film is preferably greater than the thickness of the gate insulating film.

Another embodiment of the present invention is a method for manufacturing a semiconductor device including the following steps: forming a first insulating film over a substrate, forming a first oxide semiconductor film over the first insulating film, forming a second insulating film over the first oxide semiconductor film, forming a gate electrode over the second insulating film, adding phosphorus or boron to the first oxide semiconductor film and the first insulating film with the gate electrode used as a mask after the gate electrode is formed.

According to one embodiment of the present invention, a transistor that is formed using an oxide semiconductor film can be provided. A transistor that is formed using an oxide semiconductor film with reduced oxygen vacancies can be provided.

A transistor having excellent electrical characteristics can be provided. A transistor having a miniaturized structure can be provided. A transistor having a large on-state current can be provided. A transistor having stable electrical characteristics can be provided.

Further, it is possible to provide a transistor with a small off-state current. It is possible to provide a transistor having high field-effect mobility. A transistor with a high yield can be provided. A semiconductor device or the like including the transistor can be provided.

BRIEF DESCRIPTION OF THE DRAWINGS

FIGS. 2A1, 2A2, 2B, and 2C each illustrate ion incidence.

FIGS. 6A and 6B each illustrate a band structure.

FIGS. 8A to 8D are cross-sectional views illustrating an example of a method for manufacturing a semiconductor device according to one embodiment of the present invention.

FIGS. 9A to 9C are cross-sectional views illustrating the example of the method for manufacturing the semiconductor device of one embodiment of the present invention.

FIGS. 10A to 10C are cross-sectional views illustrating the example of the method for manufacturing the semiconductor device according to one embodiment of the present invention.

FIGS. 12A to 12C are cross-sectional views illustrating an example of the method for manufacturing the semiconductor device according to one embodiment of the present invention.

FIGS. 13A to 13C are cross-sectional views illustrating the example of the method for manufacturing the semiconductor device of one embodiment of the present invention.

FIGS. 14A to 14C are cross-sectional views illustrating the example of the method for manufacturing the semiconductor device according to one embodiment of the present invention.

FIGS. 27A to 27C are cross-sectional views illustrating an example of a method for manufacturing a semiconductor device of one embodiment of the present invention.

FIGS. 28A to 28C are cross-sectional views illustrating an example of a method for manufacturing a semiconductor device of one embodiment of the present invention.

FIGS. 29A to 29C are cross-sectional views illustrating the example of the method for manufacturing the semiconductor device of one embodiment of the present invention.

FIGS. 32A to 32C are cross-sectional views illustrating an example of a method for manufacturing a semiconductor device of one embodiment of the present invention.

FIGS. 33A to 33C are cross-sectional views illustrating the example of the method for manufacturing the semiconductor device of one embodiment of the present invention.

FIGS. 34A and 34B are cross-sectional views illustrating the example of the method for manufacturing the semiconductor device of one embodiment of the present invention.

DETAILED DESCRIPTION OF THE INVENTION

Figure 1A:
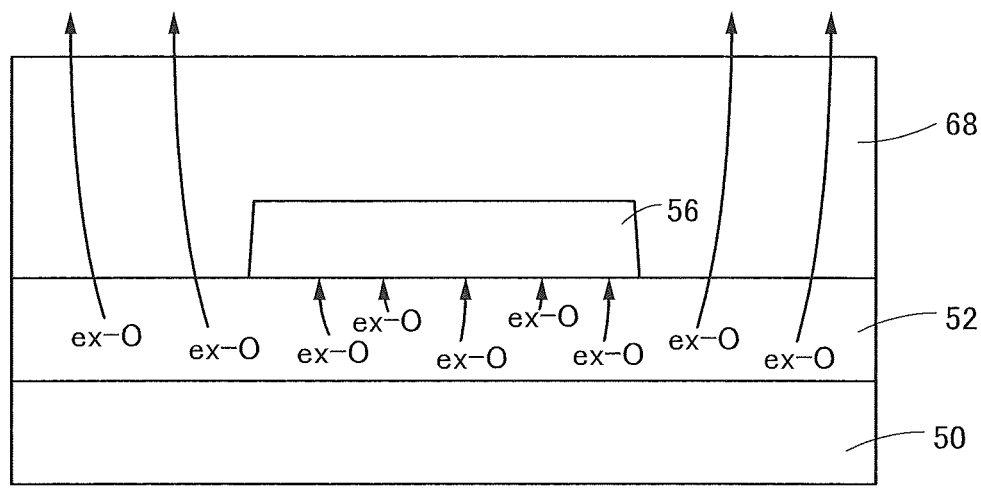
FIGS. 1A and 1B are schematic cross-sectional views each illustrating diffusion of excess oxygen in a semiconductor device.

Hereinafter, an embodiment and examples of the present invention are described in detail with the reference to the drawings. However, the present invention is not limited to the descriptions below, and it is easily understood by those skilled in the art that modes and details disclosed herein can be modified in various ways. Further, the present invention is not construed as being limited to the descriptions of the embodiment and the examples. In describing the structures of the present invention with reference to the drawings, the same reference numerals are used in common for the same portions in different drawings. The same hatch pattern is applied to similar parts, and the similar parts may not be especially denoted by reference numerals.

In the drawings, the size, the thicknesses of layers, or regions may be exaggerated for clarity. Therefore, the present invention is not necessarily limited to such scales in the drawings.

A voltage is usually a potential difference between a given potential and a reference potential (e.g., a source potential or a ground potential (GND)). Thus, a voltage can be referred to as a potential and vice versa.

Even when the expression "electrically connect" is used in this specification, in an actual circuit, there is a case in which no physical connection is made and a wiring is just extended.

Note that the ordinal numbers such as "first" and "second" in this specification are used for the sake of convenience and do not denote the order of steps or the stacking order of layers. Therefore, for example, a description can be made even when "first" is replaced with "second" or "third", as appropriate. In addition, the ordinal numbers in this specification do not correspond to the ordinal numbers that specify one embodiment of the present invention in some cases.

In this specification, for example, when the shape of an object is described with use of a term such as "diameter", "grain size (diameter)", "dimension", "size", or "width", the term can be regarded as the length of one side of a minimal cube where the object fits, or an equivalent circle diameter of a cross section of the object. The term "equivalent circle diameter of a cross section of the object" means the diameter of a perfect circle having the same area as that of the cross section of the object.

Note that a "semiconductor" has characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" has characteristics of a "conductor" in some cases when the conductivity is sufficiently high, for example. Further, a "semiconductor" and a "conductor" cannot be strictly distinguished from each other in some cases because a border between the "semiconductor" and the "insulator" is not clear. Accordingly, a "semiconductor" in this specification can be called a "conductor" in some cases. Similarly, a "conductor" in this specification can be called a "semiconductor" in some cases.

In this specification, a term "parallel" indicates that the angle formed between two straight lines is greater than or equal to −10° and less than or equal to 10°, and accordingly includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

<Excess Oxygen Behavior>

The behavior of excess oxygen in a semiconductor device is described below with reference to FIGS. 1A and 1B.

FIG. 1A is a schematic cross-sectional view of a sample including a substrate 50, an insulating film 52 over the substrate 50, an island-shaped oxide semiconductor film 56 over the insulating film 52, and an insulating film 68 over the insulating film 52 and the oxide semiconductor film 56. In the sample illustrated in FIG. 1A, the insulating film 52 contains excess oxygen (indicated as ex-O in the drawing).

Examples of a film that can be used as the insulating film 52 include an oxide film and an oxynitride film. For example, a silicon oxide film, a silicon oxynitride film, or the like is used as the insulating film 52. Note that an oxynitride film in this specification is an oxide film containing nitrogen at a concentration higher than or equal to 0.1 atomic % and less than 25 atomic %. A nitride oxide film in this specification is a nitride film containing oxygen at a concentration higher than or equal to 0.1 atomic % and less than 25 atomic %.

To avoid redundancy, descriptions of an oxide semiconductor film 103 and an insulating film 106 given later are referred to for the oxide semiconductor film 56 and the insulating film 68, respectively, and the descriptions thereof are omitted here.

Heat application diffuses excess oxygen in the insulating film 52. For example, excess oxygen diffused in the insulating film 52 can fill oxygen vacancies in the oxide semiconductor film 56 when reaching the interface between the insulating film 52 and the oxide semiconductor film 56. Reducing oxygen vacancies in the oxide semiconductor film 56 can lower the density of defect states due to oxygen vacancies in the oxide semiconductor film 56.

However, all excess oxygen diffused in the insulating film 52 does not reach the interface between the insulating film 52 and the oxide semiconductor film 56. For example, excess oxygen diffused in the insulating film 52 might be diffused outward through the insulating film 68, or might react with a wiring or the like included in the semiconductor device to increase the wiring resistance.

Thus, excess oxygen might not be efficiently utilized in the sample structure illustrated in FIG. 1A.

Figure 1B:
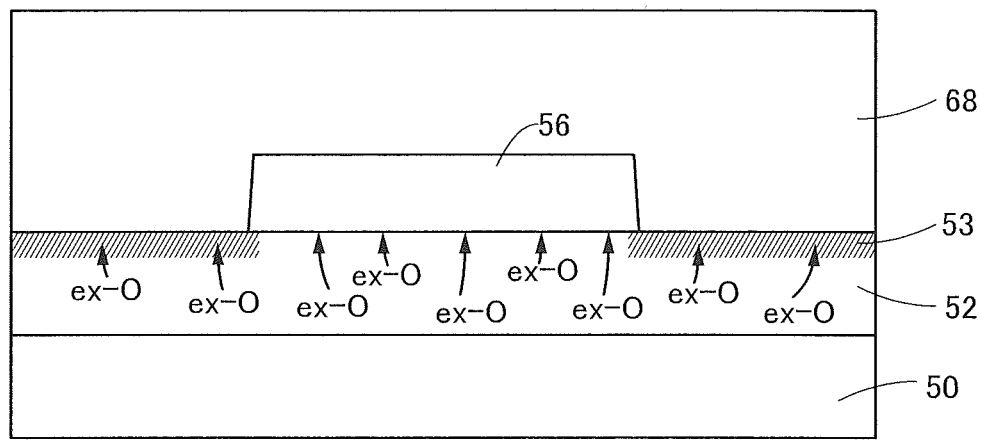

FIG. 1B illustrates an example of a sample structure in which excess oxygen can be efficiently utilized.

FIG. 1B illustrates the sample having a structure similar to that of the sample illustrated in FIG. 1A. The sample illustrated in FIG. 1B is different from the sample in FIG. 1A in that the insulating film 52 includes a region 53 in the vicinity of the insulating film 68. The insulating film 52 in the sample in FIG. 1B contains excess oxygen. The region 53 is provided at a depth from 1 nm to 200 nm inclusive, preferably from 5 nm to 150 nm inclusive, more preferably from 10 nm to 100 nm inclusive from the top surface of the insulating film 52. Note that the region 53 may be provided so as to extend from the top surface of the insulating film 52 to the bottom surface thereof.

The region 53 is an oxygen blocking region. The region 53 serving as an oxygen blocking region can be formed in some cases by, for example, adding one or more of boron, carbon, magnesium, aluminum, silicon, phosphorus, calcium, scandium, titanium, vanadium, chromium, manganese, iron, cobalt, nickel, gallium, germanium, arsenic, yttrium, zirconium, niobium, molybdenum, indium, tin, lanthanum, cerium, neodymium, hafnium, tantalum, and tungsten to the insulating film 52. The addition of the above impurities is less likely to increase the resistance of metal. Note that adding phosphorus or boron among the above impurities to the insulating film 52 enables formation of the particularly high-quality region 53 having an excellent oxygen blocking property (having a small oxygen diffusion coefficient). The region 53 contains, in the insulating film 52, for example, any of the above impurities at a concentration of higher than or equal to $5 \times 10^{19}$ atoms/cm$^3$, preferably higher than or equal to $1 \times 10^{20}$ atoms/cm$^3$, more preferably higher than or equal to $2 \times 10^{20}$ atoms/cm$^3$, still more preferably higher than or equal to $5 \times 10^{20}$ atoms/cm$^3$.

The behavior of excess oxygen in the sample illustrated in FIG. 1B is described below.

Heat application diffuses excess oxygen in the insulating film 52. Excess oxygen diffused in the insulating film 52 can fill oxygen vacancies in the oxide semiconductor film 56 when reaching the interface between the insulating film 52 and the oxide semiconductor film 56.

Excess oxygen diffused in the insulating film 52 hardly passes through the region 53, which increases the proportion of excess oxygen reaching the interface between the insulating film 52 and the oxide semiconductor film 56. Accordingly, oxygen vacancies in the oxide semiconductor film 56 can be efficiently filled with excess oxygen. Further, for example, excess oxygen diffused in the insulating film 52 can be inhibited from being diffused outward through the insulating film 68, or can be inhibited from reacting with a wiring or the like included in the semiconductor device to increase the wiring resistance.

Thus, excess oxygen can be efficiently utilized in the sample structure illustrated in FIG. 1B.

Figure 15A:
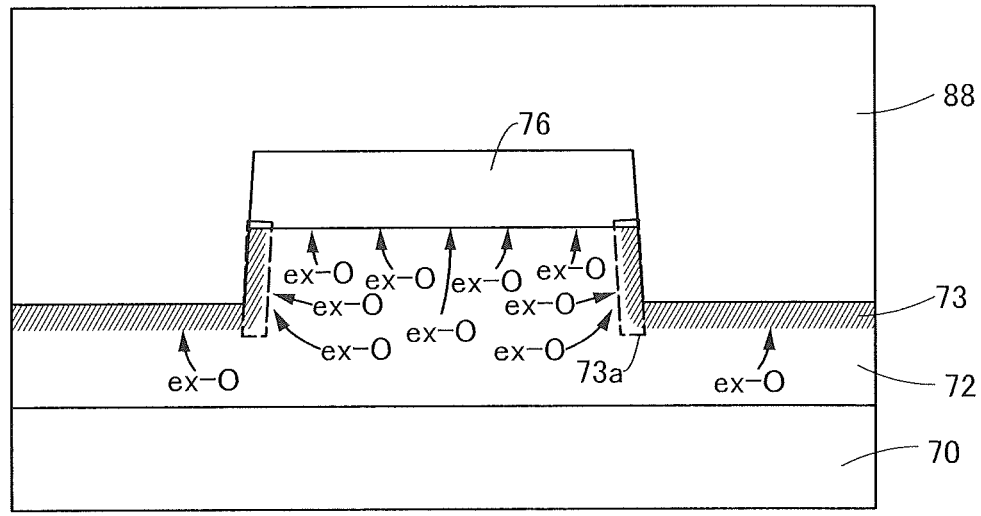
FIGS. 15A to 15C are schematic cross-sectional views each illustrating diffusion of excess oxygen in a semiconductor device.

Next, FIG. 15A illustrates an example which has a different sample structure from that in FIGS. 1B and 1n which excess oxygen can be utilized efficiently. FIG. 15A differs from FIG. 1B in that an insulating film 72 has a projecting portion in FIG. 15A.

FIG. 15A is a schematic cross-sectional view of a sample including a substrate 70, the insulating film 72 over the substrate 70, an island-shaped oxide semiconductor film 76 over the insulating film 72, and an insulating film 88 over the insulating film 72 and the oxide semiconductor film 76. In the sample in FIG. 15A, the insulating film 72 contains excess oxygen. In FIG. 15A, the insulating film 72 has a projecting portion, and the oxide semiconductor film 76 is positioned over the projecting portion.

Description of the insulating film 52 is referred to for the insulating film 72. To avoid redundancy, descriptions of the oxide semiconductor film 103 and the insulating film 106 given later are referred to for the oxide semiconductor film 76 and the insulating film 88, respectively, and the descriptions thereof are omitted here.

A region 73 is an oxygen blocking region. For the oxygen blocking region, description of the region 53 is referred to.

Heat application diffuses excess oxygen in the insulating film 72. Excess oxygen diffused in the insulating film 72 can fill oxygen vacancies in the oxide semiconductor film 76 when reaching the interface between the insulating film 72 and the oxide semiconductor film 76.

Excess oxygen diffused in the insulating film 72 hardly passes through the region 73, which increases the proportion of excess oxygen reaching the interface between the insulating film 72 and the oxide semiconductor film 76. Accordingly, oxygen vacancies in the oxide semiconductor film 76 can be efficiently filled with excess oxygen. Further, for example, excess oxygen diffused in the insulating film 72 can be inhibited from being diffused outward, or can be inhibited from reacting with a wiring or the like included in the semiconductor device to increase the wiring resistance.

Thus, excess oxygen can be efficiently utilized in the sample structure illustrated in FIG. 15A.

Figure 15B:
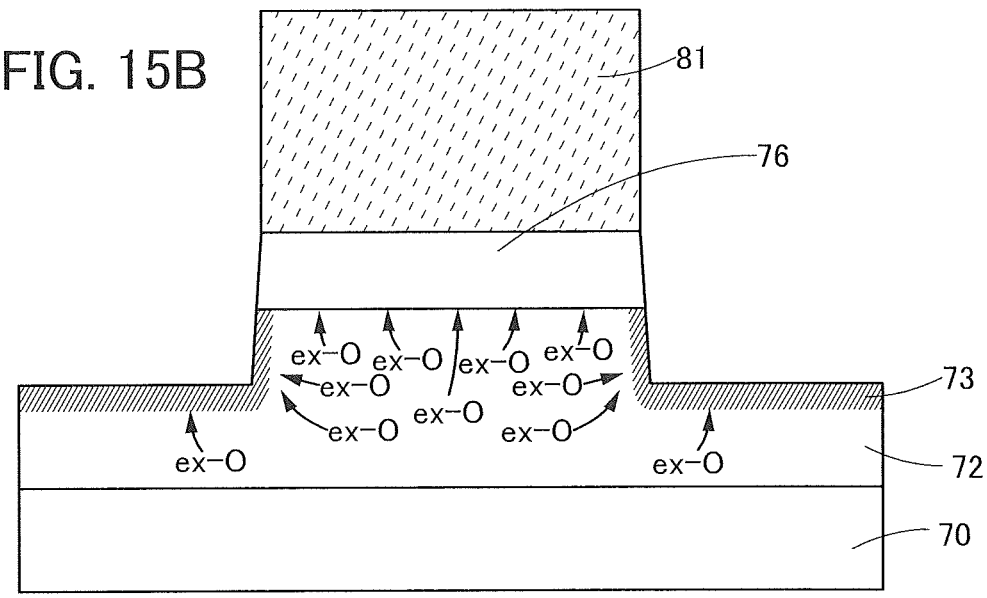
Figure 15C:
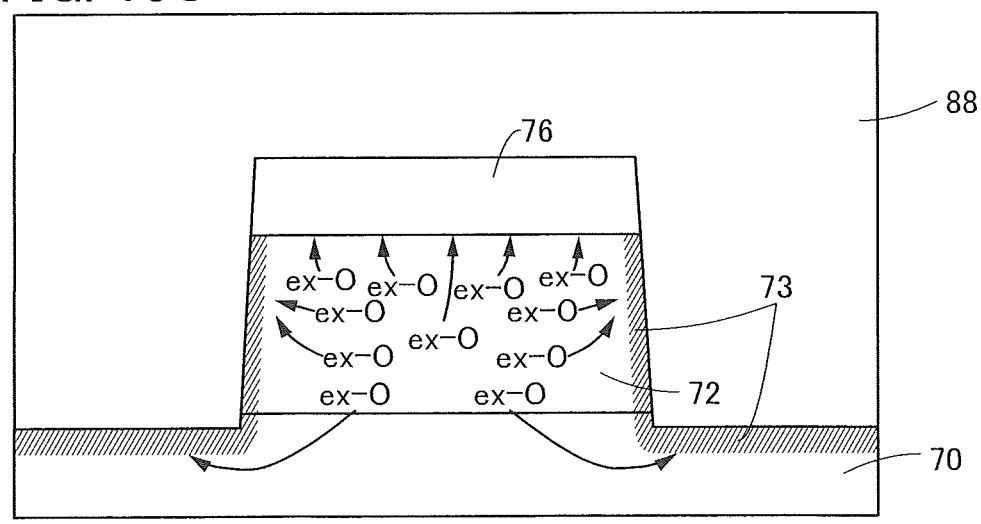

As illustrated in FIG. 15C, the insulating film 72 may be formed to have an island shape. In this case, a region containing excess oxygen has an island shape, whereby oxygen diffusion is suppressed in the lateral direction, so that oxygen can be supplied to the oxide semiconductor film 76 efficiently.

<Impurity Addition to Oxide Semiconductor Film>

Figure 16A:
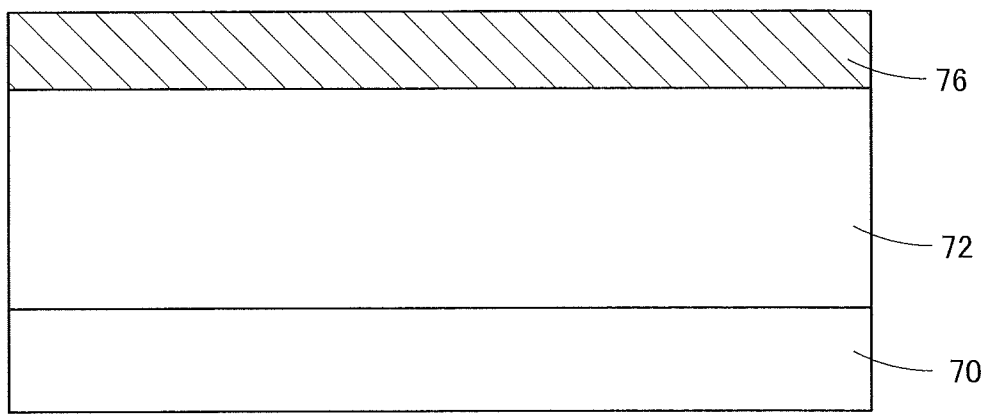
FIGS. 16A to 16C are schematic cross-sectional views each illustrating addition of impurities in a semiconductor device.
Figure 16B:
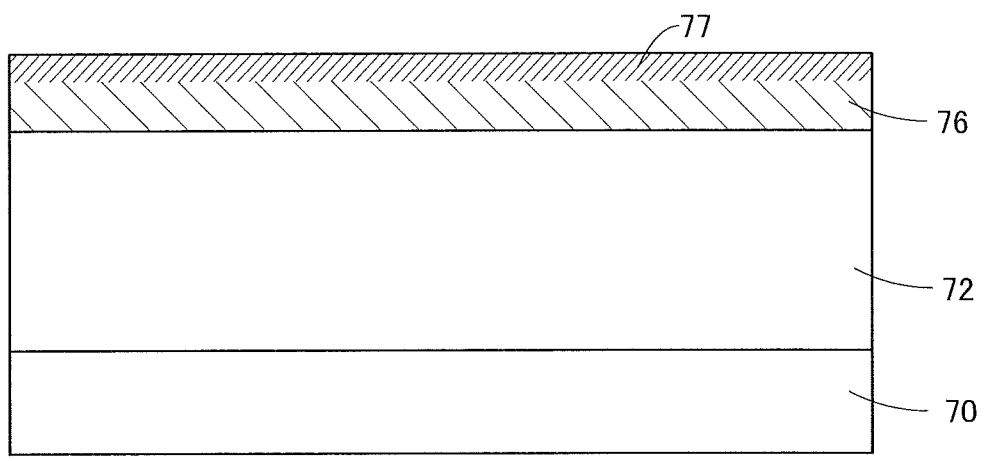

FIG. 16B illustrates an example in which impurities are added to an oxide semiconductor film to reduce its resistance. FIG. 16B illustrates a cross-sectional structure of a sample including the substrate 70, the insulating film 72 over the substrate 70, and the oxide semiconductor film 76 over the insulating film 72.

A region 77 is part of the oxide semiconductor film 76 and includes impurities. The region 77 including impurities can be formed in some cases by, for example, adding one or more of boron, carbon, magnesium, aluminum, silicon, phosphorus, calcium, scandium, titanium, vanadium, chromium, manganese, iron, cobalt, nickel, gallium, germanium, arsenic, yttrium, zirconium, niobium, molybdenum, indium, tin, lanthanum, cerium, neodymium, hafnium, tantalum, and tungsten to the oxide semiconductor film 76. The region 77 contains, in the oxide semiconductor film 76, for example, any of the above impurities at a concentration of higher than or equal to $5\times10^{19}$ atoms/cm$^3$, preferably higher than or equal to $1\times10^{20}$ atoms/cm$^3$, more preferably higher than or equal to $2\times10^{20}$ atoms/cm$^3$, still more preferably higher than or equal to $5\times10^{20}$ atoms/cm$^3$. Impurities that are the same as those added to the region 73 can be added to the region 77.

The carrier density of the oxide semiconductor film can be increased by the above-described impurity addition or the like. Thus, impurities are added to the oxide semiconductor film 76, so that the resistance of the oxide semiconductor film can be lowered.

Because of the above-described impurity addition, oxygen vacancies are generated in the oxide semiconductor film 76 in some cases. When hydrogen is added to the oxide semiconductor film 76 including oxygen vacancies, hydrogen enters oxygen vacant sites and forms a donor level in the vicinity of the conduction band. As a result, the resistance of the oxide semiconductor film 76 can be further lowered in some cases.

Hydrogen may be added by an ion doping method, an ion implantation method, plasma treatment, or the like. Alternatively, heat treatment may be performed in an atmosphere containing hydrogen. Still alternatively, a film containing hydrogen may be formed below or over the oxide semiconductor film 76, whereby hydrogen may be added. As a film containing hydrogen, for example, a silicon nitride film can be given.

When hydrogen enters an oxygen vacant site, hydrogen is stabilized. Thus, hydrogen having entered the oxide semiconductor film 76 remains in oxygen vacant sites, and diffusion of hydrogen to a channel region can be prevented.

Figure 16C:
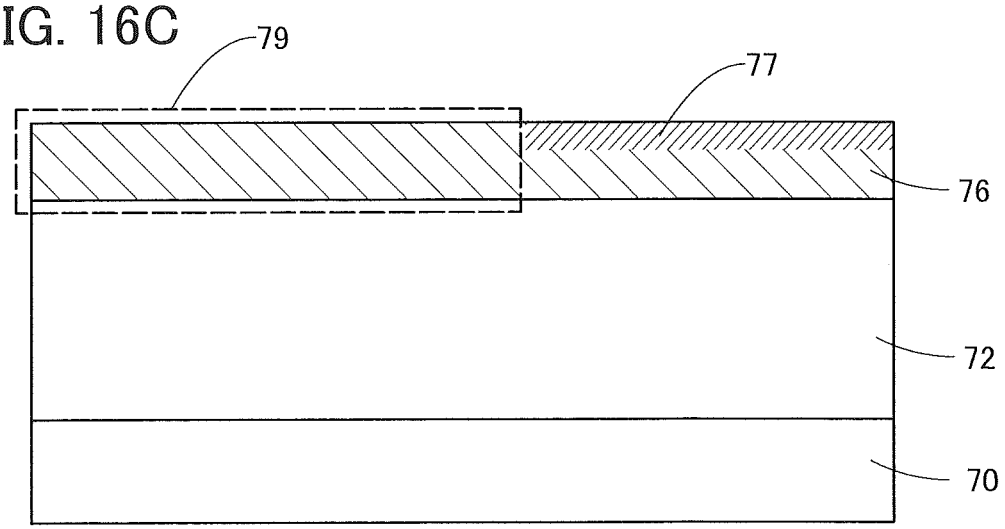

As illustrated in FIG. 16C, for example, impurities may be partly added, so that the oxide semiconductor film 76 can have the region 77 to which impurities are added and a region 79 to which impurities are not added.

Figure 18A:
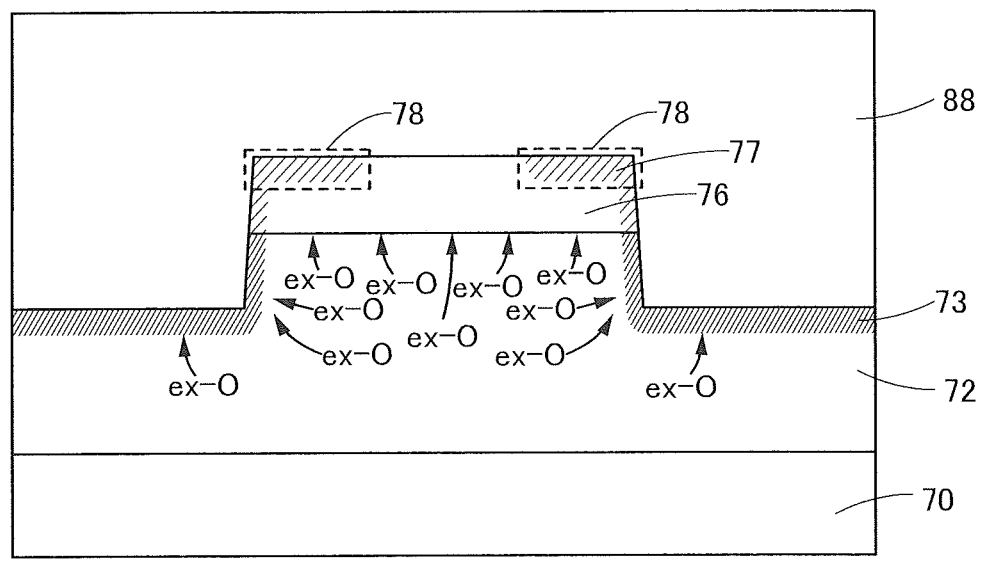
FIGS. 18A and 18B are schematic cross-sectional views each illustrating addition of impurities in a semiconductor device.

Next, examples in which the structures illustrated in FIGS. 15A and 15C further include low resistance regions in the oxide semiconductor films are described. FIG. 18A has an oxygen blocking region and an oxide semiconductor film whose resistance is partly lowered by impurity addition. Here, the oxygen blocking region is an insulating film to which impurities are added.

FIG. 18A is a schematic cross-sectional view of a sample including the substrate 70, the insulating film 72 over the substrate 70, the island-shaped oxide semiconductor film 76 over the insulating film 72, and the insulating film 88 over the insulating film 72 and the oxide semiconductor film 76. The insulating film 72 in the sample in FIG. 18A contains excess oxygen. In FIG. 18A, the insulating film 72 has a projecting portion, and the oxide semiconductor film 76 is positioned over the projecting portion of the insulating film 72. Description of the insulating film 52 is referred to for the insulating film 72. To avoid redundancy, descriptions of the oxide semiconductor film 103 and the insulating film 106 given later are referred to for the oxide semiconductor film 76 and the insulating film 88, respectively, and the descriptions thereof are omitted here.

The region 73 is an oxygen blocking region. For the region 73, description of the region 53 is referred to. Heat application diffuses excess oxygen in the insulating film 72. Excess oxygen diffused in the insulating film 72 can fill oxygen vacancies in the oxide semiconductor film 76 when reaching the interface between the insulating film 72 and the oxide semiconductor film 76.

Excess oxygen diffused in the insulating film 72 hardly passes through the region 73, which increases the proportion of excess oxygen reaching the interface between the insulating film 72 and the oxide semiconductor film 76. Accordingly, oxygen vacancies in the oxide semiconductor film 76 can be efficiently filled with excess oxygen. Further, for example, excess oxygen diffused in the insulating film 72 can be inhibited from being diffused outward, or can be inhibited from reacting with a wiring or the like included in the semiconductor device to increase the wiring resistance.

The region 77 is a region that is part of the oxide semiconductor film 76 and to which impurities are added. Thus, impurities are added to the oxide semiconductor film, so that the resistance of the oxide semiconductor film can be lowered. For example, as illustrated in FIG. 18A, a low resistance region 78 can be formed in part of the oxide semiconductor film 76 by addition of impurities. In other words, the oxide semiconductor film 76 can have a low resistance region and a high resistance region.

Impurities that are the same as those added to the region 73 can be added to the region 77. Thus, the regions 73 and 77 can be formed at the same time.

The oxide semiconductor film 76 having the low resistance region and the high resistance region can, for example, lower the resistance of a source region or a drain region of a transistor and thus can improve the on-state characteristics of the transistor.

Figure 18B:
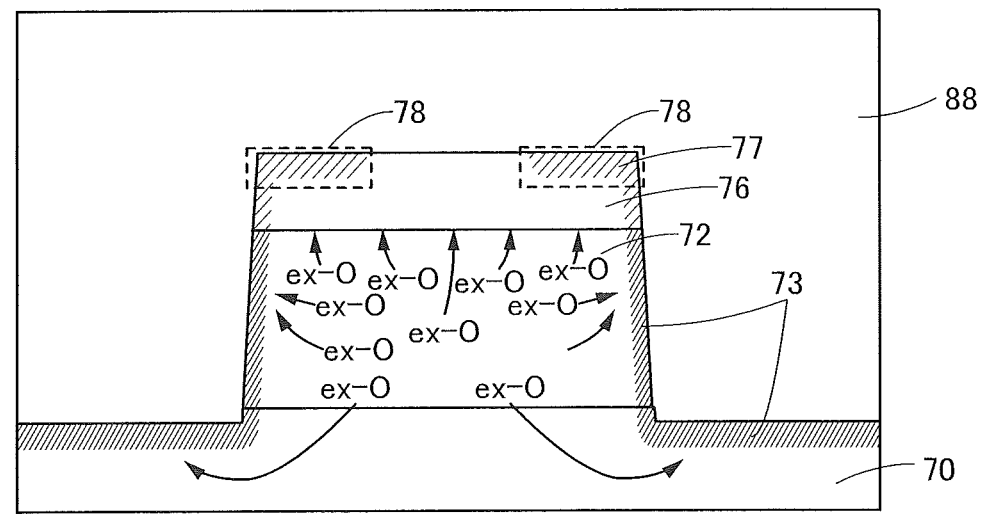

As illustrated in FIG. 18B, the insulating film 72 may be formed to have an island shape. In this case, a region containing excess oxygen has an island shape, whereby oxygen diffusion is suppressed in the lateral direction, so that oxygen can be supplied to the oxide semiconductor film 76 efficiently.

<Method of Impurity Addition>

A method for forming an oxygen blocking region shown as the region 53 in FIG. 1B is described below.

First, the insulating film 52 is formed.

Then, an oxide semiconductor film to be the oxide semiconductor film 56 is formed.

After that, a resist is formed over the oxide semiconductor film. The resist is exposed to light through a photomask and then developed, whereby a resist mask is formed.

Next, the oxide semiconductor film is etched using the resist mask to form the oxide semiconductor film 56.

Then, impurities are added to the insulating film 52 with the resist mask left, whereby the region 53 is formed. The left resist mask can inhibit the impurities from being added to the top surface of the oxide semiconductor film 56. In the case where the top surface of the oxide semiconductor film 56 is removed in a later step, for example, however, the impurities may be added to the insulating film 52 and the oxide semiconductor film 56 after the resist mask is removed.

For example, one or more of boron, carbon, magnesium, aluminum, silicon, phosphorus, calcium, scandium, titanium, vanadium, chromium, manganese, iron, cobalt, nickel, gallium, germanium, arsenic, yttrium, zirconium, niobium, molybdenum, indium, tin, lanthanum, cerium, neodymium, hafnium, tantalum, and tungsten are added as an impurity to the insulating film 52. Note that adding phosphorus or boron among the above impurities to the insulating film 52 enables formation of the particularly high-quality region 53 having an excellent oxygen blocking property.

An ion doping method (a method without mass separation), an ion implantation method (a method with mass separation), plasma treatment, or the like is employed to add the impurities to the insulating film 52. Alternatively, an ion doping method or an ion implantation method in which atomic or molecular clusters are generated and ionized may be employed. Note that the impurities may be added to the insulating film 52 by plasma treatment in an atmosphere containing the impurity element.

In the case where the region 53 is formed in the insulating film 52 by an ion doping method or an ion implantation method, for example, the acceleration voltage for the ion doping method or the ion implantation method is higher than or equal to 0.5 kV and lower than or equal to 100 kV, preferably higher than or equal to 1 kV and lower than or equal to 50 kV, more preferably higher than or equal to 1 kV and lower than or equal to 30 kV, still more preferably higher than or equal to 1 kV and lower than or equal to 10 kV. Further, the ion implantation concentration is higher than or equal to $5\times10^{14}$ atoms/cm$^2$, preferably higher than or equal to $1\times10^{15}$ atoms/cm$^2$.

Although ion addition by an ion doping method or an ion implantation method may be performed at a specific angle (e.g., a right angle) with respect to a surface of a sample, any of the methods illustrated in FIGS. 2A1, 2A2, 2B, and 2C is preferably employed. FIGS. 2A1 to 2C each schematically illustrate the state where one ion is incident on a surface of a sample at an angle θ and an angle φ.

The x-axis, the y-axis, and the z-axis are straight lines intersecting at a certain incident point of the ion. The x-axis is a given straight line on the sample surface. The y-axis is a straight line that is on the sample surface and intersects with the x-axis at right angles. The z-axis is the normal to the sample surface that passes through the incident point. The angle θ is an angle formed by the ion incident direction and the z-axis when seen in cross section. The angle φ is an angle formed by the ion incident direction and the x-axis when seen from above.

When the ion is incident on the sample surface only at a specific angle (θ, φ), a region to which the ion is not added might be generated. For example, the oxide semiconductor film 56 and the resist mask are provided over the insulating film 52 and thus might generate a region of the insulating film 52 to which the ion is not added. For this reason, the ion is preferably incident at a plurality of angles, in which case an influence of the region generated in the insulating film 52 can be reduced.

As illustrated in FIGS. 2A1 and 2A2, the ion is preferably incident on the sample surface at a first angle (θ, φ) and then incident thereon at a second angle (θ, φ). Note that at least one of the angles θ and φ of the first angle (θ, φ) is different from that of the second angle (θ, φ).

The angle θ of the first angle (θ, φ) is, for example, greater than or equal to 0° and less than 90°, preferably greater than or equal to 30° and less than or equal to 88°, more preferably greater than or equal to 60° and less than or equal to 85°. The angle θ of the second angle (θ, φ) is, for example, greater than or equal to 0° and less than 90°, preferably greater than or equal to 30° and less than or equal to 88°, more preferably greater than or equal to 60° and less than or equal to 85°. The angle φ of the second angle (θ, φ) is, for example, larger than the angle φ of the first angle (θ, φ) by greater than or equal to 90° and less than or equal to 270°, preferably greater than or equal to 135° and less than or equal to 225°. Note that the ranges of the first angle (θ, φ) and the second angle (θ, φ) described here are just examples, and are not limited to the above ranges.

The ion incident angle is not limited to the two kinds of angles: the first angle (θ, φ) and the second angle (θ, φ). For example, the ion incident angle may be the first angle (θ, φ) to an n-th angle (θ, φ) (n is a natural number of 2 or more). The angles θ and/or the angles φ of the first angle (θ, φ) to the n-th angle (θ, φ) are different angles.

Alternatively, the ion may incident on the sample surface at the first angle (θ, φ) and then scanning in the θ direction (also referred to as θ scanning) may be performed so that the angle θ passes through 90° to change the ion incident angle from the first angle (θ, φ) to the second angle (θ, φ), as illustrated in FIG. 2B. Note that the ion incident angle φ is not limited to one kind of angle and may be a first angle $\phi$ to an n-th angle (n is a natural number of 2 or more). The $\theta$ scanning of the ion incident angle enables reliable ion addition to a great depth even in an opening with a high aspect ratio (e.g., 1 or more, 2 or more, 5 or more, or 10 or more). Thus, the oxygen blocking region can be formed without any space.

The angle $\theta$ of the first angle ($\theta$, $\phi$) is, for example, greater than or equal to 0° and less than 90°, preferably greater than or equal to 30° and less than or equal to 88°, more preferably greater than or equal to 60° and less than or equal to 85°. The angle $\theta$ of the second angle ($\theta$, $\phi$) is, for example, greater than or equal to 0° and less than 90°, preferably greater than or equal to 30° and less than or equal to 88°, more preferably greater than or equal to 60° and less than or equal to 85°. The angle $\theta$ of the first angle ($\theta$, $\phi$) may be equal to the angle $\theta$ of the second angle ($\theta$, $\phi$).

Note that the $\theta$ scanning may be performed continuously or stepwise, that is, in steps of, for example, 0.5°, 1°, 2°, 3°, 4°, 5°, 6°, 10°, 12°, 18°, 20°, 24°, or 30°.

Alternatively, the ion may incident on the sample surface at the first angle ($\theta$, $\phi$) and then scanning in the $\phi$ direction (also referred to as $\phi$ scanning) may be performed so that the ion incident angle is changed from the first angle ($\theta$, $\phi$) to the second angle ($\theta$, $\phi$) as illustrated in FIG. 2C. Note that the ion incident angle $\theta$ is not limited to one kind of angle and may be any of a first angle $\theta$ to an n-th angle $\theta$ (n is a natural number of 2 or more).

The angle $\theta$ of the first angle ($\theta$, $\phi$) and the second angle ($\theta$, $\phi$) is, for example, greater than or equal to 0° and less than 90°, preferably greater than or equal to 30° and less than or equal to 88°, more preferably greater than or equal to 60° and less than or equal to 85°. The angle $\phi$ of the first angle ($\theta$, $\phi$) may be equal to the angle $\phi$ of the second angle ($\theta$, $\phi$).

Note that the $\phi$ scanning may be performed continuously or stepwise, that is, in steps of, for example, 0.5°, 1°, 2°, 3°, 4°, 5°, 6°, 10°, 12°, 18°, 20°, 24°, or 30°.

Although not illustrated, the $\theta$ scanning and the $\phi$ scanning may be performed in combination.

The method illustrated in FIGS. 2A1 to 2C allows formation of the region 53 in a region that overlaps with part of the oxide semiconductor film 56 as well as in a region that does not overlap with the oxide semiconductor film 56. In other words, the region 53 can be formed so that a region (that does not block oxygen) other than the region 53 does not exist on the outer side than a region over which the oxide semiconductor film 56 is provided. Thus, excess oxygen contained in the insulating film 52 can be efficiently utilized to reduce oxygen vacancies in the oxide semiconductor film 56.

The region 53 is formed in the insulating film 52 in the above-described manner and then the insulating film 68 is formed over the oxide semiconductor film 56 and the region 53 in the insulating film 52, whereby the sample structure illustrated in FIG. 1B can be formed.

Next, a method for manufacturing the sample structure illustrated in FIG. 15A is described. FIG. 15B illustrates a method for manufacturing the sample structure illustrated in FIG. 15A. The manufacturing method is described below.

First, the insulating film 72 is formed over the substrate 70.

Then, an oxide semiconductor film to be the oxide semiconductor film 76 is formed.

After that, a resist is formed over the oxide semiconductor film. The resist is exposed to light through a photomask and then developed, whereby a resist mask 81 is formed.

Next, the oxide semiconductor film and the insulating film 72 are etched using the resist mask 81, so that the island-shaped oxide semiconductor film 76 and the insulating film 72 having a projecting portion are formed.

Then, impurities are added to the insulating film 72 with the resist mask 81 left, whereby the region 73 is formed. For the impurities added to the insulating film 72, description of the impurities added to the insulating film 52 is referred to.

The region 73 can be formed by an ion doping method or an ion implantation method.

For the ion doping method and the ion implantation method, description of the region 53 is referred to. By the method illustrated in FIGS. 2A1 to 2C, a region that does not overlap with the oxide semiconductor film 76 and a region 73a that partly overlaps with the oxide semiconductor film 76 can be formed as the region 73. By the existence of the region 73a, outward diffusion of oxygen from a side surface of the insulating film 72 can be suppressed, so that oxygen can be supplied to the oxide semiconductor film 76 efficiently.

Next, a method for manufacturing the sample structure illustrated in FIG. 16B is described.

First, the insulating film 72 is formed over the substrate 70.

Then, an oxide semiconductor film to be the oxide semiconductor film 76 is formed (FIG. 16A).

Then, impurities are added to the oxide semiconductor film 76 whereby the region 77 is formed (FIG. 16B). For the impurities added to the oxide semiconductor film 76, description of the impurities added to the insulating film 52 is referred to.

The region 77 can be formed by an ion doping method or an ion implantation method.

For the ion doping method and the ion implantation method, description of the region 53 is referred to. Thus, impurities are added to the oxide semiconductor film 76, so that its resistance can be lowered. In other words, the low resistance region 77 can be formed in the oxide semiconductor film 76.

Next, a method for manufacturing a sample structure illustrated in FIG. 16C is described. A resist mask (not illustrated) is formed over the part of the oxide semiconductor film 76 that is to be the region 79, and impurities are added, so that impurities can be added only to the region 77 by an ion doping method or an ion implantation method. In other words, the oxide semiconductor film 76 can have the low resistance region 77 and the high resistance region 79.

Figure 17A:
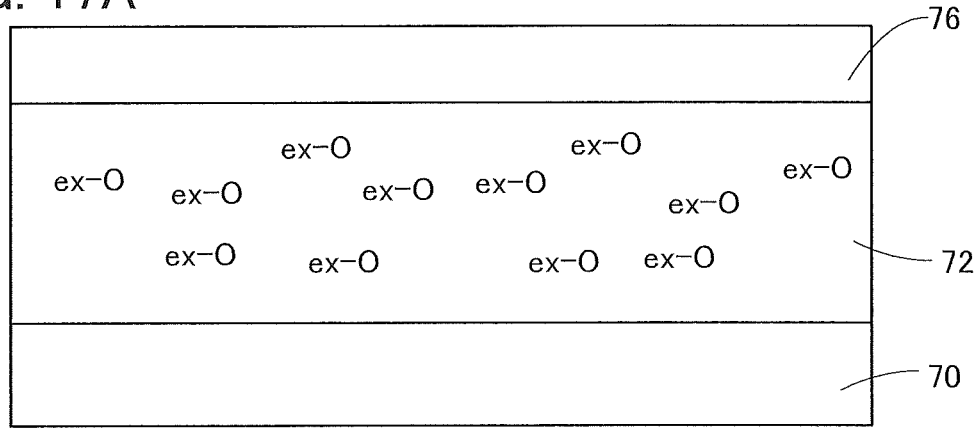
FIGS. 17A to 17C are schematic cross-sectional views each illustrating addition of impurities in a semiconductor device.
Figure 17B:
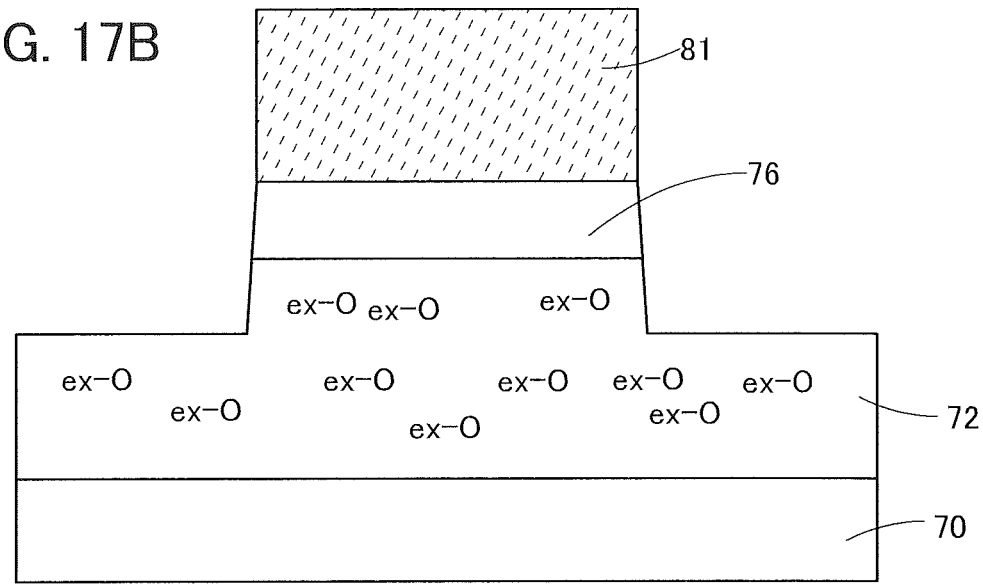
Figure 17C:
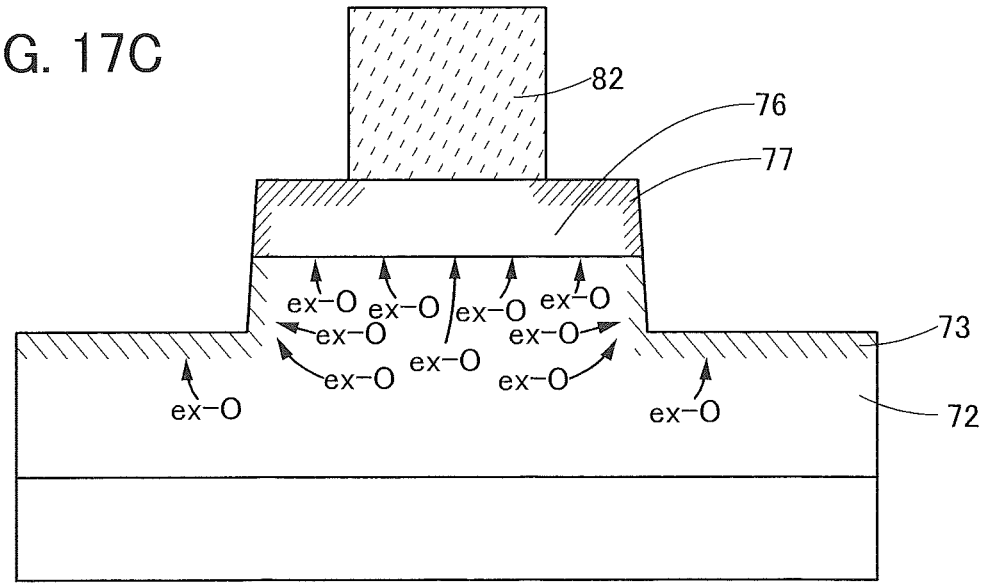

Next, a method for manufacturing the sample structure illustrated in FIG. 18A is described. FIGS. 17A to 17C illustrate a method for manufacturing the sample structure illustrated in FIG. 18A. The manufacturing method is described below.

First, the insulating film 72 is formed.

Then, an oxide semiconductor film to be the oxide semiconductor film 76 is formed (see FIG. 17A).

After that, a resist is formed over the oxide semiconductor film. The resist is exposed to light through a photomask and then developed, whereby the resist mask 81 is formed.

Next, the oxide semiconductor film and the insulating film 72 are etched using the resist mask 81, so that the island-shaped oxide semiconductor film 76 and the insulating film 72 having a projecting portion are formed (see FIG. 17B).

Then, a resist mask 82 is formed in a smaller region than the resist mask 81 in a manner similar to that of the resist mask 81. The region 73 is formed by adding impurities to the insulating film 72 using the resist mask 82 (see FIG. 17C).

For the impurities added to the insulating film 72, description of impurities added to the insulating film 52 is referred to.

The region 73 can be formed by an ion doping method or an ion implantation method.

For the ion doping method and the ion implantation method, description of the region 53 is referred to. By the method illustrated in FIGS. 2A1 to 2C, the region 73 can be formed in a region that does not overlap with the oxide semiconductor film 76 and a region that partly overlaps with the oxide semiconductor film 76. In other words, as illustrated in FIGS. 15A to 15C, the region 73 can be formed on the top surface of the insulating film 72 and a side surface of the projecting portion of the insulating film 72.

Impurities added to the region 77 can be the same as those added to the region 73. Thus, in the case where impurities are added to form the region 73 that is an oxygen blocking region, the region 77 to which impurities are added can be formed in part of the oxide semiconductor film 76 by the same impurity addition step for forming the region 73 (see FIG. 17C). Thus, impurities are added to the oxide semiconductor film 76, so that the resistance of the oxide semiconductor film 76 can be lowered. Accordingly, for example, as illustrated in FIG. 18A, the low resistance region 78 can be formed in part of the oxide semiconductor film 76. In other words, the oxide semiconductor film 76 can have a low resistance region and a high resistance region.

By utilizing the step of forming an oxygen blocking region in the insulating film 72, a high resistance region and a low resistance region can be formed in the oxide semiconductor film 76.

<Description of Structure of Transistor and Manufacturing Method Thereof>

The structure of a transistor of one embodiment of the present invention and a manufacturing method thereof are described below.

<Transistor Structure 1>

An example of a self-aligned top-gate transistor is described first.

In a self-aligned top-gate structure, a source region and a drain region are formed in a self-aligned manner using a gate electrode as a mask; thus, the area of the overlap between the gate electrode and the source and drain regions can be greatly reduced, which is effective for reduction in parasitic capacitance. Such a phenomenon is more remarkable as the channel length is smaller, and thus the self-aligned top-gate structure is more effective particularly in miniaturized transistors. Parasitic capacitance that can be generated between the gate electrode and the source or drain electrode or between the gate electrode and the low resistance region of the semiconductor film is decreased, whereby the switching characteristics of a transistor can be improved.

Figure 3A:
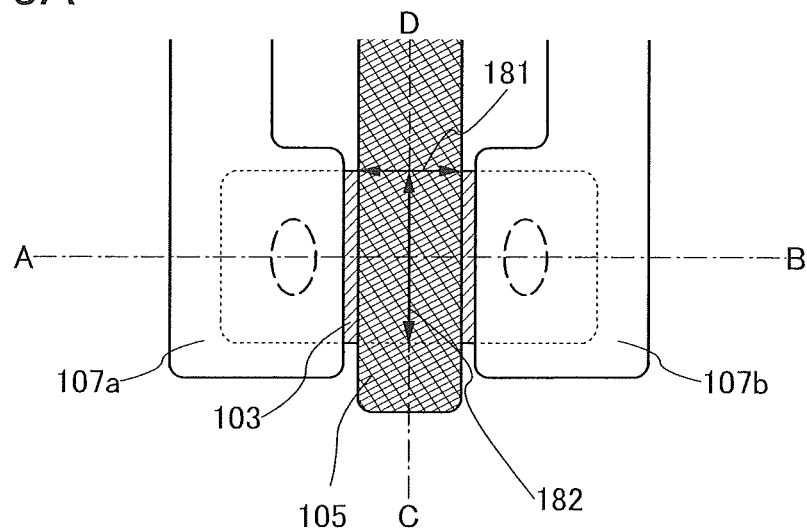
FIGS. 3A to 3C are a top view and cross-sectional views illustrating an example of a semiconductor device according to one embodiment of the present invention.
Figure 3B:
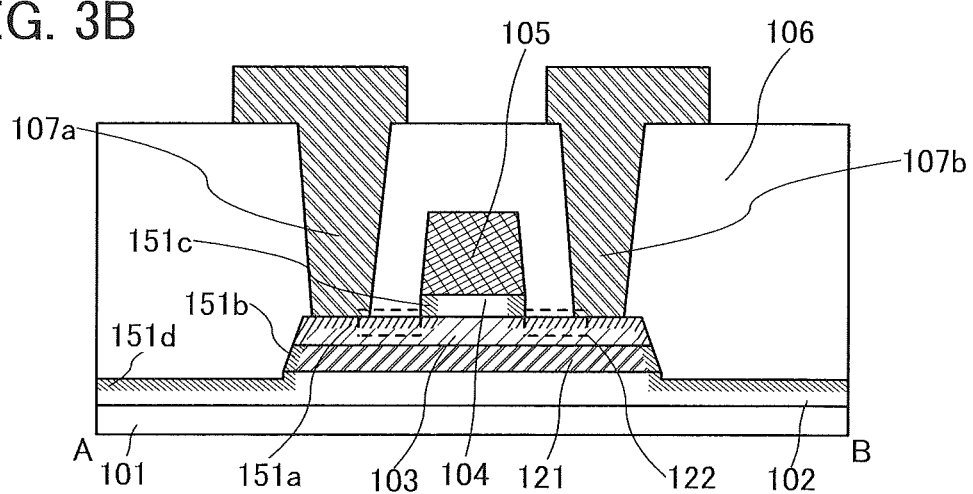
Figure 3C:
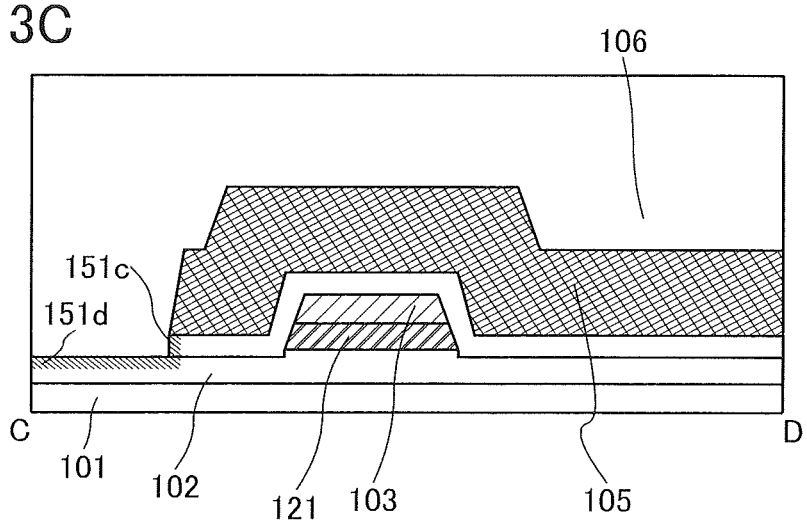

FIGS. 3A to 3C are a top view and cross-sectional views of the transistor. FIG. 3A is the top view of the transistor. FIG. 3B is a cross-sectional view taken along dashed-dotted line A-B in FIG. 3A. FIG. 3C is a cross-sectional view taken along dashed-dotted line C-D in FIG. 3A.

Note that a channel length is a distance between a source region and a drain region in a region where a semiconductor film and a gate electrode overlap with each other in a top view. That is, the channel length in FIG. 3A is a channel length 181 indicated by an arrow. A channel width is a length of a portion where a source region and a drain region face each other in parallel and where a semiconductor film and a gate electrode overlap with each other. That is, the channel width in FIG. 3A is a channel width 182 indicated by an arrow. A channel formation region is a region where the oxide semiconductor film 103 and a gate electrode 105 overlap with each other in the top view and which is sandwiched between the source region and the drain region.

The transistor in FIG. 3B includes a base insulating film 102 over a substrate 101; an insulating film 121 over the base insulating film 102; the oxide semiconductor film 103 over the insulating film 121; a gate insulating film 104 over the oxide semiconductor film 103; the gate electrode 105 over the gate insulating film 104; the insulating film 106 over the gate electrode 105, the oxide semiconductor film 103, and the base insulating film 102; and a source electrode 107a and a drain electrode 107b over the oxide semiconductor film 103 and the insulating film 106. The insulating film 121 contains excess oxygen. Note that the transistor does not necessarily include the base insulating film 102.

In FIG. 3B, a region 151a is part of the oxide semiconductor film. Regions 151b, 151c, and 151d are parts of the insulating films and serve as oxygen blocking regions. For the oxygen blocking regions, the above description of the region 53 is referred to. The transistor in FIG. 3B includes one or more of the regions 151b, 151c, and 151d serving as oxygen blocking regions.

First, the regions 151b, 151c, and 151d serving as oxygen blocking regions are described.

Figure 4A:
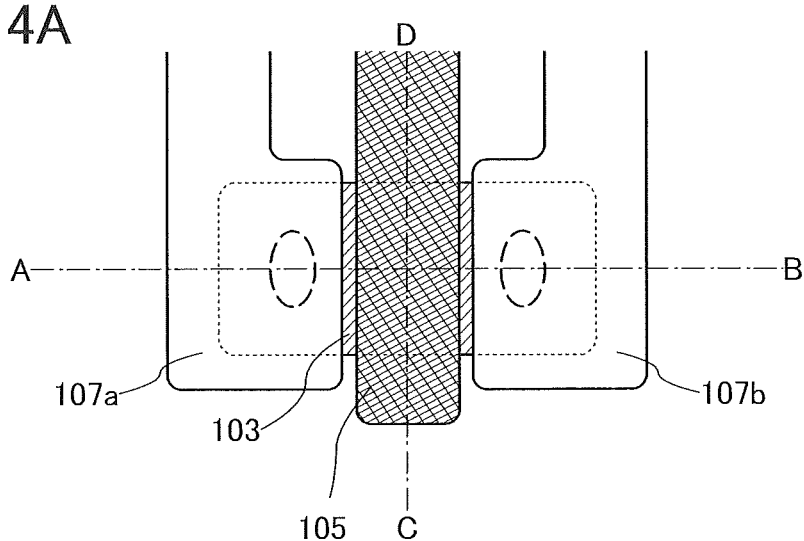
FIGS. 4A to 4C are a top view and cross-sectional views illustrating an example of a semiconductor device according to one embodiment of the present invention.
Figure 4B:
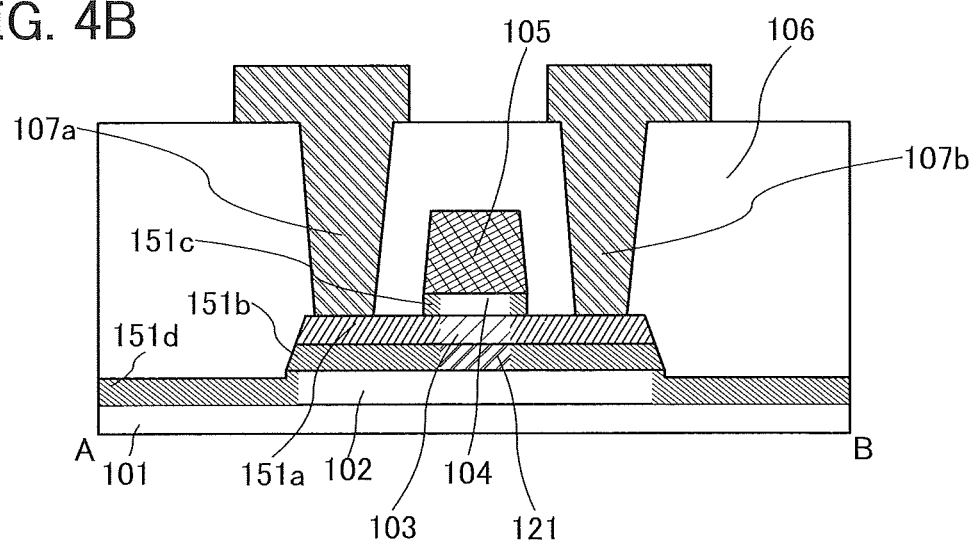

The region 151b is in the insulating film 121 and in contact with the insulating film 106. The region 151b is provided at a depth from 1 nm to 200 nm inclusive, preferably from 5 nm to 150 nm inclusive, more preferably from 10 nm to 100 nm inclusive from a surface of the insulating film 121 in contact with the insulating film 106. Note that the region 151b may be provided not only at the side surface of the insulating film 121 but also in a region of the insulating film 121 overlapping with the region 151a as illustrated in FIG. 4B.

The region 151c is in the gate insulating film 104 and in contact with the insulating film 106 as illustrated in FIGS. 3B and 3C. The region 151c is provided at a depth from 1 nm to 200 nm inclusive, preferably from 5 nm to 150 nm inclusive, more preferably from 10 nm to 100 nm inclusive from a surface of the gate insulating film 104 in contact with the insulating film 106.

Figure 4C:
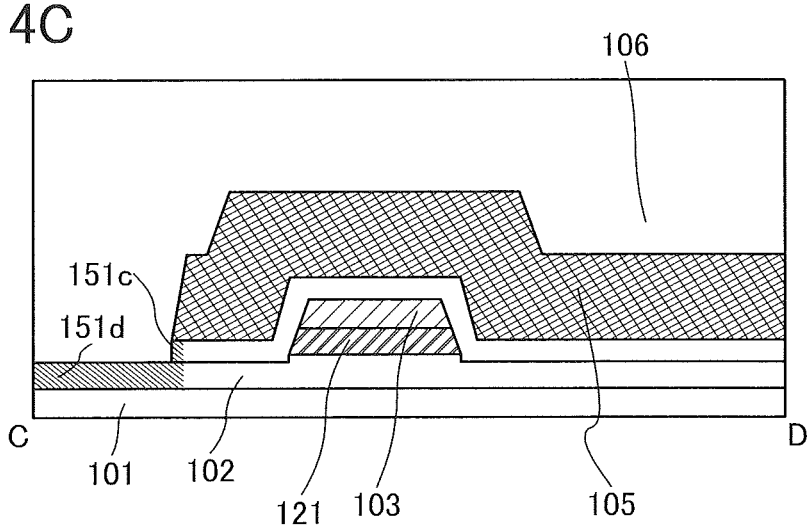

The region 151d is in the base insulating film 102 and in contact with the insulating film 106 as illustrated in FIG. 3B. The region 151d is provided at a depth from 1 nm to 200 nm inclusive, preferably from 5 nm to 150 nm inclusive, more preferably from 10 nm to 100 nm inclusive from the top surface of the base insulating film 102. Note that without limitation thereto, the region 151d may be provided so as to extend from the top surface of the base insulating film 102 to the bottom surface thereof as illustrated in FIGS. 4B and 4C. The region 151d may also be provided in the substrate 101.

In the case where the transistor includes the region 151b, excess oxygen contained in the insulating film 121 can be efficiently utilized to reduce oxygen vacancies in the oxide semiconductor film 103. For example, in the case where the transistor does not have the region 151b, excess oxygen contained in the insulating film 121 is lost by outward diffusion through the insulating film 106 in some cases. Moreover, excess oxygen contained in the insulating film 121 can oxidize the source electrode 107a and the drain electrode 107b.

Also in the case where the transistor includes the region 151d, excess oxygen contained in the insulating film 121 and the base insulating film 102 can be efficiently utilized to reduce oxygen vacancies in the oxide semiconductor film 103. For example, in the case where the transistor does not have the region 151*d*, excess oxygen contained in the insulating film 121 and the base insulating film 102 is lost by outward diffusion in some cases. Moreover, in the case where the transistor does not have the region 151*d*, excess oxygen contained in the insulating film 121 and the base insulating film 102 can oxidize the source electrode 107*a* and the drain electrode 107*b*.

Also in the case where the transistor includes the region 151*c*, excess oxygen contained in the gate insulating film 104 can be efficiently utilized to reduce oxygen vacancies in the oxide semiconductor film 103. For example, in the case where the transistor does not have the region 151*c*, excess oxygen contained in the gate insulating film 104 is lost by outward diffusion in some cases. Moreover, in the case where the transistor does not have the region 151*c*, excess oxygen contained in the gate insulating film 104 can oxidize the source electrode 107*a* and the drain electrode 107*b*.

Next, the region 151*a* that is part of the oxide semiconductor film 103 is described.

The region 151*a* is in the oxide semiconductor film 103 and in contact with the source electrode 107*a*, the drain electrode 107*b*, and the insulating film 106. The region 151*a* is provided at a depth from 1 nm to 200 nm inclusive, preferably from 5 nm to 150 nm inclusive, more preferably from 10 nm to 100 nm inclusive from the top or side surface of the oxide semiconductor film 103. Note that the region 151*a* may be provided in the entire region of the insulating film 103 in the film thickness direction except the channel formation region of the oxide semiconductor film 103 as illustrated in FIGS. 4A to 4C.

At the step of adding impurities to form the regions 151*b*, 151*c*, and 151*d* serving as oxygen blocking regions, impurities are added also to the region 151*a*. At that time, the resistance of the region 151*a* can be lowered by the impurity addition.

A region 122 illustrated in FIG. 3B is not in contact with the source electrode 107*a* or the drain electrode 107*b*, and does not overlap with the gate electrode 105. When the resistance of the region 122 is high, the on-state current of the transistor is reduced.

The resistance of the region 122 can be lowered by adding impurities to the region 151*a*, which is part of the oxide semiconductor film 103. Accordingly, the on-state current can be increased, and the performance of the transistor can be improved.

Note that the step for adding impurities to form the low resistance region can also serve as the step for adding impurities to form the regions 151*b*, 151*c*, and 151*d* serving as oxygen blocking regions. Thus, manufacturing process can be shortened, which leads to cost reduction. Moreover, an improved yield can be expected by the simplified manufacturing process.

A structure of the oxide semiconductor film 103 is described below.

The oxide semiconductor film 103 is an oxide containing indium. An oxide containing indium can have a high carrier mobility (electron mobility), for example.

The oxide semiconductor film 103 preferably contains an element M. The element M is aluminum, gallium, yttrium, or tin, for example. The element M is an element having a high bonding energy with oxygen, for example. The element M is an element that can increase the energy gap of the oxide, for example. Further, the oxide semiconductor film 103 preferably contains zinc. In the case where an oxide contains zinc, the oxide is likely to be crystallized. The energy at the top of the valence band of an oxide can be controlled with the atomic ratio of zinc.

Note that the oxide semiconductor film 103 is not limited to the oxide containing indium. The oxide semiconductor film 103 may be, for example, a Zn—Sn oxide or a Ga—Sn oxide.

A first oxide semiconductor film and a second oxide semiconductor film may be provided over and under the channel formation region in the oxide semiconductor film 103. Note that the second oxide semiconductor film is provided between the oxide semiconductor film 103 and the gate insulating film 104.

The first oxide semiconductor film contains one or more elements that are not oxygen and are contained in the oxide semiconductor film 103. Since the first oxide semiconductor film contains one or more elements that are not oxygen and are contained in the oxide semiconductor film 103, an interface state is unlikely to be formed at the interface between the oxide semiconductor film 103 and the first oxide semiconductor film.

The second oxide semiconductor film contains one or more elements that are not oxygen and are contained in the oxide semiconductor film 103. Since the second oxide semiconductor film contains one or more elements that are not oxygen and are contained in the oxide semiconductor film 103, an interface state is unlikely to be formed at the interface between the oxide semiconductor film 103 and the second oxide semiconductor film.

In the case of using an In-M-Zn oxide as the first oxide semiconductor film, when summation of In and M is assumed to be 100 atomic %, the proportions of In and M are preferably set to less than 50 atomic % and greater than or equal to 50 atomic %, respectively, and more preferably less than 25 atomic % and greater than or equal to 75 atomic %, respectively. In the case of using an In-M-Zn oxide as the oxide semiconductor film 103, when summation of In and M is assumed to be 100 atomic %, the proportions of In and M are preferably set to greater than or equal to 25 atomic % and less than 75 atomic %, respectively, and more preferably greater than or equal to 34 atomic % and less than 66 atomic %, respectively. In the case of using an In-M-Zn oxide as the second oxide semiconductor film, when summation of In and M is assumed to be 100 atomic %, the proportions of In and M are preferably set to less than 50 atomic % and greater than or equal to 50 atomic %, respectively, and more preferably less than 25 atomic % and greater than or equal to 75 atomic %, respectively. Note that the second oxide semiconductor film may be formed using the same kind of oxide as that of the first oxide semiconductor film.

Here, in some cases, there is a mixed region of the first oxide semiconductor film and the oxide semiconductor film 103 between the first oxide semiconductor film and the oxide semiconductor film 103. Further, in some cases, there is a mixed region of the oxide semiconductor film 103 and the second oxide semiconductor film between the oxide semiconductor film 103 and the second oxide semiconductor film. The mixed region has a low density of interface states. For that reason, the stack including the first oxide semiconductor film, the oxide semiconductor film 103, and the second oxide semiconductor film has a band structure where energy at each interface is changed continuously (continuous junction).

As the oxide semiconductor film 103, an oxide with a wide energy gap is used. For example, the energy gap of the oxide semiconductor film 103 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV. Furthermore, the energy gap of the second oxide semiconductor film is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV.

As the first oxide semiconductor film, an oxide with a wide energy gap is used. For example, the energy gap of the first oxide semiconductor film is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV.

As the second oxide semiconductor film, an oxide with a wide energy gap is used. The energy gap of the second oxide semiconductor film is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV. Note that the first oxide semiconductor film and the second oxide semiconductor film have wider energy gaps than the oxide semiconductor film 103.

As the oxide semiconductor film 103, an oxide having an electron affinity higher than that of the first oxide semiconductor film is used. For example, as the oxide semiconductor film 103, an oxide having an electron affinity higher than that of the first oxide semiconductor film by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that electron affinity is an energy gap between the vacuum level and the bottom of the conduction band.

Further, as the oxide semiconductor film 103, an oxide having an electron affinity higher than that of the second oxide semiconductor film is used. For example, as the oxide semiconductor film 103, an oxide having an electron affinity higher than that of the second oxide semiconductor film by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.5 eV is used.

In that case, when an electric field is applied to the gate electrode 105, current mainly flows in the oxide semiconductor film 103 having an electron affinity higher than those of the first oxide semiconductor film and the second oxide semiconductor film.

To increase the on-state current of the transistor, the thickness of the second oxide semiconductor film is preferably as small as possible. The thickness of the second oxide semiconductor film is set to less than 10 nm, preferably less than or equal to 5 nm, more preferably less than or equal to 3 nm, for example. Meanwhile, the second oxide semiconductor film has a function of blocking elements other than oxygen (such as silicon) contained in the gate insulating film 104 from entering the oxide semiconductor film 103 where current mainly flows. For this reason, the second oxide semiconductor film preferably has a certain degree of thickness. The thickness of the second oxide semiconductor film is set to greater than 0.3 nm, preferably greater than or equal to 1 nm, more preferably greater than or equal to 2 nm, for example.

To increase reliability, the first oxide semiconductor film is preferably formed thick and the oxide semiconductor film 103 and the second oxide semiconductor film are preferably formed thin. Specifically, the thickness of the first oxide semiconductor film is greater than or equal to 20 nm, preferably greater than or equal to 30 nm, more preferably greater than or equal to 40 nm, still more preferably greater than or equal to 60 mm In that case, the distance from the interface between the base insulating film 102 and the first oxide semiconductor film to the oxide semiconductor film 103 where current mainly flows can be greater than or equal to 20 nm, preferably greater than or equal to 30 nm, more preferably greater than or equal to 40 nm, still more preferably greater than or equal to 60 nm. To prevent the productivity of the semiconductor device from being lowered, the thickness of the first oxide semiconductor film is less than or equal to 200 nm, preferably less than or equal to 120 nm, more preferably less than or equal to 80 nm. The thickness of the oxide semiconductor film 103 is greater than or equal to 3 nm and less than or equal to 100 nm, preferably greater than or equal to 3 nm and less than or equal to 80 nm, more preferably greater than or equal to 3 nm and less than or equal to 50 nm.

For example, the first oxide semiconductor film may be thicker than the oxide semiconductor film 103, and the oxide semiconductor film 103 may be thicker than the second oxide semiconductor film.

In the case of forming the island-shaped insulating film 121, the sum of thicknesses of the first oxide semiconductor film and the insulating film 121 is set to greater than or equal to 20 nm, preferably greater than or equal to 30 nm, more preferably greater than or equal to 40 nm, still more preferably greater than or equal to 60 nm; the distance from the interface between the base insulating film 102 and the insulating film 121 to the oxide semiconductor film 103 where current mainly flows can be greater than or equal to 20 nm, preferably greater than or equal to 30 nm, more preferably greater than or equal to 40 nm, still more preferably greater than or equal to 60 nm. In other words, when the insulating film 121 is formed thick, the first oxide semiconductor film can be formed thin. When the first oxide semiconductor film is formed thin, the amount of supply of excess oxygen to the first oxide semiconductor film can be reduced and the amount of supply of oxygen to the oxide semiconductor film 103 where current mainly flows is relatively increased; thus, further improvement of characteristics can be expected.

The influence of impurities in the oxide semiconductor film 103 is described below. In order that the transistor have stable electrical characteristics, it is effective to reduce the concentration of impurities in the oxide semiconductor film 103 so that the oxide semiconductor film 103 has a lower carrier density and is highly purified. The carrier density of the oxide semiconductor film 103 is set to lower than $1\times10^{17}/cm^3$, lower than $1\times10^{15}/cm^3$, or lower than $1\times10^{13}/cm^3$. In order to reduce the concentration of impurities in the oxide semiconductor film 103, the concentration of impurities in a film that is adjacent to the oxide semiconductor film 103 is also preferably reduced.

Silicon contained in the oxide semiconductor film 103 might serve as a carrier trap or a carrier generation source. The concentration of silicon in a region between the oxide semiconductor film 103 and the first oxide semiconductor film, which is measured by secondary ion mass spectrometry (SIMS), is preferably lower than $1\times10^{19}$ atoms/cm$^3$, more preferably lower than $5\times10^{18}$ atoms/cm$^3$, still more preferably lower than $2\times10^{18}$ atoms/cm$^3$. The concentration of silicon in a region between the oxide semiconductor film 103 and the second oxide semiconductor film, which is measured by SIMS, is lower than $1\times10^{19}$ atoms/cm$^3$, preferably lower than $5\times10^{18}$ atoms/cm$^3$, more preferably lower than $2\times10^{18}$ atoms/cm$^3$.

When hydrogen is contained in the oxide semiconductor film 103, carrier density might be increased. The concentration of hydrogen in the oxide semiconductor film 103 measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. When nitrogen is contained in the oxide semiconductor film 103, carrier density might be increased. The concentration of nitrogen in the oxide semiconductor film 103 measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

It is preferable to reduce the concentration of hydrogen in the first oxide semiconductor film in order to reduce the concentration of hydrogen in the oxide semiconductor film 103. The concentration of hydrogen in the first oxide semiconductor film measured by SIMS can be lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. Further, it is preferable to reduce the concentration of nitrogen in the first oxide semiconductor film in order to reduce the concentration of nitrogen in the oxide semiconductor film 103. The concentration of nitrogen in the first oxide semiconductor film measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

It is also preferable to reduce the concentration of hydrogen in the second oxide semiconductor film in order to reduce the concentration of hydrogen in the oxide semiconductor film 103. The concentration of hydrogen in the second oxide semiconductor film measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is also preferable to reduce the concentration of nitrogen in the second oxide semiconductor film in order to reduce the concentration of nitrogen in the oxide semiconductor film 103. The concentration of nitrogen in the second oxide semiconductor film measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

Here, a structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in the direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or the top surface of the CAAC-OS film, and is arranged in parallel to the formation surface or the top surface of the CAAC-OS film.

On the other hand, according to the TEM image of the CAAC-OS film observed in the direction substantially perpendicular to the sample surface (plane TEM image), metal atoms are arranged in a triangular or hexagonal configuration in the crystal parts. However, there is no regularity of arrangement of metal atoms between different crystal parts.

From the results of the cross-sectional TEM image and the plane TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 mm, or less than 3 nm. Note that when a plurality of crystal parts included in the CAAC-OS film are connected to each other, one large crystal region is formed in some cases. For example, a crystal region with an area of 2500 nm$^2$ or more, 5$\mu\mu^2$ or more, or 1000$\mu\mu^2$ or more is observed in some cases in the plane TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in the direction substantially perpendicular to the formation surface or the top surface of the CAAC-OS film.

In this specification, the trigonal and rhombohedral crystal systems are included in the hexagonal crystal system.

On the other hand, when the CAAC-OS film is analyzed by an in-plane method in which an X-ray enters a sample in the direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in the direction parallel to a normal vector of the formation surface or a normal vector of the top surface of the CAAC-OS film. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in the direction parallel to a normal vector of the formation surface or a normal vector of the top surface of the CAAC-OS film. Thus, for example, in the case where a shape of the CAAC-OS film is changed by etching or the like, the c-axis of the crystal might not be necessarily parallel to a normal vector of the formation surface or a normal vector of the top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the proportion of the c-axis aligned crystal parts in the vicinity of the top surface is higher than that in the vicinity of the formation surface in some cases. Further, when impurities are added to the CAAC-OS film, a region to which the impurities are added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

The CAAC-OS film is an oxide semiconductor film having a low impurity concentration. The impurity is an element other than the main components of the oxide semiconductor film, such as hydrogen, carbon, silicon, and a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, heavy metals such as iron and nickel, argon, carbon dioxide, and the like each have a large atomic radius (molecular radius), and thus disturb the atomic arrangement of the oxide semiconductor film and causes a decrease in crystallinity when any of them is contained in the oxide semiconductor film. Note that the impurity contained in the oxide semiconductor film might serve as a carrier trap or a carrier generation source.

Further, the CAAC-OS film is an oxide semiconductor film having a low density of defect states. For example, oxygen vacancies in the oxide semiconductor film serve as carrier traps or serve as carrier generation sources in some cases when hydrogen is captured therein.

The state in which the impurity concentration is low and the density of defect states is low (the number of oxygen vacancies is small) is referred to as a highly purified intrinsic state or a substantially highly purified intrinsic state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small variations in electrical characteristics and high reliability. Electrical charge trapped by the carrier traps in the oxide semiconductor film takes a long time to be released, and might behave like fixed electrical charge. Thus, a transistor including an oxide semiconductor film having a high impurity concentration and a high density of defect states has unstable electrical characteristics in some cases.

In a transistor using the CAAC-OS film, change in electrical characteristics due to irradiation with visible light or ultraviolet light is small.

Next, a microcrystalline oxide semiconductor film is described.

In an image obtained with TEM, crystal parts cannot be found clearly in the microcrystalline oxide semiconductor film in some cases. In most cases, the size of a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm or a size greater than or equal to 1 nm and less than or equal to 3 nm is specifically referred to as nanocrystal (nc). An oxide semiconductor film including a nanocrystal is referred to as a nanocrystalline oxide semiconductor (nc-OS) film. In an image obtained with TEM, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than a crystal part, a peak that shows a crystal plane does not appear. Further, a halo-like pattern is shown in a selected-area electron diffraction pattern of the nc-OS film that is obtained by using an electron beam having a probe diameter (e.g., larger than or equal to 50 nm) larger than the diameter of a crystal part. Meanwhile, spots are shown in a nanobeam electron diffraction pattern of the nc-OS film that is obtained by using an electron beam having a probe diameter (e.g., larger than or equal to 1 nm and smaller than or equal to 30 nm) close to, or smaller than or equal to the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film having more regularity than the amorphous oxide semiconductor film; thus, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stack including two or more films of an amorphous oxide semiconductor film, a microcrystalline oxide semiconductor film, and a CAAC-OS film.

The base insulating film 102 illustrated in FIGS. 3A to 3C is formed of, for example, an insulating film containing silicon oxide or silicon oxynitride. Further, as the base insulating film 102, an insulating film containing excess oxygen is preferably used. The thickness of the base insulating film 102 is, for example, greater than or equal to 20 nm and less than or equal to 1000 nm, preferably greater than or equal to 50 nm and less than or equal to 1000 nm, more preferably greater than or equal to 100 nm and less than or equal to 1000 nm, still more preferably greater than or equal to 200 nm and less than or equal to 1000 nm.

Alternatively, a silicon nitride film may be used as the base insulating film 102. Further alternatively, an aluminum oxide film may be used. With use of a silicon nitride film or an aluminum oxide film having a low oxygen-transmitting property, oxygen diffusion from the insulating film 121 to the base insulating film 102 can be prevented.

The insulating film 121 contains excess oxygen. The insulating film 121 is formed of, for example, a single layer or a stack of an insulating film containing silicon oxide or silicon oxynitride. The thickness of the base insulating film 102 is, for example, greater than or equal to 20 nm and less than or equal to 1000 nm, preferably greater than or equal to 50 nm and less than or equal to 1000 nm, further preferably greater than or equal to 100 nm and less than or equal to 1000 nm, still further preferably greater than or equal to 200 nm and less than or equal to 1000 nm.

Alternatively, for example, a silicon nitride film is formed as the first layer of the insulating film 121 and a silicon oxide film is formed as the second layer of the insulating film 121. In this case, a silicon oxynitride film may be used instead of the silicon oxide film. A silicon nitride oxide film may be used instead of the silicon nitride film. The silicon oxide film contains excess oxygen. As the silicon nitride film, a silicon nitride film from which hydrogen and ammonia are less likely to be released is used. Further, as the silicon nitride film, a silicon nitride film that does not transmit or hardly transmits hydrogen, water, and oxygen is used. With use of a silicon nitride film having a low oxygen-transmitting property, oxygen diffusion from the insulating film 121 to the base insulating film 102 can be prevented.

Further alternatively, for example, an aluminum oxide film is formed as the first layer of the insulating film 121 and a silicon oxide film is formed as the second layer of the insulating film 121. With use of an aluminum oxide film having a low oxygen-transmitting property, oxygen diffusion from the insulating film 121 to the base insulating film 102 can be prevented.

Still alternatively, for example, a silicon nitride film is formed as the base insulating film 102 and a silicon oxide film is formed as the insulating film 121. A silicon oxynitride film may be used instead of the silicon oxide film. A silicon nitride oxide film may be used instead of the silicon nitride film. The silicon oxide film preferably has a small defect density. Specifically, a silicon oxide film whose spin density attributed to a signal with a g-factor of 2.001 in ESR is lower than or equal to $3 \times 10^{17}$ spins/cm$^3$, preferably lower than or equal to $5 \times 10^{16}$ spins/cm$^3$ is used. As the silicon nitride film, a silicon nitride film from which hydrogen and ammonia are less likely to be released is used. The amount of released hydrogen and ammonia can be measured by TDS. Further, as the silicon nitride film, a silicon nitride film that does not transmit or hardly transmits hydrogen, water, and oxygen is used.

Further alternatively, for example, a silicon nitride film is formed as the base insulating film 102 and a stacked film including the first silicon oxide film and the second silicon oxide film is formed as the insulating film 121. In that case, the first and/or second silicon oxide film may be a silicon oxynitride film. A silicon nitride oxide film may be used instead of the silicon nitride film. As the first silicon oxide film, it is preferable to use a silicon oxide film whose defect density is small. Specifically, a silicon oxide film whose spin density attributed to a signal with a g-factor of 2.001 in ESR is lower than or equal to $3 \times 10^{17}$ spins/cm$^3$, preferably lower than or equal to $5 \times 10^{16}$ spins/cm$^3$ is used. As the second silicon oxide film, a silicon oxide film containing excess oxygen is used. As the silicon nitride film, a silicon nitride film from which hydrogen and ammonia are less likely to be released is used. Further, as the silicon nitride film, a silicon nitride film that does not transmit or hardly transmits hydrogen, water, and oxygen is used.

The gate insulating film 104 may be formed using, for example, a single layer or a stack of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. The gate insulating film 104 is preferably formed using an insulating film containing excess oxygen. The thickness (equivalent oxide thickness) of the gate insulating film 104 is, for example, greater than or equal to 1 nm and less than or equal to 500 nm, preferably greater than or equal to 3 nm and less than or equal to 300 nm, further preferably greater than or equal to 5 nm and less than or equal to 100 nm, still further preferably greater than or equal to 5 nm and less than or equal to 50 nm.

The gate insulating film 104 may be, for example, a stacked film including a silicon nitride film as a first layer and a silicon oxide film as a second layer. A silicon oxynitride film may be used instead of the silicon oxide film. A silicon nitride oxide film may be used instead of the silicon nitride film. It is preferable to use a silicon oxide film whose defect density is small as the silicon oxide film. Specifically, a silicon oxide film whose spin density attributed to a signal with a g-factor of 2.001 in ESR is lower than or equal to $3 \times 10^{17}$ spins/cm$^3$, preferably lower than or equal to $5 \times 10^{16}$ spins/cm$^3$ is used. The silicon oxide film preferably contains excess oxygen. As the silicon nitride film, a silicon nitride film from which a hydrogen gas and an ammonia gas are less likely to be released is used. The amount of released hydrogen and ammonia gases can be measured by TDS.

For example, like a stacked-layer film of silicon oxide and hafnium oxide, part of the gate insulating film 104 uses a material having a lot of electron trap states, such as hafnium oxide, aluminum oxide, and tantalum oxide, and the state where the potential of the gate electrode 105 is higher than that of the source electrode 107a or the drain electrode 107b is kept for one second or more, typically one minute or more at a higher temperature (a temperature higher than the operating temperature or the storage temperature of the semiconductor device, or a temperature of 125° C. or higher and 450° C. or lower, typically a temperature of 150° C. or higher and 300° C. or lower). Thus, electrons move from the oxide semiconductor film 103 to the gate electrode 105, and some of the electrons are trapped by the electron trap states.

In the semiconductor device in which a necessary amount of electrons is trapped by the electron trap states in this manner, the threshold voltage is shifted in the positive direction. By controlling the voltage of the gate electrode 105, the amount of electrons to be trapped can be controlled, and thus the threshold voltage can be controlled. Furthermore, the treatment for trapping the electrons may be performed in the manufacturing process of the semiconductor device.

The treatment for trapping the electrons may be performed at any of the following timings before leaving the factory, for example: after formation of wiring metal connected to the source electrode 107a or the drain electrode 107b of the semiconductor device, after pre-process (wafer process), after wafer dicing, and after packaging. In any case, it is preferable that the semiconductor device be not exposed to a temperature higher than or equal to 125° C. for one hour or more after that.

An example in which the gate insulating film 104 serves also as an electron trap layer is described with reference to simplified cross-sectional views.

Figure 5A:
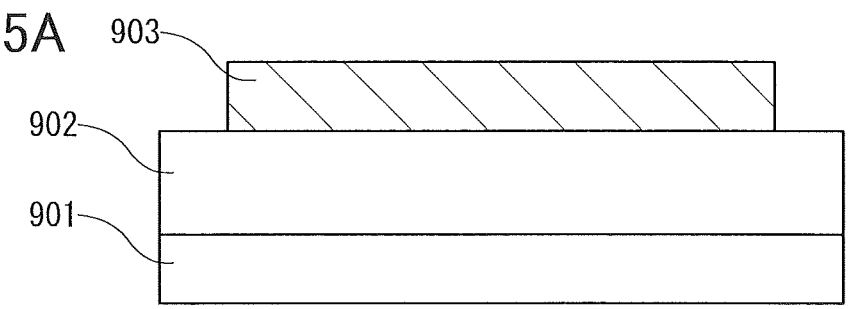
FIGS. 5A to 5C are each a cross-sectional view of a transistor.

FIG. 5A illustrates a semiconductor device including a semiconductor film 901, an electron trap layer 902, and a gate electrode 903. The electron trap layer 902 corresponds to the gate insulating film 104 in FIGS. 3A to 3C and the like. The gate electrode 903 corresponds to the gate electrode 105 in FIGS. 3A to 3C and the like.

The electron trap layer 902 includes a state that traps an electron (electron trap state). Alternatively, the electron trap layer 902 is a layer in which an electron is trapped by a given means or processing. Alternatively, the electron trap layer 902 is a layer in which an electron is to be trapped by a given means or processing. Depending on the formation method and formation conditions, such a state is not formed even when the electron trap layer 902 is formed of the same constituent elements.

Figure 5B:
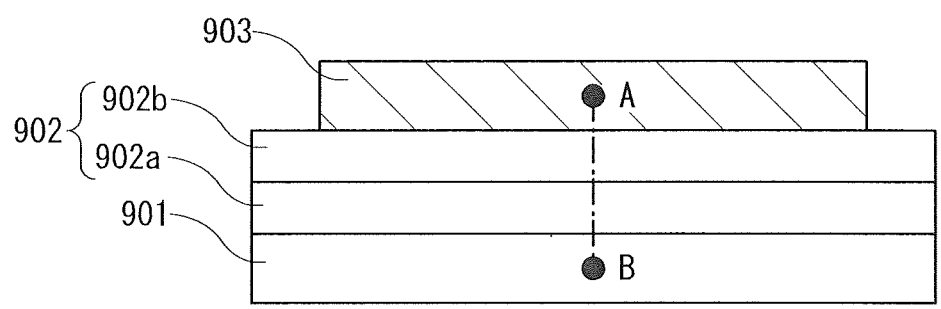
Figure 5C:
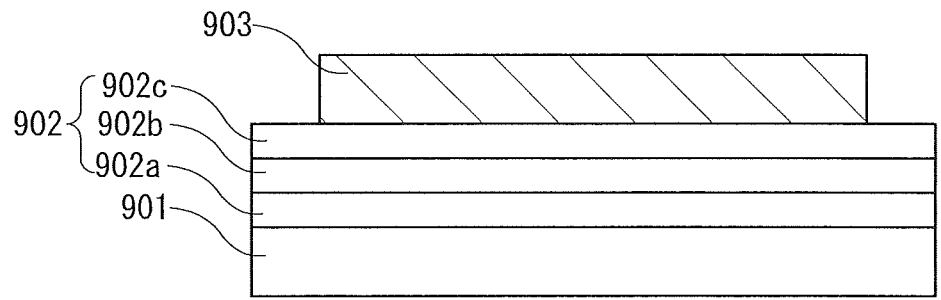

As the electron trap layer 902, for example, a stacked body of a first insulating film 902a and a second insulating film 902b as shown in FIG. 5B, a stacked body of the first insulating film 902a, the second insulating film 902b, and a third insulating film 902c as shown in FIG. 5C, or a stacked body of four or more layers may be used.

The constituent elements of the first to third insulating films may be all the same as each other or partly different from each other. The methods (conditions) for forming the first to third insulating films may be all the same as each other or partly different from each other.

For example, an insulating film formed by a sputtering method may be used as the second insulating film 902b and an insulating film formed by a chemical vapor deposition (CVD) method or an atomic layer deposition (ALD) method may be used as the first insulating film 902a. In FIG. 5C, the third insulating film 902c may be formed similarly to the first insulating film 902a. One embodiment of the present invention is not limited to this, and an insulating film formed by a CVD method or an ALD method may be used as the second insulating film 902b and an insulating film formed by a sputtering method may be used as the first insulating film 902a.

The insulating film formed by a CVD method can serve as a normal gate insulating film. Thus, leakage current between a gate and a drain or a source can be reduced. In contrast, the insulating layer formed by a sputtering method has a large number of electron trap states, and thus the threshold voltage of the transistor can be increased significantly. Accordingly, this structure enables small leakage current and appropriate threshold voltage adjustment.

Furthermore, the formation method of the semiconductor film 901 and the formation method of the first insulating film 902a that is in contact with the semiconductor film 901 may be the same for easy successive formation. For example, in the case of forming the semiconductor film 901 by a sputtering method, the first insulating film 902a may also be formed by a sputtering method and then the second insulating film 902b may be formed by a CVD method or an ALD method. In the case of FIG. 5C, the third insulating film 902c may also be formed by a sputtering method. Similarly, in the case of forming the semiconductor film 901 by a CVD method, the first insulating film 902a may also be formed by a CVD method and then the second insulating film 902b may be formed by a sputtering method. In the case of FIG. 5C, the third insulating film 902c may also be formed by a CVD method. These structures enable small leakage current, appropriate threshold voltage adjustment, and easy manufacturing. Note that one aspect of one embodiment of the present invention is not limited to these.

As the CVD method, various methods can be employed: a thermal CVD method, a photo CVD method, a plasma CVD method, an MOCVD method, an LPCVD method or the like can be used. Thus, insulating films may be formed by different CVD methods.

FIG. 6A illustrates a band diagram example of the semiconductor device illustrated in FIG. 5B, from point A to point B. In FIG. 6A, Ec and Ev denote the bottom of the conduction band and the top of the valence band, respectively. In FIG. 6A, the potential of the gate electrode 903 is equal to the potential of a source electrode or a drain electrode (not illustrated).

Note that the third insulating film 902c in FIG. 5C having a smaller electron affinity than the second insulating film 902b in the electron trap layer 902 is effective in holding an electron trapped by electron trap states in the second insulating film 902b or at the interface between the second insulating film 902b and another insulating film.

In this case, if the physical thickness of the third insulating film 902c is large enough, electrons trapped by electron trap states 904 can be held even when the second insulating film 902b has a small thickness.

The second insulating film 902b is formed by a formation method (or under formation conditions) that makes the density of electron trap states 904 higher. Consequently, a large number of electron trap states are formed at the interface between the first insulating film 902a and the second insulating film 902b and at the interface between the second insulating film 902b and the third insulating film 902c.

When the gate electrode 903 has the above-described potential and temperature, electrons 905 are transferred from the semiconductor film 901 toward the gate electrode 903, and are transferred to the electron trap layer 902 by Fowler-Nordheim tunnel effect, Poole-Frenkel conduction, and thermal excitation, or a combination of them. Some electrons 905 are trapped by the electron trap states 904, and the electron trap layer 902 is negatively charged (see FIG. 6B).

Figure 7A:
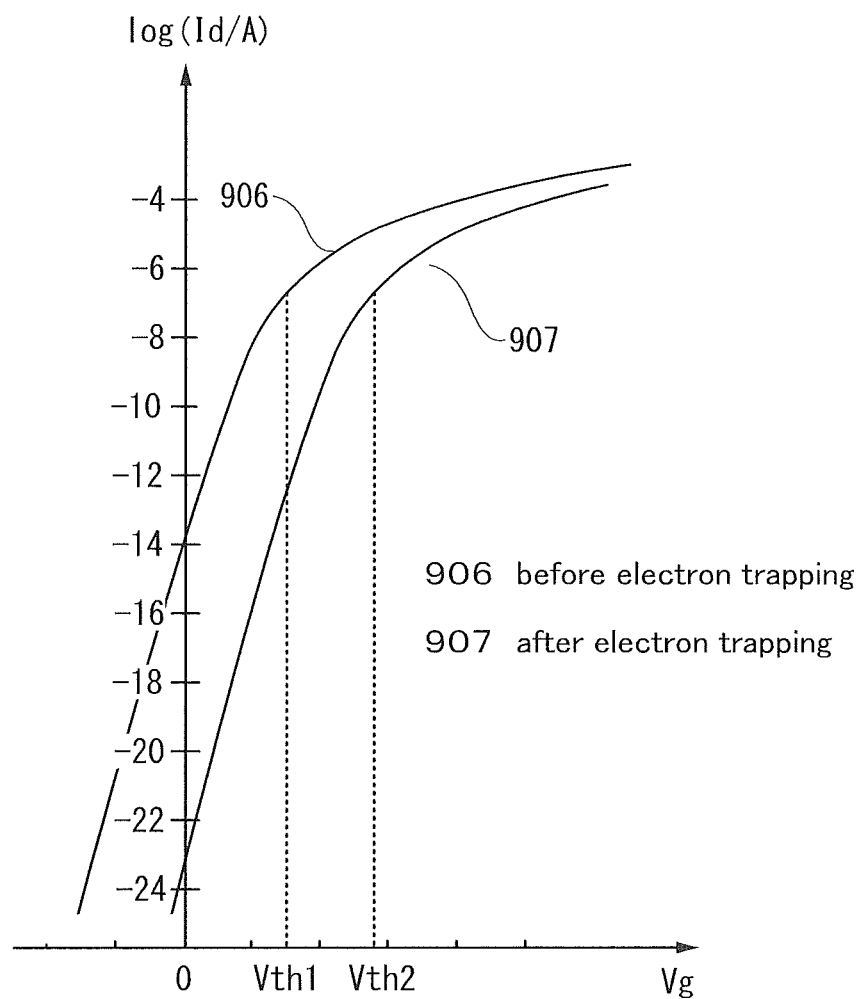
FIGS. 7A and 7B are views illustrating electrical characteristics of a transistor.

As described above, the threshold of the semiconductor device is increased by the trap of electrons in the electron trap layer 902 as illustrated in FIG. 7A. In particular, when the semiconductor film 901 is formed using a wide band gap material, a source-drain current (Icut) when the potential of the gate electrode 903 is equal to the potential of the source electrode can be significantly decreased.

For example, the Icut density (a current value per micrometer of a channel width) of an In—Ga—Zn-based oxide whose band gap is 3.2 eV is 1 zA/μm ($1 \times 10^{-21}$ A/μm) or less, typically 1 yA/μm ($1 \times 10^{-24}$ A/μm) or less.

FIG. 7A schematically shows dependence of current per micrometer of channel width (Id) between source and drain electrodes on the potential of the gate electrode 903 (Vg) at room temperature, before and after electron trap in the electron trap layer 902. Note that each potential of the source electrode and the gate electrode 903 is 0 V and the potential of the drain electrode is +1 V. Although current smaller than 1 fA cannot be measured directly, it can be estimated from a value measured by another method, the subthreshold value, and the like.

As indicated by a curve 906, the threshold of the semiconductor device is Vth1 at first. After electron trapping, as indicated by a curve 907, the threshold is increased (shifts in the positive direction) to become Vth2. As a result, the current density when Vg=0 becomes 1 aA/μm ($1\times10^{-18}$ A/μm) or less, for example, greater than or equal to 1 zA/μm and less than or equal to 1 yA/μm.

Figure 7B:
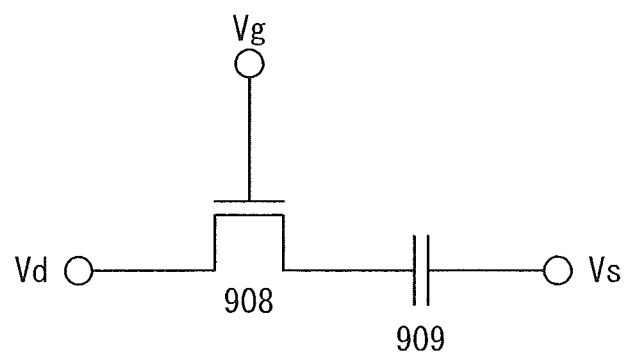

FIG. 7B illustrates a circuit in which charge stored in a capacitor 909 is controlled by a transistor 908. Leakage current between electrodes of the capacitor 909 is ignored. The capacitance of the capacitor 909 is 1 fF, the potential of the capacitor 909 on the transistor 908 side is +1 V, and the potential of Vd is 0 V.

The curve 906 in FIG. 7A denotes the Id-Vg characteristics of the transistor 908. When the channel width is 0.1 the Icut density is approximately 1 fA and the resistivity of the transistor 908 at this time is approximately $1\times10^{15}\Omega$. Accordingly, the time constant of a circuit composed of the transistor 908 and the capacitor 909 is approximately one second. This means that most of the charge stored in the capacitor 909 is lost in approximately one second.

The curve 907 in FIG. 7A denotes the Id-Vg characteristics of the transistor 908. When the channel width is 0.1 μm, the Icut density is approximately 1 yA and the resistivity of the transistor 908 at this time is approximately $1\times10^{24}\Omega$. Accordingly, the time constant of the circuit composed of the transistor 908 and the capacitor 909 is approximately $1\times10^{9}$ seconds (=approximately 31 years). This means that one-third of the charge stored in the capacitor 909 is left after 10 years.

From this, charge can be held for 10 years in a simple circuit composed of a transistor and a capacitor without application of a too high voltage.

A variety of materials can be used for the electron trap layer 902. For example, an insulating film containing one or more of hafnium oxide (oxygen, hafnium), aluminum oxide (oxygen, aluminum), tantalum oxide (oxygen, tantalum), aluminum silicate (oxygen, silicon, aluminum), and the like can be used. The electron trap layer 902 may contain elements such as nitrogen, silicon, hydrogen, or halogen. When the multi-layer electron trap layer 902 is formed, a layer containing silicon oxide, silicon oxynitride, silicon nitride oxide, silicon nitride, or the like may be provided over, below, or at the both sides of these layers containing the elements or at the interface between the layers.

As the semiconductor film 901, it is effective to use a material in which the effective mass of a hole is extremely large or is substantially localized like an intrinsic or substantially intrinsic oxide semiconductor. In this case, the injection of holes from the semiconductor film 901 to the electron trap layer 902 does not occur and consequently a phenomenon in which electrons trapped by the electron trap states 904 bond to holes and disappear does not occur. Thus, the charge retention characteristics can be improved.

The gate electrode 105 may be formed of a single layer or a stack of a conductive film containing aluminum, titanium, chromium, cobalt, nickel, copper, yttrium, zirconium, molybdenum, ruthenium, silver, tantalum, or tungsten.

The protective insulating film 106 is formed of a single layer or a stack of an insulating film containing silicon oxide, silicon oxynitride, germanium oxide, yttrium oxide, zirconium oxide, lanthanum oxide, neodymium oxide, hafnium oxide, tantalum oxide, silicon nitride, silicon nitride oxide, or aluminum oxide. The thickness of the insulating film 106 is, for example, greater than or equal to 20 nm and less than or equal to 1000 nm, preferably greater than or equal to 50 nm and less than or equal to 1000 nm, more preferably greater than or equal to 100 nm and less than or equal to 1000 nm, still more preferably greater than or equal to 200 nm and less than or equal to 1000 nm.

For example, as the insulating film 106, a stacked-layer film in which aluminum oxide is used for the first layer and silicon oxide is used for the second layer may be used. Alternatively, as the insulating film 106, a stacked-layer film in which silicon nitride is used for the first layer and silicon oxide is used for the second layer may be used. Further alternatively, as the insulating film 106, a stacked-layer film in which silicon nitride oxide is used for the first layer may be used. With use of aluminum oxide, silicon nitride, or silicon nitride oxide having a low oxygen-transmitting property as the first layer, oxygen diffusion from the insulating film 121 can be prevented.

The source electrode 107a and the drain electrode 107b may be formed using, for example, a single layer or a stack of a conductive film containing aluminum, titanium, chromium, cobalt, nickel, copper, yttrium, zirconium, molybdenum, ruthenium, silver, tantalum, or tungsten.

There is no significant limitation on the substrate 101. For example, a glass substrate, a ceramic substrate, a quartz substrate, or a sapphire substrate may be used as the substrate 101. Alternatively, a single crystal semiconductor substrate or a polycrystalline semiconductor substrate of silicon, silicon carbide, or the like, a compound semiconductor substrate of silicon germanium or the like, a silicon-on-insulator (SOI) substrate, or the like may be used as the substrate 101. Still alternatively, any of these substrates provided with a semiconductor element may be used as the substrate 101.

A flexible substrate may be used as the substrate 101. As a method for providing a transistor over a flexible substrate, there is a method in which a transistor is formed over a non-flexible substrate, and then the transistor is separated and transferred to the substrate 101 that is a flexible substrate. In that case, a separation layer is preferably provided between the non-flexible substrate and the transistor.

<Fabricating Method of Transistor Structure 1>

An example of a method for fabricating a transistor structure 1 is described below.

FIGS. 8A to 8D, FIGS. 9A to 9C, and FIGS. 10A to 10C are cross-sectional views illustrating a method for manufacturing the transistor illustrated in FIGS. 3B and 3C.

First, the substrate 101 is prepared.

Next, the base insulating film 102 is formed. The base insulating film 102 can be formed using any of the insulating films given as examples of the base insulating film 102, by a sputtering method, a CVD method, a molecular beam epitaxy (MBE) method, an ALD method, or a pulsed laser deposition (PLD) method.

In the case where a silicon wafer is used as the substrate 101, the base insulating film 102 may be formed by a thermal oxidation method.

Next, an insulating film 135 is formed. The insulating film 135 is an insulating film containing excess oxygen. The insulating film 135 may be formed using any of the insulating films described as examples of the insulating film 121. The insulating film 135 may be formed by a sputtering method, a CVD method, a molecular beam epitaxy (MBE) method, an ALD method, or a PLD method.

Then, in order to planarize the surface of the insulating film 135, chemical mechanical polishing (CMP) treatment may be performed. By CMP treatment, the base insulating film 102 has an average surface roughness ($R_a$) of less than 1 nm, preferably less than or equal to 0.3 nm, more preferably less than or equal to 0.1 mm In some cases, $R_a$ that is less than or equal to 1 nm can increase the crystallinity of the oxide semiconductor film 103. $R_a$ can be measured using an atomic force microscope (AFM).

Then, oxygen ions may be added into the insulating film 135 so that an insulating film containing excess oxygen can be formed. The addition of oxygen ions can be performed by an ion implantation method at an acceleration voltage of higher than or equal to 2 kV and lower than or equal to 100 kV and at a concentration of greater than or equal to $5\times10^{14}$ ions/cm$^2$ and less than or equal to $5\times10^{16}$ ions/cm$^2$, for example.

Then, an oxide semiconductor film 136 is formed (see FIG. 8A). The oxide semiconductor film 136 can be formed using an oxide semiconductor film selected from the oxide semiconductor films given as examples of the oxide semiconductor film 103 by a sputtering method, a CVD method, an MBE method, an ALD method, or a PLD method.

Next, first heat treatment is preferably performed. The first heat treatment is performed at a temperature higher than or equal to 250° C. and lower than or equal to 650° C., preferably higher than or equal to 300° C. and lower than or equal to 500° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate released oxygen.

Next, a layer to be a resist mask 131 is formed over the oxide semiconductor film 136. Note that when the oxide semiconductor film 136 is finely processed so that the length of one side thereof is 100 nm or less, a hard mask may be provided between the oxide semiconductor film 136 and the layer to be the resist mask 131.

Note that the hard mask is a layer to etch the oxide semiconductor film 136 selectively. The hard mask may be formed of a single layer or a stack of a simple substance selected from tungsten, molybdenum, titanium, and tantalum; a nitride containing any of the above substances; or an alloy containing any of the above substances. Alternatively, the hard mask may be formed of a single layer or a stack of an insulating film containing silicon oxide, silicon oxynitride, or silicon nitride.

Note that one embodiment of the present invention is not limited to the case where a layer to be the resist mask 131 is formed over the hard mask. For example, a coat layer or the like may be formed using an organic substance over the hard mask in order to increase the adhesion between the hard mask and the layer to be the resist mask 131.

The layer to be the resist mask 131 can be formed using a photosensitive organic or inorganic layer by a spin coating method or the like.

Next, the layer to be the resist mask 131 is irradiated with light through a photomask. Examples of the light include KrF excimer laser light, ArF excimer laser light, and extreme ultraviolet (EUV) light. Immersion lithography in which a space between a substrate and a projection lens is filled with liquid (e.g., water) and light exposure is performed may be employed. The layer to be the resist mask 131 may be irradiated with an electron beam or an ion beam instead of the above light. Note that when an electron beam or an ion beam is used, a photomask is unnecessary. In the case where fine processing is not particularly required, the layer to be the resist mask 131 may be irradiated with a g-line, an i-line, or the like of a high pressure mercury lamp.

Then, the substrate 101 is immersed in a developer to remove/leave a region of the layer to be the resist mask 131 that has been exposed to light, so that the resist mask 131 is formed (see FIG. 8B).

After that, the oxide semiconductor film 136 is partly etched using the resist mask 131 to form the island-shaped oxide semiconductor film 103. The insulating film 135 is partly etched using the resist mask 131 to form the island-shaped insulating film 121 (see FIG. 8C).

Although the island-shaped insulating film 121 is formed in FIG. 8C, the insulating film 121 is not necessarily patterned into an island shape and may have a projecting portion.

Dry etching treatment is preferably employed as a method for etching part of the oxide semiconductor film 136. The dry etching treatment can be performed in an atmosphere containing methane and a rare gas. Partial etching of the insulating film 121 can be performed in an atmosphere containing trifluoromethane and a rare gas, for example.

Figure 19A:
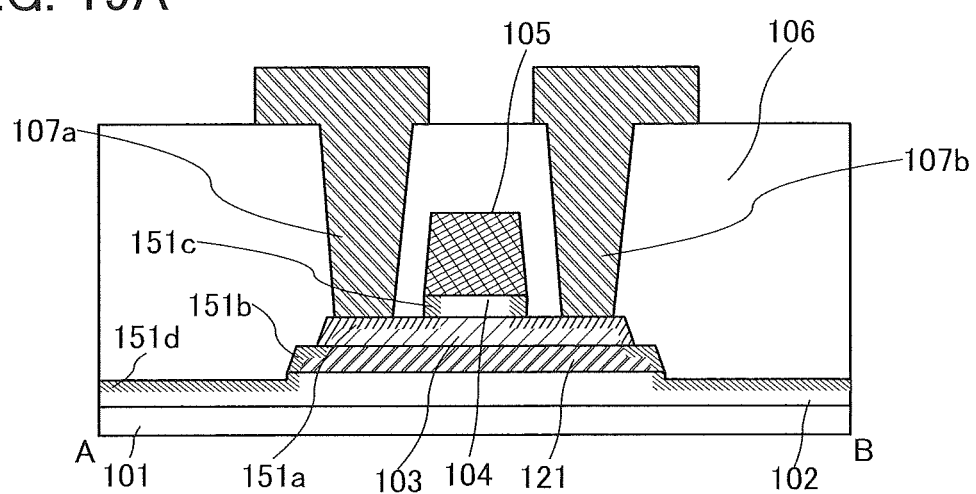
FIGS. 19A and 19B are cross-sectional views each illustrating an example of a semiconductor device of one embodiment of the present invention.
Figure 19B:
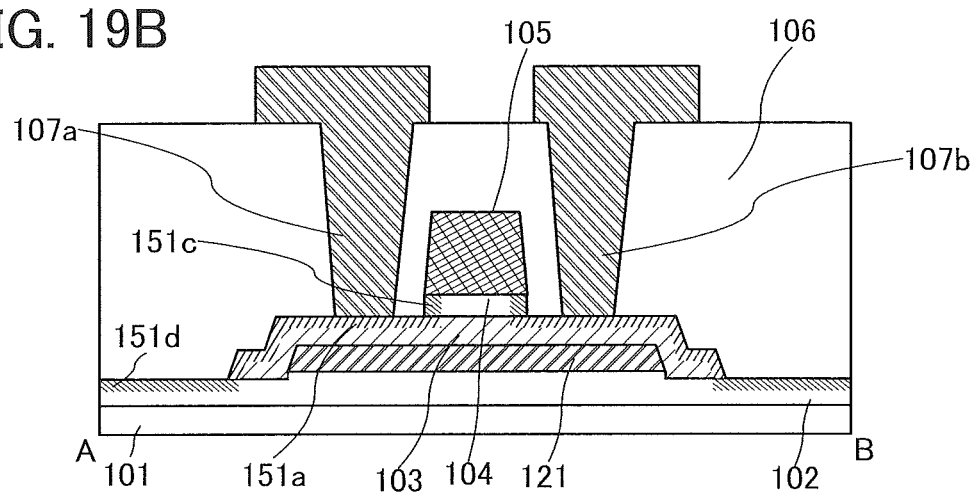

Although the oxide semiconductor film 136 and the insulating film 135 are etched using the resist mask 131 here, the oxide semiconductor film 136 and the insulating film 135 may be etched using different resist masks. Although the insulating film 121 has almost the same width as the oxide semiconductor film 103 in the cross-sectional view of FIG. 3B, the insulating film 121 may have a wider width than the oxide semiconductor film 103 as illustrated in FIG. 19A. Alternatively, the insulating film 121 may have a smaller width than the oxide semiconductor film 103 as illustrated in FIG. 19B. The insulating film 121 can be covered with the oxide semiconductor film 103 in a cross section of FIG. 19B; thus, oxygen diffusion from the insulating film 121 through the insulating film 106 can be prevented.

Then, the resist mask 131 is removed. The resist mask 131 may be removed by plasma treatment, chemical liquid treatment, or the like. Preferably, the resist mask 131 is removed by plasma ashing.

Next, the gate insulating film 104 is formed. A conductive film to be the gate electrode 105 is formed successively after the gate insulating film 104 (see FIG. 8D).

The gate insulating film 104 may be formed using any of the insulating films given as examples of the insulating film 104. The gate insulating film 104 may be formed by a sputtering method, a CVD method, an MBE method, an ALD method, or a PLD method. The conductive film to be the gate electrode 105 can be formed using any of the conductive films given as examples of the gate electrode 105 by a sputtering method, a CVD method, an MBE method, an ALD method, or a PLD method.

Then, the conductive film is processed by a photolithography method or the like, so that the gate electrode 105 is formed. Next, the gate insulating film 104 is partly etched using the gate electrode as a mask (see FIG. 9A).

After that, to form the regions 151a, 151b, 151c, and 151d, impurities are added to the gate insulating film 104, the oxide semiconductor film 103, the insulating film 121, and the base insulating film 102 using the gate electrode 105 as a mask (see FIG. 9B). For forming the regions 151a, 151b, 151c, and 151d by impurity addition, the description of the method for forming the region 53 by adding impurities to the insulating film 52 is referred to. The impurities described in the method for forming the region 53 are unlikely to increase the resistance of a metal. In other words, even in the case where the impurities are added using the gate electrode 105 as a mask to form the regions 151a to 151d, the impurities are unlikely to increase the resistance of the gate electrode 105, for example. The regions 151b, 151c, and 151*d* are oxygen blocking regions. The region 151*a* is part of the oxide semiconductor film 103 to which impurities are added.

By the existence of the regions 151*b*, 151*c*, and 151*d* serving as oxygen blocking regions, outward diffusion of excess oxygen of the insulating film 121 can be suppressed, and oxygen can be supplied to the oxide semiconductor film 103 efficiently.

The resistance of a region from the oxide semiconductor film 103 in contact with the source electrode 107*a* or the drain electrode 107*b* to a channel formation region can be lowered by adding impurities to the region 151*a*, which is part of the oxide semiconductor film 103. Accordingly, the on-state current can be increased, so that the performance of the transistor can be improved.

Next, second heat treatment is preferably performed. The second heat treatment is performed at a temperature higher than or equal to 250° C. and lower than or equal to 650° C., preferably higher than or equal to 300° C. and lower than or equal to 500° C. The second heat treatment is performed in an inert gas atmosphere or an atmosphere containing an oxidizing gas at 10 ppm or more, 1% or more, or 10% or more. The second heat treatment may be performed under a reduced pressure. Alternatively, the second heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate released oxygen. By the second heat treatment, the resistance of the region 151*a* that is a region of the oxide semiconductor film 103 to which impurities are added can be lowered in some cases. Excess oxygen can move from the insulating film 121 to the oxide semiconductor film 103. This can reduce oxygen vacancies in the oxide semiconductor film 103. Furthermore, the crystallinity of the oxide semiconductor film 103 can be improved, and impurities such as hydrogen and water can be removed. In addition, the second heat treatment can also serve as the first heat treatment.

After that, the insulating film 106 is formed (see FIG. 9C). The insulating film 106 can be formed using any of the insulating films described as examples of the insulating film 106 by a sputtering method, a CVD method, an MBE method, an ALD method, or a PLD method.

Next, openings are formed in the insulating film 106 (see FIG. 10A). As a method for etching part of the insulating film 106, dry etching or the like can be used.

Then, a conductive film 107 to be the source electrode 107*a* and the drain electrode 107*b* is formed over the top surface of the insulating film 106 and in the openings (see FIG. 10B). The conductive film 107 can be formed using any of the conductive films given as examples of the source electrode 107*a* and the drain electrode 107*b* by a sputtering method, a CVD method, an MBE method, an ALD method, or a PLD method.

Then, the conductive film is processed by a photolithography method or the like, so that the source electrode 107*a* and the drain electrode 107*b* are formed (see FIG. 10C).

Next, third heat treatment is preferably performed. The third heat treatment may be performed under any of the conditions listed for the first and second heat treatment or may be performed at temperature lower than the temperatures for the first and second heat treatment. In addition, the third treatment can serve also as the first and second heat treatment.

Through the above steps, the transistor illustrated in FIGS. 3A to 3C can be manufactured.

<Transistor Structure 2>

Next, a self-aligned top-gate transistor different from the transistor structure 1 in the shape of a gate insulating film is described as an example.

Figure 11A:
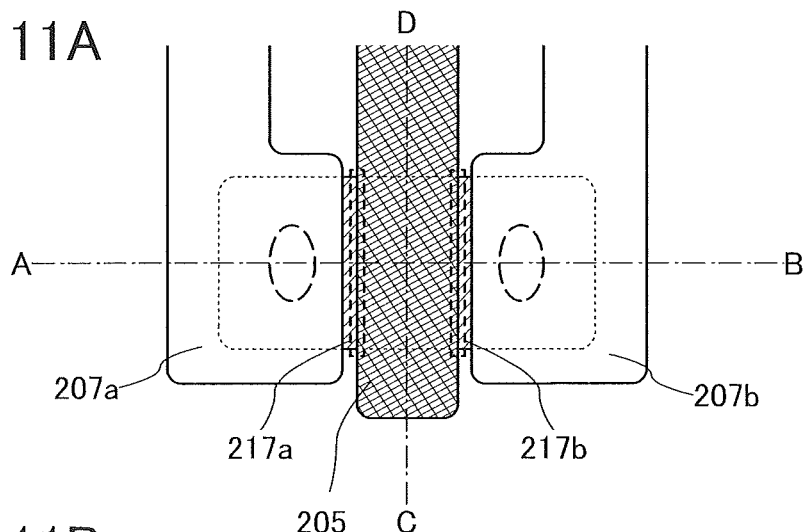
FIGS. 11A to 11C are a top view and cross-sectional views illustrating an example of a semiconductor device according to one embodiment of the present invention.
Figure 11B:
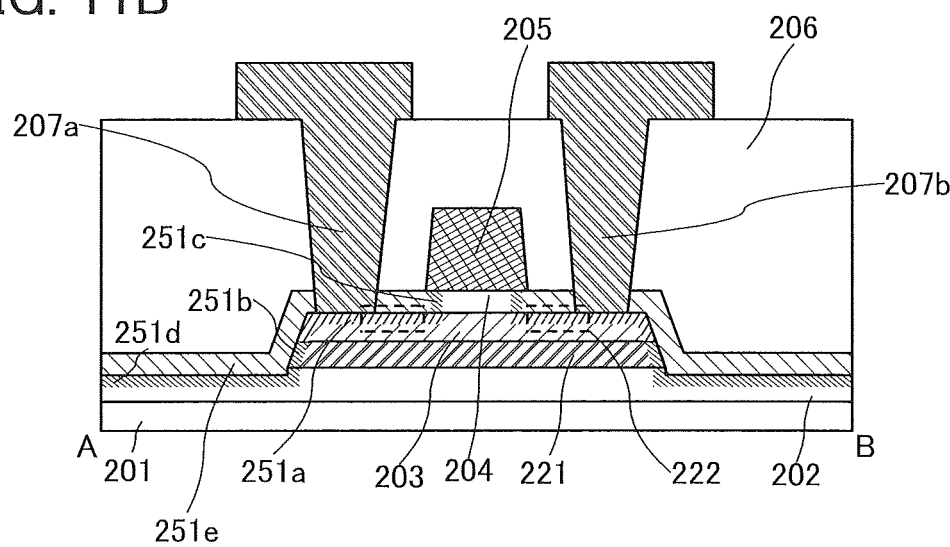
Figure 11C:
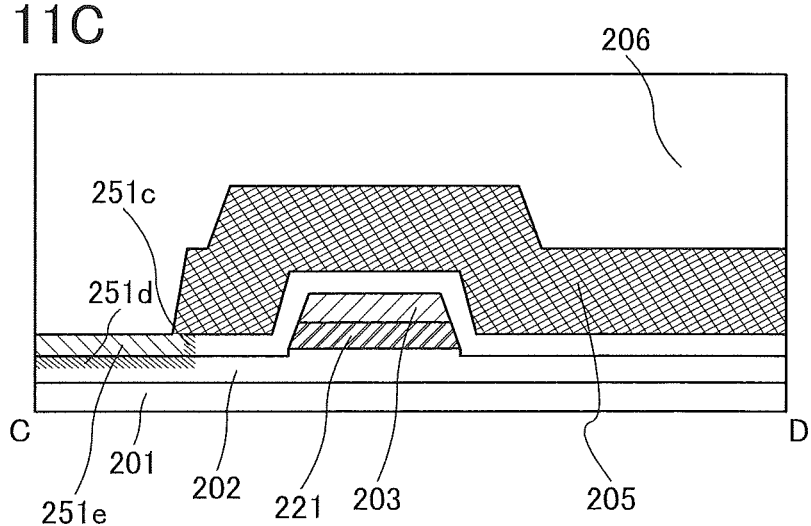

FIGS. 11A to 11C are a top view and cross-sectional views of the transistor. FIG. 11A is the top view of the transistor. FIG. 11B is a cross-sectional view taken along dashed-dotted line A-B in FIG. 11A. FIG. 11C is a cross-sectional view taken along dashed-dotted line C-D in FIG. 11A.

The transistor in FIG. 11B includes a base insulating film 202 over a substrate 201; an insulating film 221 over the base insulating film 202; an oxide semiconductor film 203 over the insulating film 221; a gate insulating film 204 over the oxide semiconductor film 203; a gate electrode 205 over the gate insulating film 204; an insulating film 206 over the gate electrode 205 and the gate insulating film 204; and a source electrode 207*a* and a drain electrode 207*b* over the oxide semiconductor film 203 and the insulating film 206. The insulating film 221 contains excess oxygen. Note that the transistor does not necessarily include the base insulating film 202.

The transistor illustrated in FIGS. 11A to 11C differs from the transistor illustrated in FIGS. 3A to 3C only in the shape of the gate insulating film; thus, the description about FIGS. 3A to 3C is referred to unless otherwise noted.

For example, the description of the substrate 101 can be referred to for the substrate 201. The description of the base insulating film 102 can be referred to for the base insulating film 202. The description of the insulating film 121 can be referred to for the insulating film 221. The description of the oxide semiconductor film 103 can be referred to for the oxide semiconductor film 203. The description of the gate insulating film 104 can be referred to for the gate insulating film 204. The description of the gate electrode 105 can be referred to for the gate electrode 205. The description of the insulating film 106 can be referred to for the insulating film 206. The description of the source electrode 107*a* and the drain electrode 107*b* can be referred to for the source electrode 207*a* and the drain electrode 207*b*.

In FIG. 11B, a region 251*a* is part of the oxide semiconductor film. Regions 251*b*, 251*c*, 251*d*, and 251*e* are parts of the insulating films and serve as oxygen blocking regions. For the oxygen blocking region, the above description of the region 53 is referred to. The transistor in FIG. 11B includes one or more of the regions 251*b*, 251*c*, 251*d*, and 251*e* serving as oxygen blocking regions.

First, the regions 251*b*, 251*c*, 251*d*, and 251*e* serving as oxygen blocking regions are described.

The region 251*b* is in the insulating film 221 and in contact with the gate insulating film 204. The region 251*b* is provided at a depth from 1 nm to 200 nm inclusive, preferably from 5 nm to 150 nm inclusive, more preferably from 10 nm to 100 nm inclusive from a surface of the insulating film 221 in contact with the gate insulating film 204.

The region 251*c* is provided in the gate insulating film 204 in FIGS. 11B and 11C. The region 251*c* is positioned in a region of the gate insulating film 204 below the gate electrode. FIG. 11A illustrates an end 217*a* of the gate electrode 205 facing the source electrode 207*a* and an end 217*b* of the gate electrode 205 facing the drain electrode 207*b*. The distance between the region 251*c* and the end 217*a* or 217*b* is greater than or equal to 1 nm and less than or equal to 2 µm, preferably greater than or equal to 5 nm and less than or equal to 1 µm, more preferably greater than or equal to 10 nm and less than or equal to 500 nm.

The region 251d is in the base insulating film 202 and in contact with the gate insulating film 204 as illustrated in FIG. 11B. The region 251d is provided from 1 nm to 200 nm inclusive, preferably 5 nm to 150 nm inclusive, more preferably from 10 nm to 100 nm inclusive from a surface of the base insulating film 202 in contact with the gate insulating film 204.

The region 251e is a region of the gate insulating film 204 and is in contact with the insulating film 206. Note that the region 251e may be provided so as to extend from the top surface of the gate insulating film 204 to the bottom surface thereof as illustrated in FIG. 11B.

In the case where the transistor includes the region 251b, excess oxygen contained in the insulating film 221 can be efficiently utilized to reduce oxygen vacancies in the oxide semiconductor film 203. For example, in the case where the transistor does not include the region 251b, excess oxygen contained in the insulating film 221 is lost by outward diffusion in some cases. Moreover, excess oxygen contained in the insulating film 221 can oxidize the source electrode 207a and the drain electrode 207b.

Also in the case where the transistor includes the region 251d, excess oxygen contained in the insulating film 221 or the base insulating film 202 can be efficiently utilized to reduce oxygen vacancies in the oxide semiconductor film 203. For example, in the case where the transistor does not include the region 251d, excess oxygen contained in the insulating film 221 or the base insulating film 202 is lost by outward diffusion in some cases. Moreover, in the case where the transistor does not include the region 251d, excess oxygen contained in the insulating film 221 or the base insulating film 202 can oxidize the source electrode 207a and the drain electrode 207b.

Also in the case where the transistor includes the region 251c, excess oxygen contained in the gate insulating film 204 can be efficiently utilized to reduce oxygen vacancies in the oxide semiconductor film 203. For example, in the case where the transistor does not include the region 251c, excess oxygen contained in the gate insulating film 204 is lost by outward diffusion in some cases. Moreover, excess oxygen contained in the gate insulating film 204 can oxidize the source electrode 207a and the drain electrode 207b.

Also in the case where the transistor includes the region 251e, excess oxygen contained in the insulating film 221, the base insulating film 202, or the gate insulating film 204 can be efficiently utilized to reduce oxygen vacancies in the oxide semiconductor film 203. For example, in the case where the transistor does not include the region 251e, excess oxygen contained in the insulating film 221, the base insulating film 202, or the gate insulating film 204 is lost by outward diffusion in some cases. Moreover, excess oxygen contained in the insulating film 221, the base insulating film 202, or the gate insulating film 204 can oxidize the source electrode 207a and the drain electrode 207b.

Next, the region 251a that is part of the oxide semiconductor film 203 is described.

The region 251a is in the oxide semiconductor film 203 and in contact with the source electrode 207a, the drain electrode 207b, and the gate insulating film 204. The region 251a is provided from 1 nm to 200 nm inclusive, preferably 5 nm to 150 nm inclusive, more preferably from 10 μm to 100 nm inclusive from the top or side surface of the oxide semiconductor film 203.

At the step of adding impurities to form the regions 251b, 251c, 251d, and 251e serving as oxygen blocking regions, impurities are added also to the region 251a. At that time, the resistance of the region 251a can be lowered by the impurity addition.

A region 222 illustrated in FIG. 11B is not in contact with the source electrode 207a or the drain electrode 207b, and does not overlap with the gate electrode 205. When the resistance of the region 222 is high, the on-state current of the transistor is reduced.

The resistance of the region 222 can be lowered by adding impurities to the region 251a, which is part of the oxide semiconductor film 203. Accordingly, the on-state current can be increased, and the performance of the transistor can be improved.

Note that the step for adding impurities to four the low resistance region can also serve as the step for adding impurities to form the regions 251b, 251c, 251d, and 251e serving as oxygen blocking regions. Thus, manufacturing process can be shortened, which leads to cost reduction. Moreover, an improved yield can be expected by the simplified manufacturing process.

<Fabricating Method of Transistor Structure 2>

An example of a method for fabricating a transistor structure 2 is described below.

FIGS. 12A to 12C, FIGS. 13A to 13C, and FIGS. 14A to 14C are cross-sectional views illustrating a method for manufacturing the transistor illustrated in FIGS. 11B and 11C.

First, the substrate 201 is prepared.

Then, the base insulating film 202 is formed. The description of the method for forming the base insulating film 102 can be referred to for the base insulating film 202.

Next, an insulating film 235 is formed. The insulating film 235 contains excess oxygen. For the base insulating film 235, the description of the method for forming the insulating film 135 is referred to.

Then, oxygen ions may be added into the insulating film 235 so that an insulating film containing excess oxygen can be formed. The addition of oxygen ions can be performed by an ion implantation method at an acceleration voltage of higher than or equal to 2 kV and lower than or equal to 100 kV and at a concentration of greater than or equal to $5 \times 10^{14}$ ions/cm$^2$ and less than or equal to $5 \times 10^{16}$ ions/cm$^2$, for example.

Then, an oxide semiconductor film 236 is formed (see FIG. 12A). The oxide semiconductor film 236 can be formed using an oxide semiconductor film selected from the oxide semiconductor films given as examples of the oxide semiconductor film 103 by a sputtering method, a CVD method, an MBE method, an ALD method, or a PLD method.

Next, first heat treatment is preferably performed. The first heat treatment is performed at a temperature higher than or equal to 250° C. and lower than or equal to 650° C., preferably higher than or equal to 300° C. and lower than or equal to 500° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate released oxygen.

Then, parts of the oxide semiconductor film 236 and the insulating film 235 are etched to form the oxide semiconductor film 203 and the insulating film 221 (see FIG. 12B). For forming the oxide semiconductor film 203 and the insulating film 221, the method for forming the oxide semiconductor film 103 and the insulating film 121 in FIGS. 8A to 8D can be referred to.

Although the island-shaped insulating film 221 is formed in FIG. 12B, the insulating film 221 is not necessarily patterned into an island shape and may have a projecting portion.

Next, the gate insulating film 204 is formed. A conductive film to be the gate electrode 205 is formed successively after the gate insulating film 204 (see FIG. 12C).

The description of the method for forming the gate insulating film 104 can be referred to for the gate insulating film 204. The description of the method for forming the gate electrode 105 can be referred to for the gate electrode 205.

Then, the conductive film is processed by a photolithography method or the like, so that the gate electrode 205 is formed (see FIG. 13A). Unlike the transistor structure 1, the gate insulating film 204 is left.

After that, impurities are added to the gate insulating film 204, the oxide semiconductor film 203, the insulating film 221, and the base insulating film 202 using the gate electrode 205 as a mask to form the regions 251a, 251b, 251c, 251d, and 251e (see FIG. 13B). For forming the regions 251a, 251b, 251c, 251d, and 251e by impurity addition, the description of the method for forming the region 53 by adding impurities to the insulating film 52 is referred to. The regions 251b, 251c, 251d, and 251e are oxygen blocking regions. The region 251a is part of the oxide semiconductor film 203 to which impurities are added. In the case where impurities are added by an ion doping method or an ion implantation method, impurities are added to the regions 251a, 251b, and 251d through the gate insulating film 204. Thus, the acceleration voltage is preferably adjusted depending on the thickness of the gate insulating film 204. For example, in the case where the thickness of the gate insulating film 204 is 20 nm, the acceleration voltage for the ion doping method or the ion implantation method is higher than or equal to 0.5 kV and lower than or equal to 100 kV, preferably higher than or equal to 1 kV and lower than or equal to 50 kV, more preferably higher than or equal to 5 kV and lower than or equal to 50 kV.

By the existence of the regions 251b, 251c, 251d, and 251e serving as oxygen blocking regions, outward diffusion of excess oxygen of the insulating film 121 can be suppressed, and oxygen can be supplied to the oxide semiconductor film 103 efficiently.

The resistance of a region from the oxide semiconductor film 103 in contact with the source electrode 107a or the drain electrode 107b to a channel formation region can be lowered by adding impurities to the region 251a, which is part of the oxide semiconductor film 103. Accordingly, the on-state current can be increased, so that the performance of the transistor can be improved.

Next, second heat treatment is preferably performed. The second heat treatment is performed at a temperature higher than or equal to 250° C. and lower than or equal to 650° C., preferably higher than or equal to 300° C. and lower than or equal to 500° C. The second heat treatment is performed in an inert gas atmosphere or an atmosphere containing an oxidizing gas at 10 ppm or more, 1% or more, or 10% or more. The second heat treatment may be performed under a reduced pressure. Alternatively, the second heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate released oxygen. By the second heat treatment, the resistance of the region 251a that is a region of the oxide semiconductor film 203 to which impurities are added can be lowered in some cases. Excess oxygen can move from the insulating film 221 to the oxide semiconductor film 203. This can reduce oxygen vacancies in the oxide semiconductor film 203. Furthermore, the crystallinity of the oxide semiconductor film 203 can be improved, and impurities such as hydrogen and water can be removed. In addition, the second heat treatment can also serve as the first heat treatment.

Next, the insulating film 206 is formed (see FIG. 13C). Description of the insulating film 106 is referred to for the insulating film 206.

Then, part of the insulating film 206 is etched to form openings (see FIG. 14A). As a method for etching part of the insulating film 206, dry etching or the like can be used.

Then, a conductive film 207 to be the source electrode 207a and the drain electrode 207b is formed over the top surface of the insulating film 206 and in the openings (see FIG. 14B). For the conductive film 207, the method for forming the source electrode 107a and the drain electrode 107b is referred to.

Then, the conductive film is processed by a photolithography method or the like, so that the source electrode 207a and the drain electrode 207b are formed (see FIG. 14C).

Next, third heat treatment is preferably performed. The third heat treatment may be performed under any of the conditions listed for the first and second heat treatment or may be performed at temperature lower than the temperatures for the first and second heat treatment. In addition, the third treatment can serve also as the first and second heat treatment.

Through the above steps, the transistor illustrated in FIGS. 11A to 11C can be manufactured.

<Transistor Structure 3>

Next, a self-aligned top-gate transistor in which a sidewall insulating film is formed on the side wall of a gate electrode is described as an example.

Figure 26A:
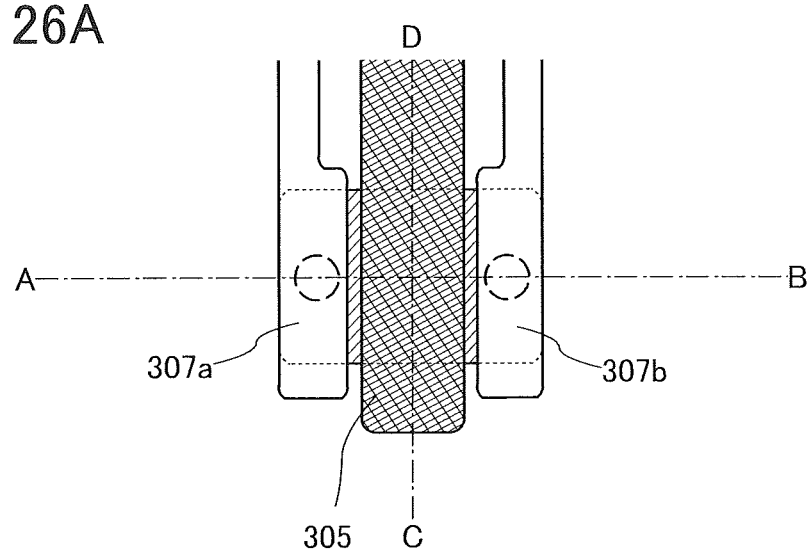
FIGS. 26A to 26C are a top view and cross-sectional views illustrating an example of a semiconductor device according to one embodiment of the present invention.
Figure 26B:
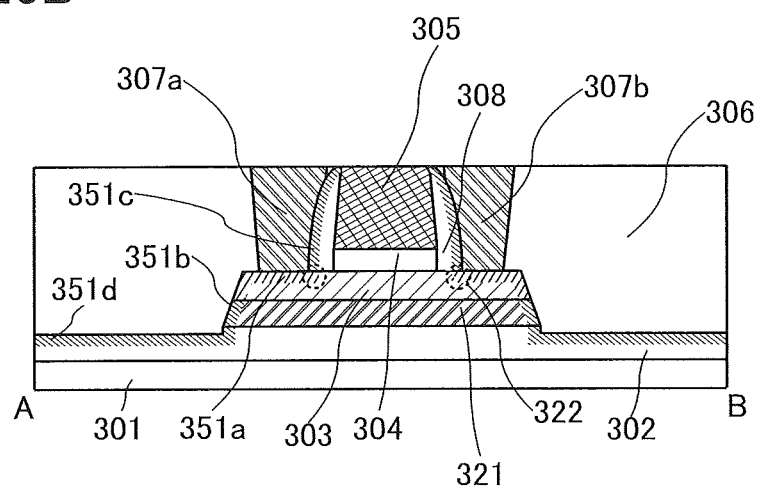
Figure 26C:
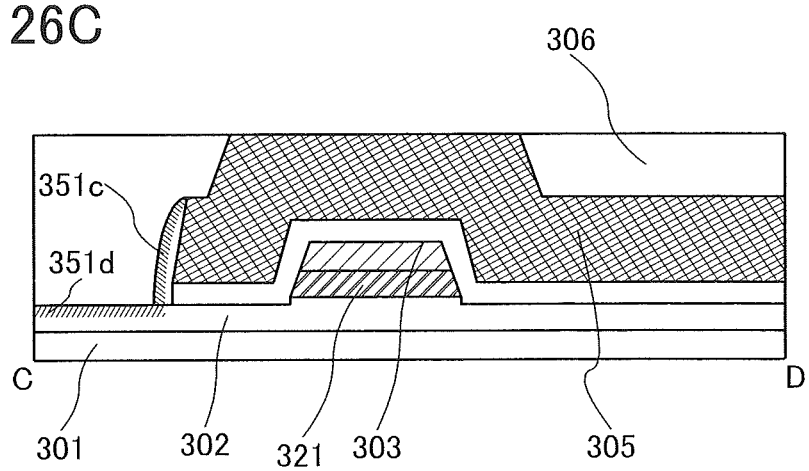

FIGS. 26A to 26C are a top view and cross-sectional views of the transistor. FIG. 26A is the top view of the transistor. FIG. 26B is a cross-sectional view taken along dashed-dotted line A-B in FIG. 26A. FIG. 26C is a cross-sectional view taken along dashed-dotted line C-D in FIG. 26A.

The transistor in FIG. 26B includes a base insulating film 302 over a substrate 301; an insulating film 321 over the base insulating film 302; an oxide semiconductor film 303 over the insulating film 321; a gate insulating film 304 over the oxide semiconductor film 303; a gate electrode 305 over the gate insulating film 304; a sidewall insulating film 308 on a side wall of the gate electrode 305; an insulating film 306 in contact with the oxide semiconductor film 303, the base insulating film 302, and the sidewall insulating film 308; and a source electrode 307a and a drain electrode 307b over the oxide semiconductor film 303. The insulating film 321 contains excess oxygen. Note that the transistor does not necessarily include the base insulating film 302.

A difference between the transistor illustrated in FIGS. 26A to 26C and the transistor illustrated in FIGS. 3A to 3C is that the transistor in FIGS. 26A to 26C includes the sidewall insulating film. For other common portions, the description for the transistor in FIGS. 3A to 3C is referred to unless otherwise noted.

For example, the description of the substrate 101 can be referred to for the substrate 301. The description of the base insulating film 102 can be referred to for the base insulating film 302. The description of the insulating film 121 can be referred to for the base insulating film 321. The description of the oxide semiconductor film 103 can be referred to for the oxide semiconductor film 303. The description of the gate insulating film 104 can be referred to for the gate insulating film 304. The description of the gate electrode 105 can be referred to for the gate electrode 305. The description of the insulating film 106 can be referred to for the insulating film 306. The description of the source electrode 107a and the drain electrode 107b can be referred to for the source electrode 307a and the drain electrode 307b.

In FIG. 26B, a region 351a is part of the oxide semiconductor film. Regions 351b, 351c, and 351d are parts of the insulating films and serve as oxygen blocking regions. For the oxygen blocking region, the above description of the region 53 is referred to. The transistor in FIG. 26B includes one or more of the regions 351b, 351c, and 351d serving as oxygen blocking regions.

First, the regions 351b, 351c, and 351d serving as oxygen blocking regions are described. The region 351b is in the insulating film 321 and in contact with the insulating film 306. The region 351b is provided at a depth from 1 nm to 200 nm inclusive, preferably from 5 nm to 150 nm inclusive, more preferably from 10 nm to 100 nm inclusive from a surface of the insulating film 321 in contact with the insulating film 306.

The region 351c is in the sidewall insulating film 308 and in contact with the source electrode 307a, the drain electrode 307b, or the insulating film 306 as illustrated in FIGS. 26B and 26C. The region 351c is provided at a depth from 1 nm to 200 nm inclusive, preferably from 5 nm to 150 nm inclusive, more preferably from 10 nm to 100 nm inclusive from a surface of the insulating film 308 in contact with the source electrode 307a, the drain electrode 307b, or the insulating film 306.

The region 351d is in the base insulating film 302 and in contact with the insulating film 306 as illustrated in FIG. 26B. The region 351d is provided at a depth from 1 nm to 200 nm inclusive, preferably from 5 nm to 150 nm inclusive, more preferably from 10 nm to 100 nm inclusive from the top surface of the base insulating film 302. The region 351d may also be provided in the substrate 301.

In the case where the transistor includes the region 351b, excess oxygen contained in the insulating film 321 can be efficiently utilized to reduce oxygen vacancies in the oxide semiconductor film 303. For example, in the case where the transistor does not include the region 351b, excess oxygen contained in the insulating film 321 is lost by outward diffusion in some cases. Moreover, excess oxygen contained in the insulating film 321 can oxidize the source electrode 307a and the drain electrode 307b.

Also in the case where the transistor includes the region 351d, excess oxygen contained in the insulating film 321 or the base insulating film 302 can be efficiently utilized to reduce oxygen vacancies in the oxide semiconductor film 303. For example, in the case where the transistor does not include the region 351d, excess oxygen contained in the insulating film 321 or the base insulating film 302 is lost by outward diffusion in some cases. Moreover, in the case where the transistor does not include the region 351d, excess oxygen contained in the insulating film 321 or the base insulating film 302 can oxidize the source electrode 307a and the drain electrode 307b.

Also in the case where the transistor includes the region 351c, excess oxygen contained in the gate insulating film 304 can be efficiently utilized to reduce oxygen vacancies in the oxide semiconductor film 303. For example, in the case where the transistor does not include the region 351c, excess oxygen contained in the gate insulating film 304 is lost by outward diffusion in some cases. Moreover, excess oxygen contained in the gate insulating film 304 can oxidize the source electrode 307a and the drain electrode 307b.

Next, the region 351a that is part of the oxide semiconductor film 303 is described.

The region 351a is in the oxide semiconductor film 303 and in contact with the source electrode 307a, the drain electrode 307b, and the insulating film 306. The region 351a is provided at a depth from 1 nm to 200 nm inclusive, preferably from 5 nm to 150 nm inclusive, more preferably from 10 nm to 100 nm inclusive from the top or side surface of the oxide semiconductor film 303.

At the step of adding impurities to form the regions 351b, 351c, and 351d serving as oxygen blocking regions, impurities are added also to the region 351a. At that time, the resistance of the region 351a can be lowered by the impurity addition.

A region 322 illustrated in FIG. 26B is not in contact with the source electrode 307a or the drain electrode 307b, and does not overlap with the gate electrode 305. When the resistance of the region 322 is high, the on-state current of the transistor is reduced.

The resistance of the region 322 can be lowered by adding impurities to the region 351a, which is part of the oxide semiconductor film 303. Accordingly, the on-state current can be increased, so that the performance of the transistor can be improved.

Note that the step for adding impurities to form the low resistance region can also serve as the step for adding impurities to form the regions 351b, 351c, and 351d serving as oxygen blocking regions. Thus, manufacturing process can be shortened, which leads to cost reduction. Moreover, an improved yield can be expected by the simplified manufacturing process.

<Fabricating Method of Transistor Structure 3>

An example of a method for fabricating a transistor structure 3 is described below.

FIGS. 27A to 27C, FIGS. 28A to 28C, and FIGS. 29A to 29C are cross-sectional views illustrating a method for manufacturing the transistor illustrated in FIGS. 26B and 26C.

First, the substrate 301 is prepared.

Then, the base insulating film 302 is formed. The description of the method for forming the base insulating film 102 can be referred to for the base insulating film 302.

Next, the base insulating film 321 is formed. The insulating film 321 contains excess oxygen. For the base insulating film 321, the description of the method for fouling the insulating film 135 is referred to.

Then, oxygen ions may be added into the insulating film 321 so that an insulating film containing excess oxygen can be formed. The addition of oxygen ions can be performed by an ion implantation method at an acceleration voltage of higher than or equal to 2 kV and lower than or equal to 100 kV and at a concentration of greater than or equal to $5 \times 10^{14}$ ions/cm$^2$ and less than or equal to $5 \times 10^{16}$ ions/cm$^2$, for example.

Then, the oxide semiconductor film 303 is formed. The oxide semiconductor film 303 can be formed using an oxide semiconductor film selected from the oxide semiconductor films given as examples of the oxide semiconductor film 103 by a sputtering method, a CVD method, an MBE method, an ALD method, or a PLD method.

Next, first heat treatment is preferably performed. The first heat treatment is performed at a temperature higher than or equal to 250° C. and lower than or equal to 650° C., preferably higher than or equal to 300° C. and lower than or equal to 500° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate released oxygen.

Next, a resist mask is formed over the oxide semiconductor film 303. Note that when the oxide semiconductor film 303 is finely processed so that the length of one side thereof is 100 nm or less, a hard mask may be provided between the oxide semiconductor film 303 and the resist mask. For forming the resist mask, the description of the resist mask 131 is referred to.

Then, the island-shaped oxide semiconductor film 303 is formed using the resist mask. Subsequently, the island-shaped insulating film 321 is formed (see FIG. 27A).

Although the island-shaped insulating film 321 is formed in FIG. 27A, the insulating film 321 is not necessarily patterned into an island shape and may have a projecting portion.

Dry etching treatment is preferably employed to form the oxide semiconductor film 303. The dry etching treatment may be performed in an atmosphere containing methane and a rare gas. Dry etching treatment is preferably employed also to form the insulating film 321. Etching of the insulating film 321 may be performed in an atmosphere containing trifluoromethane and a rare gas, for example.

Although the oxide semiconductor film 303 and the insulating film 321 are etched using the resist mask here, the oxide semiconductor film 303 and the insulating film 321 may be formed using different resist masks. Although the insulating film 321 has almost the same width as the oxide semiconductor film 303 in the cross-sectional view of FIG. 26B, for example, the insulating film 321 may have a wider width than the oxide semiconductor film 303. Alternatively, the insulating film 321 may have a smaller width than the oxide semiconductor film 303.

Then, the resist mask is removed. The resist mask may be removed by plasma treatment, chemical liquid treatment, or the like. Preferably, the resist mask is removed by plasma aching.

Next, the gate insulating film 304 is formed. A conductive film to be the gate electrode 305 is formed successively after the gate insulating film 304. The description of the method for forming the gate insulating film 104 can be referred to for the gate insulating film 304. The description of the method for forming the gate electrode 105 can be referred to for the gate electrode 305. Then, the conductive film is processed by a photolithography method or the like, so that the gate electrode 305 is formed (see FIG. 27B).

Next, an insulating film 309 is formed (see FIG. 27C). Then, highly anisotropic etching is performed on the insulating film 309 to form the sidewall insulating film 308 (see FIG. 28A).

After that, impurities are added to the oxide semiconductor film 303, the insulating film 321, and the base insulating film 302 using the gate electrode 305 and the sidewall insulating film 308 as masks to form the regions 351a, 351b, 351c, and 351d. Moreover, the region 351c is formed in part of the sidewall insulating film 308 (see FIG. 28B). For forming the regions 351a, 351b, 351c, and 351d by impurity addition, the description of the method for forming the region 53 by adding impurities to the insulating film 52 is referred to. The regions 351b, 351c, and 351d are oxygen blocking regions. The region 351a is part of the oxide semiconductor film 303 to which impurities are added.

By the existence of the regions 351b, 351c, and 351d serving as oxygen blocking regions, outward diffusion of excess oxygen of the insulating film 321 can be suppressed, and oxygen can be supplied to the oxide semiconductor film 303 efficiently.

The resistance of a region from the oxide semiconductor film 303 in contact with the source electrode 307a or the drain electrode 307b to a channel formation region can be lowered by adding impurities to the region 351a, which is part of the oxide semiconductor film 303. Accordingly, the on-state current can be increased, so that the performance of the transistor can be improved.

Next, second heat treatment is preferably performed. The second heat treatment is performed at a temperature higher than or equal to 250° C. and lower than or equal to 650° C., preferably higher than or equal to 300° C. and lower than or equal to 500° C. The second heat treatment is performed in an inert gas atmosphere or an atmosphere containing an oxidizing gas at 10 ppm or more, 1% or more, or 10% or more. The second heat treatment may be performed under a reduced pressure. Alternatively, the second heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate released oxygen. By the second heat treatment, the resistance of the region 351a that is a region of the oxide semiconductor film 303 to which impurities are added can be lowered in some cases. Excess oxygen can move from the insulating film 321 to the oxide semiconductor film 303. This can reduce oxygen vacancies in the oxide semiconductor film 303. Furthermore, the crystallinity of the oxide semiconductor film 303 can be improved, and impurities such as hydrogen and water can be removed. In addition, the second heat treatment can also serve as the first heat treatment.

Next, the insulating film 306 is formed (see FIG. 28C). Description of the insulating film 106 is referred to for the insulating film 306.

Then, part of the insulating film 306 is etched to form openings (see FIG. 29A). As a method for etching part of the insulating film 306, dry etching or the like can be used.

Then, a conductive film 307 to be the source electrode 307a and the drain electrode 307b is formed over the top surface of the insulating film 306 and in the openings (see FIG. 29B). For the conductive film 307, the method for forming the source electrode 107a and the drain electrode 107b is referred to.

In the case where a metal film is formed as a conductive film over an insulating film containing oxygen, the metal reacts with oxygen contained in the insulating film and a metal oxide layer is formed in some cases at the interface of the conductive film in contact with the insulating film. When such a metal oxide layer is formed, the adhesion between the insulating film and the metal film becomes weak, which is a problem. Here, an example in which an insulating film containing oxygen is used as the sidewall insulating film 308 and metal is used for the source electrode 307a and the drain electrode 307b is described. Impurities are added to the sidewall insulating film 308 to form the region 351c, and diffusion of oxygen can be suppressed; thus, formation of a metal oxide layer at the interface between the sidewall insulating film 308 and each of the source electrode 307a and the drain electrode 307b can be suppressed. Consequently, a decrease in the adhesion between the insulating film and the metal film is suppressed, which can prevent, for example, the source electrode 307a and the drain electrode 307b from being peeled off from the sidewall insulating film 308.

Next, planarization treatment is performed by a chemical mechanical polishing (CVD) method or the like, so that the source electrode 307a and the drain electrode 307b are formed (see FIG. 29C).

Next, third heat treatment is preferably performed. The third heat treatment may be performed under any of the conditions listed for the first and second heat treatment or may be performed at temperature lower than the temperatures for the first and second heat treatment. In addition, the third treatment can serve also as the first and second heat treatment.

Through the above steps, the transistor illustrated in FIGS. 26A to 26C can be manufactured.

<Transistor Structure 4>

Next, a self-aligned top-gate transistor in which an oxide semiconductor film has a three-layer structure and a film having a low oxygen-transmitting property is used as a protective film is described as an example.

Figure 31A:
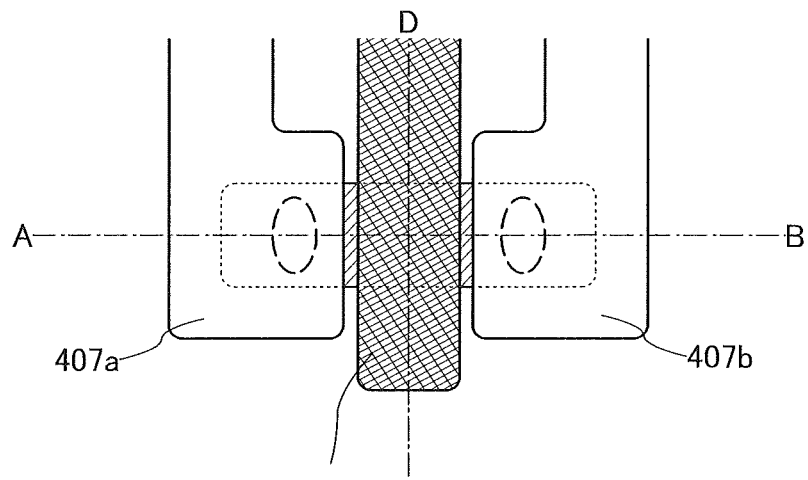
FIGS. 31A to 31C are a top view and cross-sectional views illustrating an example of a semiconductor device according to one embodiment of the present invention.
Figure 31B:
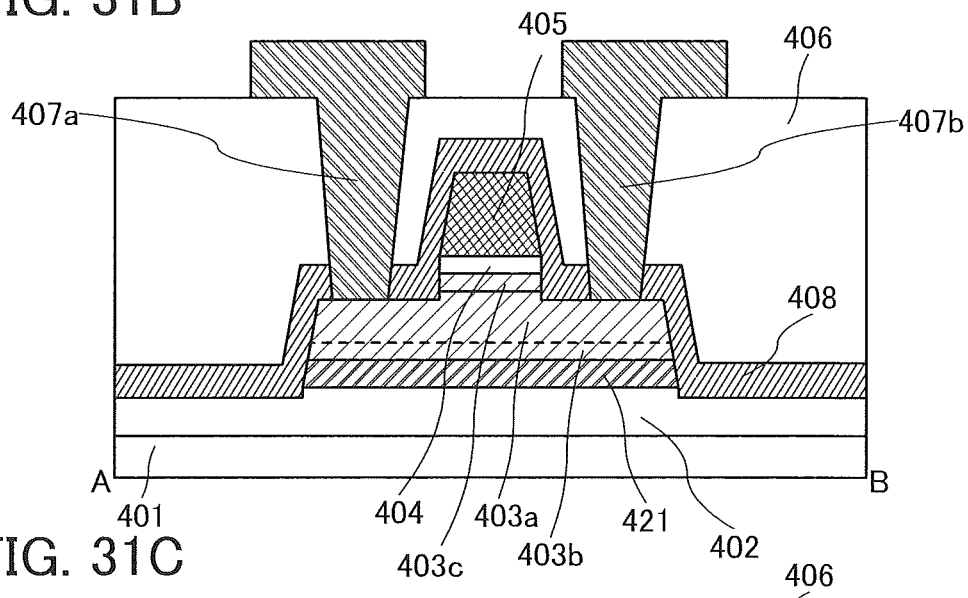
Figure 31C:
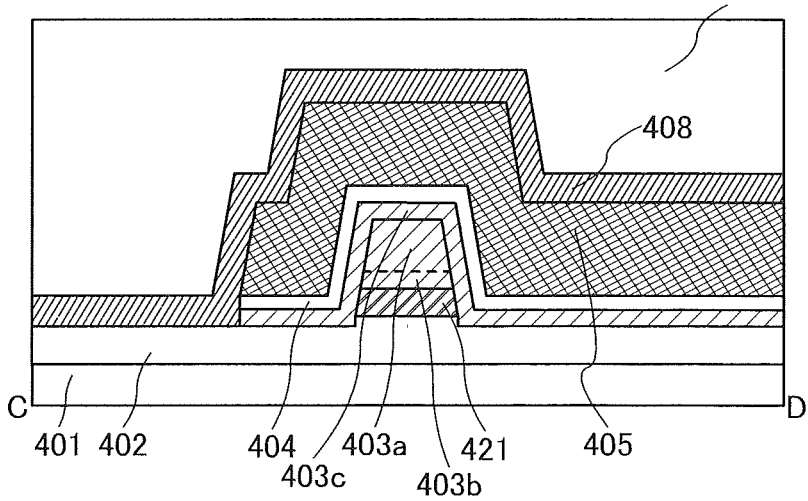

FIGS. 31A to 31C are a top view and cross-sectional views of the transistor. FIG. 31A is the top view of the transistor. FIG. 31B is a cross-sectional view taken along dashed-dotted line A-B in FIG. 31A. FIG. 31C is a cross-sectional view taken along dashed-dotted line C-D in FIG. 31A.

The transistor in FIG. 31B includes a base insulating film 402 over a substrate 401; an insulating film 421 over the base insulating film 402; an oxide semiconductor film 403b over the insulating film 421; an oxide semiconductor film 403a over the oxide semiconductor film 403b; an oxide semiconductor film 403c over the oxide semiconductor film 403a; a gate insulating film 404 over the oxide semiconductor film 403c; a gate electrode 405 over the gate insulating film 404; an insulating film 408 that is over the gate electrode 405, the oxide semiconductor film 403a, and the base insulating film 402 and that is in contact with the gate insulating film 404, the oxide semiconductor films 403c and 403b, and the insulating film 421; an insulating film 406 over the insulating film 408; and a source electrode 407a and a drain electrode 407b over the oxide semiconductor film 403b and the insulating film 406. The insulating film 421 contains excess oxygen. The insulating film 408 has a low oxygen-transmitting property. Note that the transistor does not necessarily include the base insulating film 402. In the cross section of FIG. 31C, the oxide semiconductor film 403c is formed over the base insulating film 402 and in contact with the insulating film 421 and the oxide semiconductor films 403b and 403a.

The insulating film 408 has a low oxygen-transmitting property. For example, the insulating film 408 may be formed using an aluminum oxide film.

Alternatively, the insulating film 408 can be formed using a silicon nitride film. As the silicon nitride film, a silicon nitride film from which hydrogen and ammonia are less likely to be released is used. The amount of released hydrogen and ammonia can be measured by TDS. Further, as the silicon nitride film, a silicon nitride film that does not transmit or hardly transmits hydrogen, water, and oxygen is used. Further alternatively, the insulating film 408 may be formed using a silicon nitride oxide film.

The details of the oxide semiconductor films 403a, 403b, and 403c are described later.

For common portions of the transistor in FIGS. 3A to 3C and the transistor in FIGS. 31A to 31C, the description for the transistor in FIGS. 3A to 3C is referred to unless otherwise noted. For example, the description of the substrate 101 can be referred to for the substrate 401. The description of the base insulating film 102 can be referred to for the base insulating film 402. The description of the insulating film 121 can be referred to for the base insulating film 421. The description of the gate insulating film 104 can be referred to for the gate insulating film 404. The description of the gate electrode 105 can be referred to for the gate electrode 405. The description of the insulating film 106 can be referred to for the insulating film 406. The description of the source electrode 107a and the drain electrode 107b can be referred to for the source electrode 407a and the drain electrode 407b.

In the cross section of FIG. 31B, an end surface of the insulating film 421 is covered with the insulating film 408. The insulating film 408 has a low oxygen-transmitting property. Thus, outward diffusion of excess oxygen of the insulating film 121 can be suppressed, and oxygen can be efficiently supplied to the oxide semiconductor films 403a, 403b, and 403c. In the case where the end surface of the insulating film 421 is not covered with the insulating film 408, excess oxygen contained in the insulating film 421 can oxidize the source electrode 407a and the drain electrode 407b.

Since the insulating film 408 is over the base insulating film 402, oxygen diffusion from the insulating film 421 through the base insulating film 402 to the insulating film 406 can be suppressed. Moreover, diffusion of oxygen contained in the base insulating film 402 to the insulating film 406 can be suppressed. Thus, oxygen can be efficiently supplied to the oxide semiconductor films 403a, 403b, and 403c. In the case where the insulating film 408 is not formed over the base insulating film 402, excess oxygen contained in the insulating film 421 can oxidize the source electrode 407a and the drain electrode 407b.

Figure 35A:
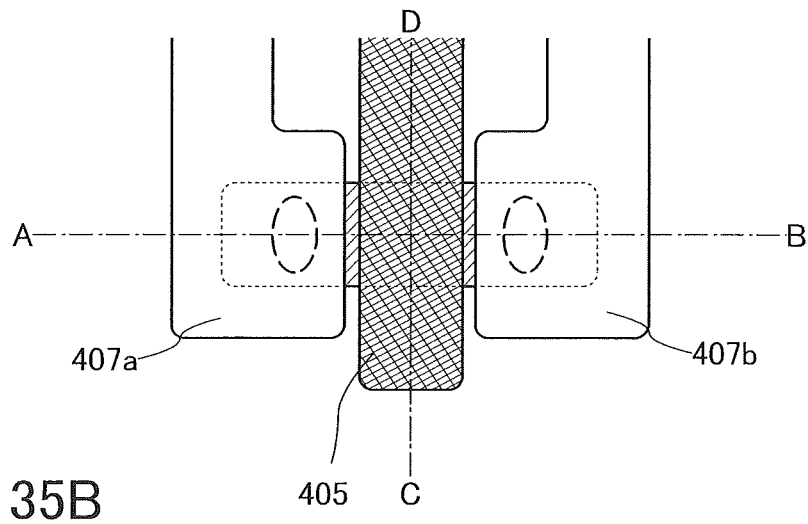
FIGS. 35A to 35C are a top view and cross-sectional views illustrating an example of a semiconductor device according to one embodiment of the present invention.
Figure 35B:
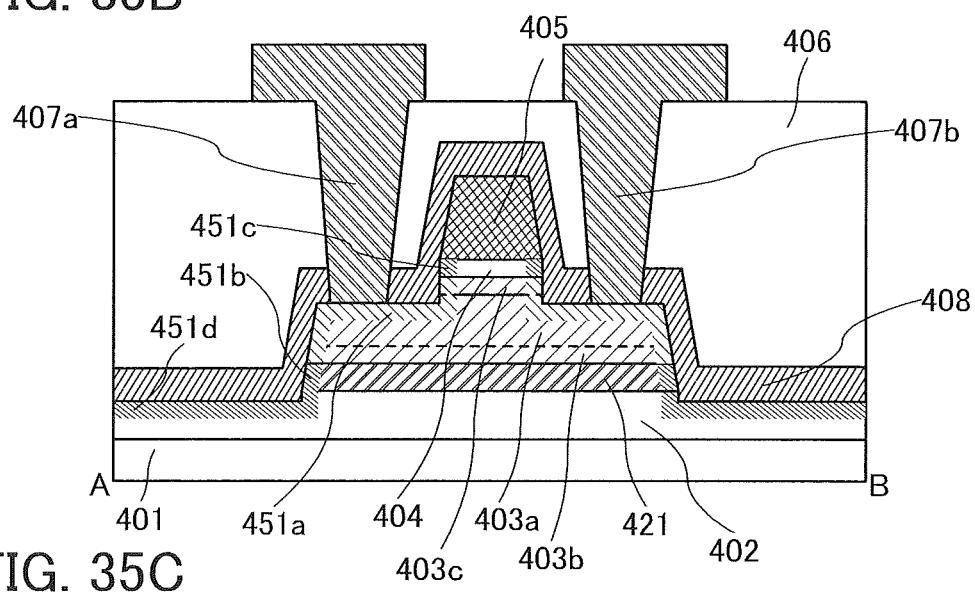
Figure 35C:
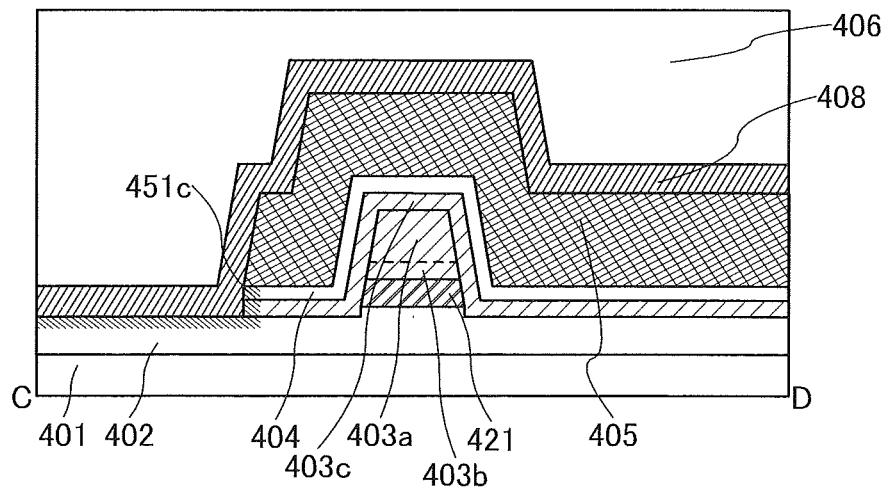

Regions 451a, 451b, 451c, and 451d to which impurities are added may be provided as illustrated in FIGS. 35A to 35C. The regions 451b, 451c, and 451d serve as oxygen blocking regions. The region 451a serves as a low resistance region of the oxide semiconductor films.

The oxide semiconductor films 403a, 403b, and 403c are described below. The oxide semiconductor film 403b contains one or more elements that are not oxygen and are contained in the oxide semiconductor film 403a. Since the oxide semiconductor film 403b contains one or more elements that are not oxygen and are contained in the oxide semiconductor film 403a, an interface state is unlikely to be formed at the interface between the oxide semiconductor film 403a and the oxide semiconductor film 403b.

The oxide semiconductor film 403c contains one or more elements that are not oxygen and are contained in the oxide semiconductor film 403a. Since the oxide semiconductor film 403c contains one or more elements that are not oxygen and are contained in the oxide semiconductor film 403a, an interface state is unlikely to be formed at the interface between the oxide semiconductor film 403a and the oxide semiconductor film 403c.

In the case of using an In-M-Zn oxide as the oxide semiconductor film 403b, when summation of In and M is assumed to be 100 atomic %, the proportions of In and M are preferably set to less than 50 atomic % and greater than or equal to 50 atomic %, respectively, and more preferably less than 25 atomic % and greater than or equal to 75 atomic %, respectively. In the case of using an In-M-Zn oxide as the oxide semiconductor film 403a, when summation of In and M is assumed to be 100 atomic %, the proportions of In and M are preferably set to greater than or equal to 25 atomic % and less than 75 atomic %, respectively, and more preferably greater than or equal to 34 atomic % and less than 66 atomic %, respectively. In the case of using an In-M-Zn oxide as the oxide semiconductor film 403c, when summation of In and M is assumed to be 100 atomic %, the proportions of In and M are preferably set to less than 50 atomic % and greater than or equal to 50 atomic %, respectively, and more preferably less than 25 atomic % and greater than or equal to 75 atomic %, respectively. Note that the oxide semiconductor film 403c may be formed using the same kind of oxide as that of the oxide semiconductor film 403b.

Here, in some cases, there is a mixed region of the oxide semiconductor film 403b and the oxide semiconductor film 403a between the oxide semiconductor film 403b and the oxide semiconductor film 403a. Further, in some cases, there is a mixed region of the oxide semiconductor film 403a and the oxide semiconductor film 403c between the oxide semiconductor film 403a and the oxide semiconductor film 403c. The mixed region has a low density of interface states. For that reason, the stack including the oxide semiconductor film 403b, the oxide semiconductor film 403a, and the oxide semiconductor film 403c has a band structure where energy at each interface is changed continuously (continuous junction).

As the oxide semiconductor film 403a, an oxide with a wide energy gap is used. For example, the energy gap of the oxide semiconductor film 403a is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

As the oxide semiconductor layer 403b, an oxide with a wide energy gap is used. For example, the energy gap of the oxide semiconductor film 403b is greater than or equal to 2.7 eV and less than or equal to 4.9 eV, preferably greater than or equal to 3 eV and less than or equal to 4.7 eV, further preferably greater than or equal to 3.2 eV and less than or equal to 4.4 eV.

As the oxide semiconductor layer 403c, an oxide with a wide energy gap is used. The energy gap of the oxide semiconductor film 403c is greater than or equal to 2.7 eV and less than or equal to 4.9 eV, preferably greater than or equal to 3 eV and less than or equal to 4.7 eV, further preferably greater than or equal to 3.2 eV and less than or equal to 4.4 eV. Note that the oxide semiconductor film 403b and the oxide semiconductor film 403c have wider energy gaps than the oxide semiconductor film 403a.

As the oxide semiconductor film 403a, an oxide having an electron affinity higher than that of the oxide semiconductor film 403b is used. For example, as the oxide semiconductor film 403a, an oxide having an electron affinity higher than that of the oxide semiconductor film 403b by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that electron affinity is an energy gap between the vacuum level and the bottom of the conduction band.

Further, as the oxide semiconductor film 403a, an oxide having an electron affinity higher than that of the oxide semiconductor film 403c is used. For example, as the oxide semiconductor film 403a, an oxide having an electron affinity higher than that of the oxide semiconductor film 403c by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.5 eV is used.

In that case, when an electric field is applied to the gate electrode 405, current mainly flows in the oxide semiconductor film 403a having an electron affinity higher than those of the oxide semiconductor film 403b and the oxide semiconductor film 403c.

To increase the on-state current of the transistor, the thickness of the oxide semiconductor film 403c is preferably as small as possible. The thickness of the oxide semiconductor film 403c is set to less than 10 nm, preferably less than or equal to 5 nm, more preferably less than or equal to 3 nm, for example. Meanwhile, the oxide semiconductor film 403c has a function of blocking elements other than oxygen (such as silicon) contained in the gate insulating film 404 from entering the oxide semiconductor film 403a where current mainly flows. For this reason, the oxide semiconductor film 403c preferably has a certain degree of thickness. The thickness of the oxide semiconductor film 403c is set to greater than 0.3 nm, preferably greater than or equal to 1 nm, more preferably greater than or equal to 2 nm, for example.

To increase reliability, the oxide semiconductor film 403b is preferably formed thick and the oxide semiconductor film 403c is preferably formed thin. Specifically, the thickness of the oxide semiconductor film 403b is greater than or equal to 20 nm, preferably greater than or equal to 30 nm, more preferably greater than or equal to 40 nm, still more preferably greater than or equal to 60 nm. In that case, the distance from the interface between the base insulating film 102 and the oxide semiconductor film 403b to the oxide semiconductor film 403a where current mainly flows can be greater than or equal to 20 nm, preferably greater than or equal to 30 nm, more preferably greater than or equal to 40 nm, still more preferably greater than or equal to 60 nm. To prevent the productivity of the semiconductor device from being lowered, the thickness of the oxide semiconductor film 403b is less than or equal to 200 nm, preferably less than or equal to 120 nm, more preferably less than or equal to 80 nm. The thickness of the oxide semiconductor film 403a is greater than or equal to 3 nm and less than or equal to 100 nm, preferably greater than or equal to 3 nm and less than or equal to 80 nm, more preferably greater than or equal to 3 nm and less than or equal to 50 nm.

For example, the oxide semiconductor film 403b may be thicker than the oxide semiconductor film 403a, and the oxide semiconductor film 403a may be thicker than the oxide semiconductor film 403c.

The sum of thicknesses of the oxide semiconductor film 403b and the insulating film 421 is set to greater than or equal to 20 nm, preferably greater than or equal to 30 nm, more preferably greater than or equal to 40 nm, still more preferably greater than or equal to 60 nm. In that case, the distance from the interface between the base insulating film 402 and the insulating film 421 to the oxide semiconductor film 403a can be greater than or equal to 20 nm, preferably greater than or equal to 30 nm, more preferably greater than or equal to 40 nm, still more preferably greater than or equal to 60 nm. In other words, when the insulating film 421 is formed thick, the oxide semiconductor film 403b can be formed thin. When the oxide semiconductor film 403b is formed thin, the amount of supply of excess oxygen to the oxide semiconductor film can be reduced and the amount of supply of oxygen to the oxide semiconductor film 403a where current mainly flows is relatively increased; thus, further improvement of characteristics can be expected.

<Fabricating Method of Transistor Structure 4>

An example of a method for fabricating a transistor structure 4 is described below.

FIGS. 32A to 32C, FIGS. 33A to 33C, and FIGS. 34A and 34B are cross-sectional views illustrating a method for manufacturing the transistor illustrated in FIGS. 31B and 31C.

First, the substrate 401 is prepared.

Then, the base insulating film 402 is formed. The description of the method for forming the base insulating film 102 can be referred to for the base insulating film 402.

Next, the base insulating film 421 is deposited. The insulating film 421 contains excess oxygen. The description of the method for forming the insulating film 135 can be referred to for the insulating film 421.

Then, oxygen ions may be added into the insulating film 421 so that an insulating film containing excess oxygen can be formed. The addition of oxygen ions can be performed by an ion implantation method at an acceleration voltage of higher than or equal to 2 kV and lower than or equal to 100 kV and at a concentration of greater than or equal to $5 \times 10^{14}$ ions/cm$^2$ and less than or equal to $5 \times 10^{16}$ ions/cm$^2$, for example.

Then, the oxide semiconductor films 403a and 403b are formed (see FIG. 32A). The oxide semiconductor films 403a and 403b can be formed using any of the oxide semiconductor films given as examples of the oxide semiconductor films 403a and 403b by a sputtering method, a CVD method, an MBE method, an ALD method, or a PLD method.

Next, first heat treatment is preferably performed. The first heat treatment is performed at a temperature higher than or equal to 250° C. and lower than or equal to 650° C., preferably higher than or equal to 300° C. and lower than or equal to 500° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate released oxygen.

Next, a resist mask is formed over the oxide semiconductor film 403b. Note that when the oxide semiconductor film 403b is finely processed so that the length of one side thereof is 100 nm or less, a hard mask may be provided between the oxide semiconductor film 403b and the resist mask. For forming the resist mask, the description of the resist mask 131 is referred to.

Then, the island-shaped oxide semiconductor films 403b and 403a are formed using the resist mask. Subsequently, the island-shaped insulating film 421 is formed (see FIG. 32B).

Although the island-shaped insulating film 421 is formed in FIG. 32B, the insulating film 421 is not necessarily patterned into an island shape and may have a projecting portion.

Dry etching treatment is preferably employed to form the oxide semiconductor films 403b and 403a. The dry etching treatment may be performed in an atmosphere containing methane and a rare gas. Dry etching treatment is preferably employed also to form the insulating film 421. Etching of the insulating film 421 may be performed in an atmosphere containing trifluoromethane and a rare gas, for example.

Although the oxide semiconductor films 403b and 403a and the insulating film 421 are etched using the resist mask here, the oxide semiconductor films 403b and 403a may be formed using a resist mask different from that of the insulating film 421. Although the insulating film 421 has almost the same width as each of the oxide semiconductor films 403b and 403a in the cross-sectional view of FIG. 32B, for example, the insulating film 421 may have a wider width than each of the oxide semiconductor films 403b and 403a. Alternatively, the insulating film 421 may have a smaller width than each of the oxide semiconductor films 403b and 403a.

Then, the resist mask is removed. The resist mask may be removed by plasma treatment, chemical liquid treatment, or the like. Preferably, the resist mask is removed by plasma aching.

Then, the oxide semiconductor film 403c is formed. The oxide semiconductor film 403c can be formed using any of the above-described oxide semiconductor films given as examples of the oxide semiconductor film 403c by a sputtering method, a CVD method, an MBE method, an ALD method, or a PLD method.

Next, the gate insulating film 404 and the gate electrode 405 are formed. The description of the method for forming the gate insulating film 104 can be referred to for the gate insulating film 404. The description of the method for forming the gate electrode 105 can be referred to for the gate electrode 405.

Then, a resist mask 431 is formed (see FIG. 32C). The gate electrode 405 is etched using the resist mask 431. Next, the gate insulating film 404 is etched. After that, the oxide semiconductor film 403c is etched (see FIG. 33A). The gate electrode 405, the gate insulating film 404, and the oxide semiconductor film 403c can be etched by dry etching treatment or the like.

After that, the insulating film 408 is formed (see FIG. 33B). The insulating film 408 may be formed using any of the insulating films described as examples of the insulating film 408. The insulating film 408 is formed using a film having a low oxygen-transmitting property.

Next, second heat treatment is preferably performed. The second heat treatment is performed at a temperature higher than or equal to 250° C. and lower than or equal to 650° C., preferably higher than or equal to 300° C. and lower than or equal to 500° C. The second heat treatment is performed in an inert gas atmosphere or an atmosphere containing an oxidizing gas at 10 ppm or more, 1% or more, or 10% or more. The second heat treatment may be performed under a reduced pressure. Alternatively, the second heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate released oxygen. Excess oxygen can move from the insulating film 421 to the oxide semiconductor films 403a, 403b, and 403c by the second heat treatment. This can reduce oxygen vacancies in the oxide semiconductor films 403a, 403b, and 403c. Furthermore, the crystallinity of the oxide semiconductor films 403a, 403b, and 403c can be improved, and impurities such as hydrogen and water can be removed. In addition, the second heat treatment can also serve as the first heat treatment.

Next, the insulating film 406 is formed (see FIG. 33C). The description of the insulating film 106 can be referred to for the base insulating film 406.

Then, part of the insulating film 406 is etched to form openings (see FIG. 34A). As a method for etching part of the insulating film 406, dry etching or the like can be used.

Then, a conductive film to be the source electrode 407a and the drain electrode 407b is formed over the top surface of the insulating film 406 and in the openings, and then is processed by a photolithography method or the like. Thus, the source electrode 407a and the drain electrode 407b are formed (see FIG. 34B). The description of the method for forming the source electrode 107a and the drain electrode 107b can be referred to for the source electrode 407a and the drain electrode 407b.

Next, third heat treatment is preferably performed. The third heat treatment may be performed under any of the conditions listed for the first and second heat treatment or may be performed at temperature lower than the temperatures for the first and second heat treatment. In addition, the third treatment can serve also as the first and second heat treatment.

Through the above steps, the transistor illustrated in FIGS. 31A to 31C can be manufactured.

Examples of transistor structures of embodiments of the present invention and fabricating methods thereof are described above. Note that the transistor structure of one embodiment of the present invention is not limited to the above examples. Examples of the transistor structure of one embodiment of the present invention include a bottom contact structure and a structure without source and drain electrodes.

In the transistor of one embodiment of the present invention, excess oxygen contained in the insulating film can be efficiently utilized to reduce oxygen vacancies in the oxide semiconductor film. Thus, the transistor includes the oxide semiconductor film with reduced oxygen vacancies.

For that reason, the transistor of one embodiment of the present invention is less likely to deteriorate owing to oxygen vacancies. For example, oxygen vacancies in an oxide semiconductor film might serve as trap centers, causing deterioration. Further, oxygen vacancies that trap hydrogen to form a donor level might cause a negative shift in the threshold voltage of a transistor.

In the transistor of one embodiment of the present invention, excess oxygen can be efficiently utilized. Therefore, the transistor can be used for a fine structure. Further, the transistor is less likely to deteriorate and has stable electrical characteristics. Since an increase in resistance due to oxidization of the wiring is small, a larger on-state current can be achieved. Further, since the threshold voltage does not shift in the negative direction, a smaller off-state current can be achieved.

<Application Products>

Application products using the above transistor are described below.

The above transistor can be used for various purposes such as a memory, a CPU, and a display device, for example.

<CPU>

Figure 20A:
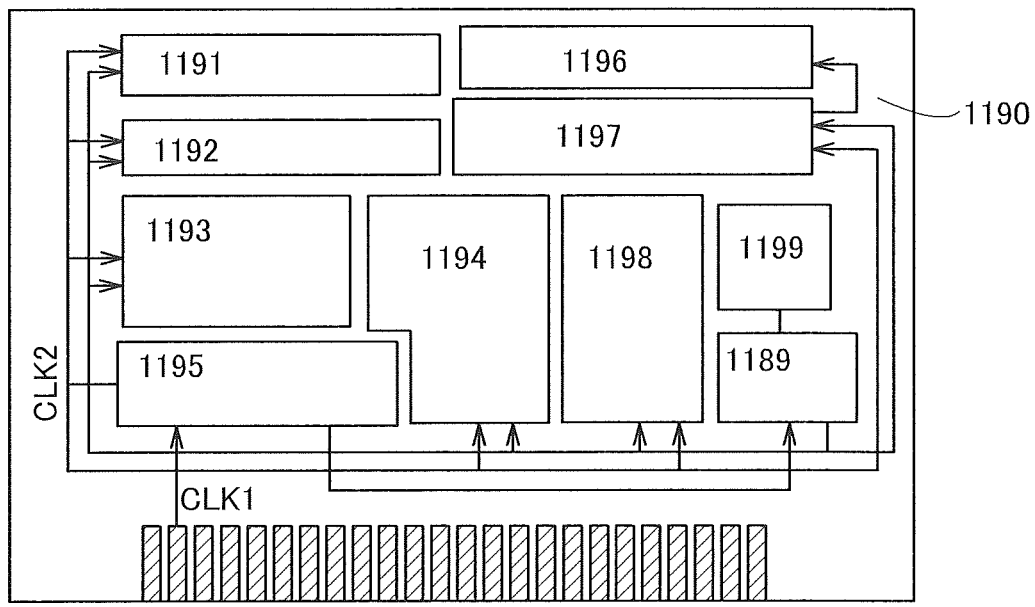
FIGS. 20A to 20C are block diagrams illustrating examples of CPUs of embodiments of the present invention.
Figure 20B:
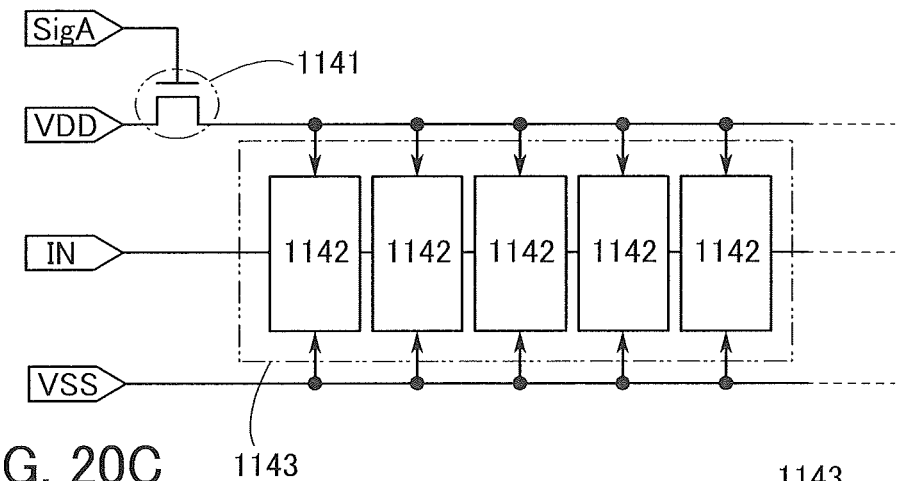
Figure 20C:
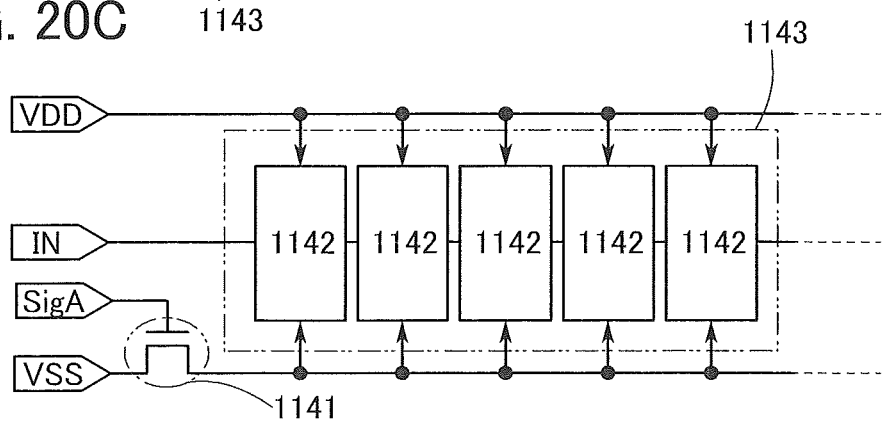

FIGS. 20A to 20C are block diagrams illustrating a specific structure of a CPU at least partly including the above transistor.

The CPU illustrated in FIG. 20A includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189. A semiconductor substrate, an SOI substrate, a glass substrate, or the like is used as the substrate 1190. The ROM 1199 and the ROM interface 1189 may be provided in a separate chip. It is needless to say that the CPU in FIG. 20A is only an example in which the configuration is simplified, and actual CPUs have various configurations depending on applications.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in response to the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 20A, a memory cell is provided in the register 1196. As the memory cell of the register 1196, the above transistor can be used.

In the CPU in FIG. 20A, the register controller 1197 selects operation of holding data in the register 1196, in response to an instruction from the ALU 1191. That is, the register controller 1197 determines whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of a power supply voltage to the memory cell in the register 1196 can be stopped.

The power supply can be stopped by providing a switching element between a memory cell group and a node to which a power supply potential VDD or a power supply potential VSS is supplied, as illustrated in FIG. 20B or FIG. 20C. Circuits illustrated in FIGS. 20B and 20C are described below.

FIGS. 20B and 20C each illustrate a storage device in which any of the above transistors is used as a switching element that controls supply of a power supply potential to a memory cell.

The storage device illustrated in FIG. 20B includes a switching element 1141 and a memory cell group 1143 including a plurality of memory cells 1142. Specifically, for each of the memory cells 1142, the above transistor can be used. Each of the memory cells 1142 included in the memory cell group 1143 is supplied with the high-level power supply potential VDD via the switching element 1141. Further, each of the memory cells 1142 included in the memory cell group 1143 is supplied with the potential of a signal IN and the low-level power supply potential VSS.

In FIG. 20B, the above transistor is used as the switching element 1141, and the switching of the transistor is controlled by a signal SigA supplied to a gate electrode layer thereof.

Although FIG. 20B illustrates the configuration in which the switching element 1141 includes only one transistor, one embodiment of the present invention is not particularly limited thereto. The switching element 1141 may include a plurality of transistors. In the case where the switching element 1141 includes a plurality of transistors serving as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 20B, the switching element 1141 may control the supply of the low-level power supply potential VSS.

In FIG. 20C, an example of a storage device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

<Installation Example>

Figure 21A:
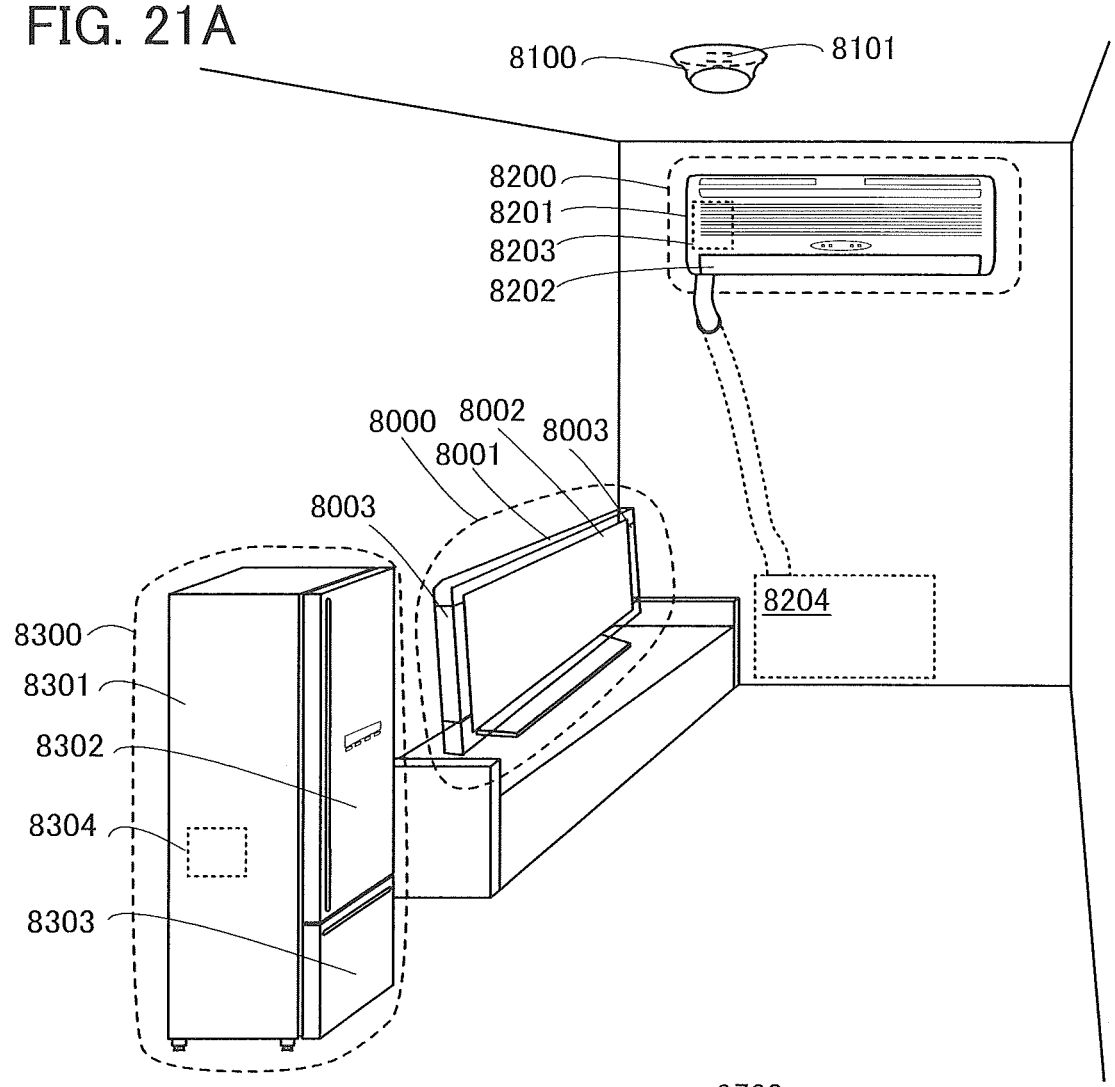
FIGS. 21A to 21C illustrate examples of electronic devices of embodiments of the present invention.

In a television set 8000 in FIG. 21A, a display portion 8002 is incorporated in a housing 8001. The display portion 8002 displays an image and a speaker portion 8003 can output sound.

The television set 8000 may be provided with a receiver, a modem, and the like. With the receiver, the television set 8000 can receive general television broadcasting. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing data communication or a memory. The above memory or CPU can be used for the television set 8000.

In FIG. 21A, an alarm device 8100 is a residential fire alarm that includes a sensor portion and a microcomputer 8101. Note that the microcomputer 8101 includes a CPU using the above transistor.

In FIG. 21A, an air conditioner that includes an indoor unit 8200 and an outdoor unit 8204 includes a CPU using the above transistor. Specifically, the indoor unit 8200 includes a housing 8201, an air outlet 8202, a CPU 8203, and the like. Although the CPU 8203 is provided in the indoor unit 8200 in FIG. 21A, the CPU 8203 may be provided in the outdoor unit 8204. Alternatively, the CPU 8203 may be provided in each of the indoor unit 8200 and the outdoor unit 8204. When the air conditioner includes a CPU using the above transistor, a reduction in power consumption of the air conditioner can be achieved.

In FIG. 21A, an electric refrigerator-freezer 8300 includes a CPU using the above transistor. Specifically, the electric refrigerator-freezer 8300 includes a housing 8301, a door for a refrigerator 8302, a door for a freezer 8303, a CPU 8304, and the like. In FIG. 21A, the CPU 8304 is provided in the housing 8301. When the electric refrigerator-freezer 8300 includes the CPU using the above transistor, a reduction in power consumption of the electric refrigerator-freezer 8300 can be achieved.

Figure 21B:
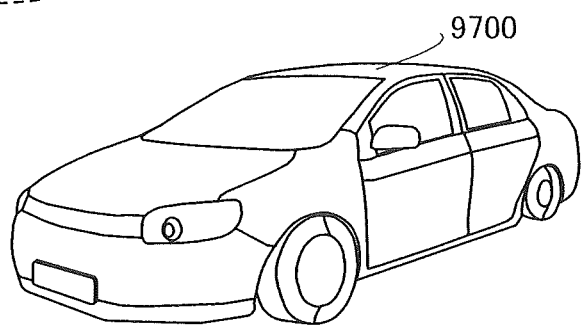
Figure 21C:
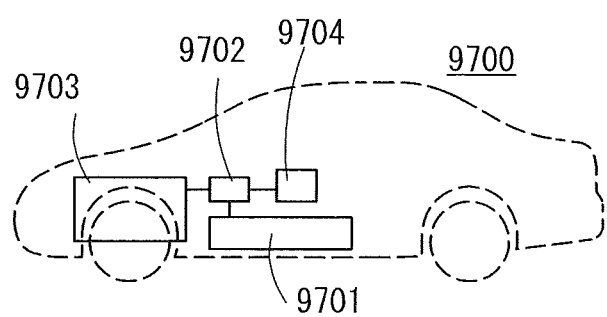

FIGS. 21B and 21C illustrate an example of an electric vehicle. An electric vehicle 9700 is equipped with a secondary battery 9701. The output of electric power of the secondary battery 9701 is adjusted by a control circuit 9702 and the electric power is supplied to a driving device 9703. The control circuit 9702 is controlled by a processing unit 9704 including a ROM, a RAM, a CPU, or the like that is not illustrated. When the electric vehicle 9700 includes the CPU using the above transistor, a reduction in power consumption of the electric vehicle 9700 can be achieved.

The driving device 9703 includes a DC motor or an AC motor either alone or in combination with an internal-combustion engine. The processing unit 9704 outputs a control signal to the control circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in response to the control signal of the processing unit 9704 to control the output of the driving device 9703. In the case where an AC motor is mounted, although not illustrated, an inverter that converts a direct current into an alternate current is also incorporated.

In this embodiment, an example of a basic principle is described. Thus, part or the whole of this embodiment can be freely combined with, applied to, or replaced with part or the whole of another embodiment.

Example 1

In this example, phosphorus was added as an impurity to a silicon oxide film or a silicon oxynitride film, which is an insulating film containing excess oxygen, and oxygen release was evaluated by TDS.

A method for forming samples is as follows.

First, a silicon wafer was prepared as a substrate. Next, the silicon wafer was oxidized by a thermal oxidation method to form a first silicon oxide film to a thickness of 100 nm from a surface of the silicon wafer. Then, a second silicon oxide film was formed to a thickness of 300 nm by a sputtering method.

The second silicon oxide film was formed under the following conditions: a synthesized quartz target was used; 50 sccm of oxygen was used as a deposition gas; the pressure was 0.4 Pa; the deposition power was 1.5 kW (13.56 MHz); the distance between the target and the substrate was 60 mm; and the substrate temperature was 100° C.

Then, phosphorus ions ($P^+$) were implanted as an impurity into each of the samples, so that example sample 1, example sample 2, and example sample 3 were formed.

The implantation of phosphorus ions was performed at an acceleration voltage of 30 kV by an ion implantation method. The implantation concentrations of phosphorus ions for example sample 1, example sample 2, and example sample 3 were $1\times10^{15}$ ions/cm², $2\times10^{15}$ ions/cm², and $1\times10^{16}$ ions/cm², respectively. In addition, a sample into which phosphorus ions were not implanted was prepared as a comparative example sample.

Figure 22:
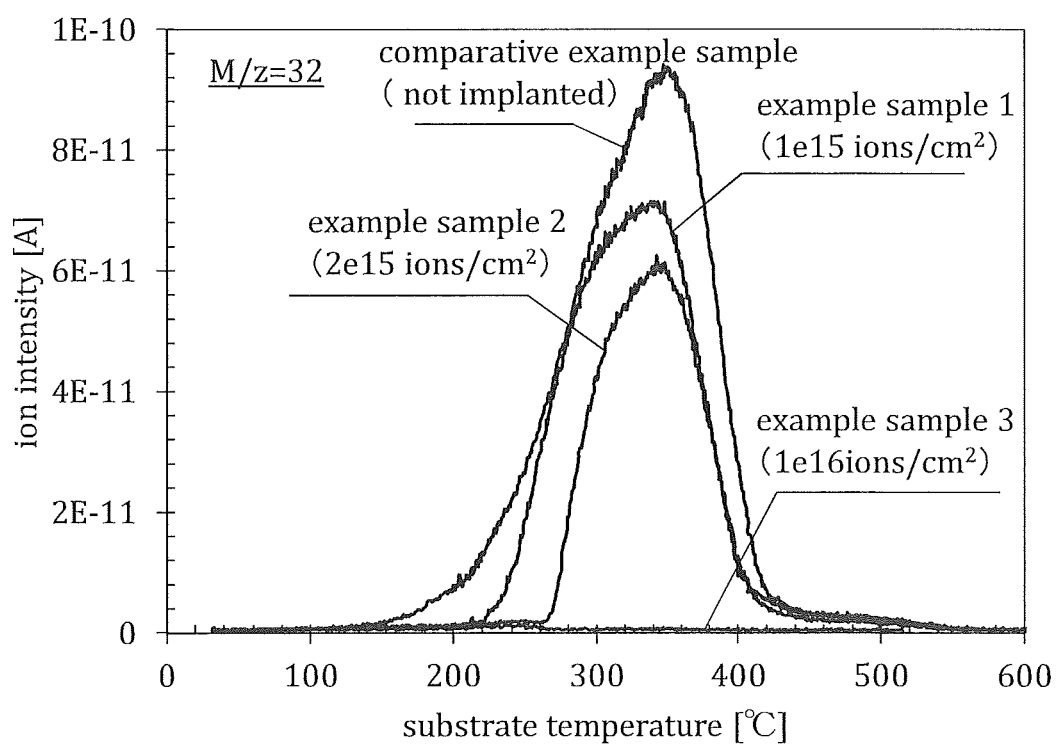
FIG. 22 is a graph showing the relation between substrate temperature and ion intensity measured by TDS.

FIG. 22 is a graph showing the relation between substrate temperature and ion intensity at a mass-to-charge ratio (M/z) of 32 of each of example samples 1 to 3 and the comparative example sample that was evaluated by TDS. The TDS measurement was performed on each of the samples divided into 10 mm square parts. Examples of a gas detected when M/z is 32 include an oxygen gas ($O_2$). In this example, all the gas detected when M/z is 32 was regarded as an oxygen gas.

FIG. 22 indicates that the comparative example sample into which phosphorus ions were not implanted released an oxygen gas at a substrate temperature in the range of approximately 250° C. to 450° C. On the other hand, the amount of an oxygen gas released from each of example samples 1 to 3, into which phosphorus ions were implanted, was smaller than that released from the comparative example sample.

According to FIG. 22, the amount of oxygen released from example sample 1 was $8.1 \times 10^{15}$ atoms/cm$^2$ ($2.7 \times 10^{20}$ atoms/cm$^3$). The amount of oxygen released from example sample 2 was $5.5 \times 10^{15}$ atoms/cm$^2$ ($1.8 \times 10^{20}$ atoms/cm$^3$). The amount of oxygen released from example sample 3 was $1.1 \times 10^{14}$ atoms/cm$^2$ ($3.7 \times 10^{18}$ atoms/cm$^3$). The amount of oxygen released from the comparative example sample was $1.1 \times 10^{16}$ atoms/cm$^2$ ($3.7 \times 10^{20}$ atoms/cm$^3$). Note that the oxygen release amount per unit volume was obtained by conversion using the thickness 300 nm of the second silicon oxide film.

Figure 23:
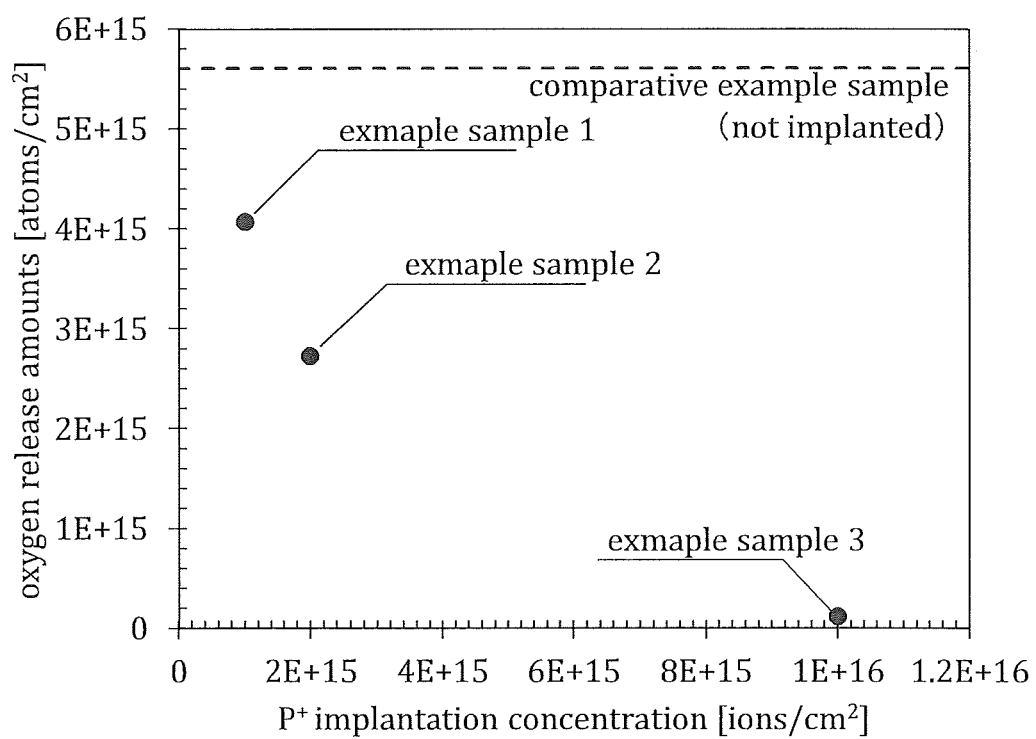
FIG. 23 is a graph showing the relation between phosphorus ion implantation concentration and the amount of released oxygen.

FIG. 23 shows the oxygen release amounts calculated from data in FIG. 22. Note that values obtained by conversion into oxygen atoms are shown as the oxygen release amounts. FIG. 23 is a graph showing the relation between the implantation concentration of phosphorus ions and the release amount of oxygen. Note that a broken line indicates the amount of oxygen released from the comparative example sample, into which phosphorus ions were not implanted.

It is found that reducing the amount of oxygen released by heating was achieved by implanting phosphorus ions into the silicon oxide film at a concentration of $1 \times 10^{15}$ ions/cm$^2$ or more, preferably $2 \times 10^{15}$ ions/cm$^2$ or more, more preferably $1 \times 10^{16}$ ions/cm$^2$ or more in the case where the acceleration voltage is 30 kV.

The results in FIG. 22 suggest that implanting phosphorus ions into an insulating film that can release oxygen by heating can reduce the amount of oxygen released by heating.

Next, a method for forming example sample 4 is as follows.

First, a silicon wafer was prepared as a substrate. Next, the silicon wafer was oxidized by a thermal oxidation method to form a silicon oxide film to a thickness of 100 nm from a surface of the silicon wafer. Then, a silicon oxynitride film was formed to a thickness of 300 nm by a CVD method.

The silicon oxynitride film was formed under the following conditions: 2 sccm of silane and 4000 sccm of nitrous oxide were used as deposition gases; the pressure was 700 Pa; the deposition power was 250 W (60 MHz); the distance between electrodes was 9 mm; and the substrate temperature was 400° C.

Then, phosphorus ions (P$^+$) were implanted as an impurity into the sample, so that example sample 4 was formed. The implantation of phosphorus ions was performed at an acceleration voltage of 30 kV by an ion implantation method. The implantation concentration of phosphorus ions for example sample 4 was $1 \times 10^{16}$ ions/cm$^2$.

Thus, example sample 4 is different from example sample 3 only in that the silicon oxynitride film is used instead of the second silicon oxide film.

Next, example samples 3 and 4 were etched, and the relation between etching depth and the release amount of oxygen was evaluated. Each of example samples 3 and 4 was divided into 10 mm square parts. In TDS measurement, one of the parts of the samples was used for one measurement.

Figure 24A:
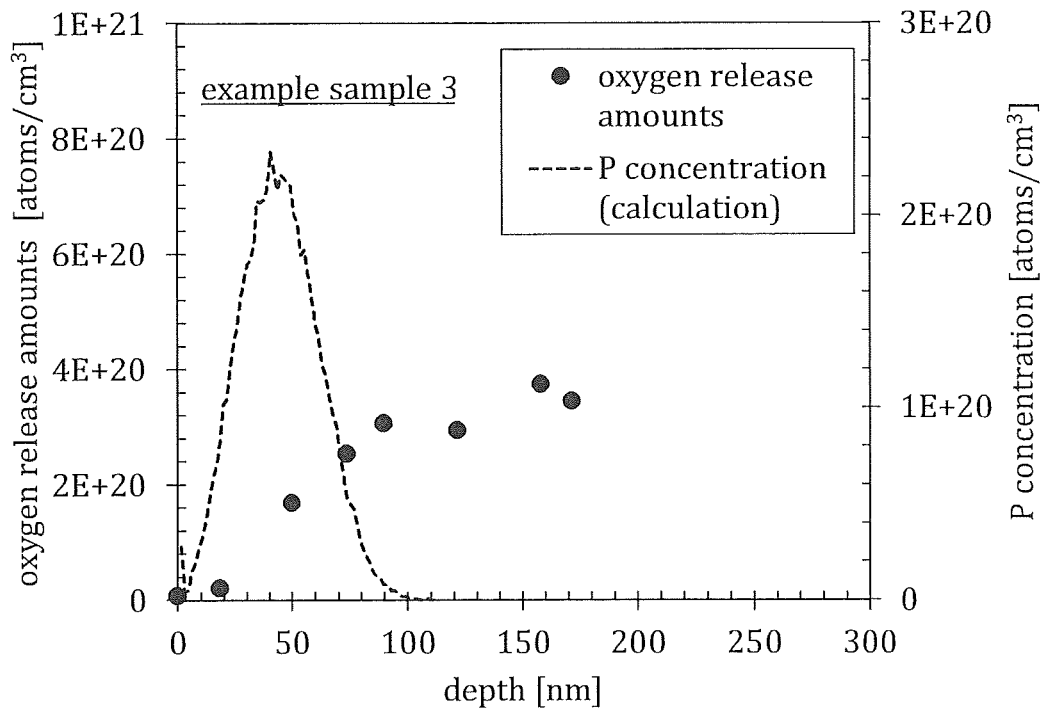
FIGS. 24A and 24B are graph each showing the relation between etching depth and the amount of released oxygen.
Figure 24B:
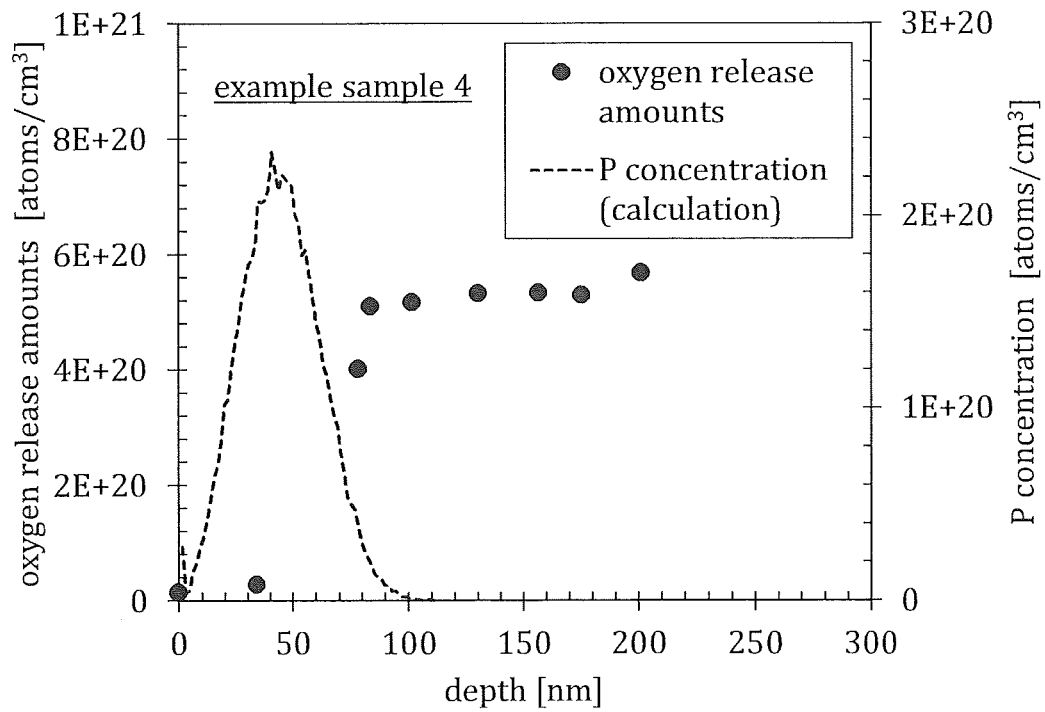

FIGS. 24A and 24B are each a graph where the release amount of oxygen with respect to etching depth is plotted using the thickness of the second silicon oxide film or the silicon oxynitride film without etching as a reference (depth: 0 mm). Etching was performed at 20° C. using a mixed solution containing 6.7% ammonium hydrogen fluoride and 12.7% ammonium fluoride (LAL 500 produced by Stella Chemifa Corporation) as an etchant. FIG. 24A shows the amount of oxygen released from example sample 3, and FIG. 24B shows the amount of oxygen released from example sample 4.

In each of FIGS. 24A and 24B, the concentration of phosphorus in the second silicon oxide film or the silicon oxynitride film that is obtained by calculation is shown. For the calculation, a transport of ion in matter (TRIM) was used, and the film density was set to 2.2 g/cm$^3$. The calculation results show that each sample had the maximum value of the phosphorus concentration at a depth from approximately 50 nm to 60 nm.

It is found from FIG. 24A that etching the second silicon oxide film in example sample 3 to a depth of 50 nm led to an increase in the oxygen release amount. The oxygen release amount is saturated when the second silicon oxide film was etched to a depth of 90 nm. Further, it is found from FIG. 24B that etching the silicon oxynitride film in example sample 4 to a depth of 78 nm led to an increase in the oxygen release amount. The oxygen release amount is saturated when the silicon oxynitride film was etched to a depth of 83 nm.

The results in FIGS. 24A and 24B show that when a region of the insulating film that exhibits the maximum phosphorus concentration was etched, the oxygen release amount was greatly changed. Thus, it is found that a region with an excellent oxygen blocking property was formed when the phosphorus concentration was $2 \times 10^{20}$ atoms/cm$^3$ or more. It is also found that oxygen to be released by heating was held in a region where the phosphorus concentration was low.

The results in this example suggest that adding phosphorus as an impurity to a silicon oxide film or a silicon oxynitride film, which is an insulating film containing excess oxygen, can form an oxygen blocking region.

Example 2

In this example, boron was added as an impurity to a silicon oxide film, which is an insulating film containing excess oxygen, and oxygen release was evaluated by TDS.

A method for forming a sample is as follows.

First, a silicon wafer was prepared as a substrate. Next, the silicon wafer was oxidized by a thermal oxidation method to form a first silicon oxide film to a thickness of 100 nm from a surface of the silicon wafer. Then, a second silicon oxide film was formed to a thickness of 300 nm by a sputtering method.

The second silicon oxide film was formed under the following conditions: a synthesized quartz target was used; 50 sccm of oxygen was used as a deposition gas; the pressure was 0.4 Pa; the deposition power was 1.5 kW (13.56 MHz); the distance between the target and the substrate was 60 mm; and the substrate temperature was 100° C.

Then, boron ions ($B^+$) were implanted as an impurity into the sample, so that example sample 5 was formed.

The implantation of boron ions was performed at an acceleration voltage of 10 kV by an ion implantation method. The implantation concentration of boron ions for example sample 5 was $1\times10^{16}$ ions/cm$^2$. In addition, a sample into which ions were not implanted was prepared as a comparative example sample. This sample is the same as the sample described as the comparative example sample in Example 1.

Figure 25:
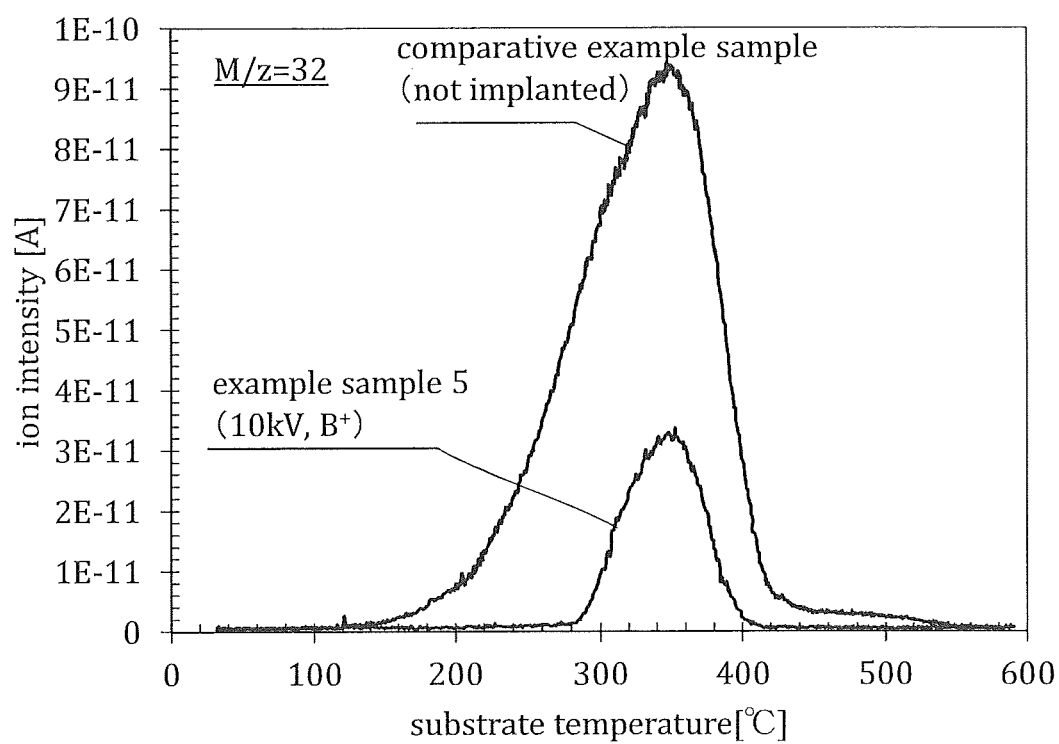
FIG. 25 is a graph showing the relation between substrate temperature and ion intensity measured by TDS.

FIG. 25 is a graph showing the relation between substrate temperature and ion intensity at a M/z of 32 of each of example sample 5 and the comparative example sample that was evaluated by IDS. The TDS measurement was performed on each of the samples divided into 10 mm square parts.

FIG. 25 indicates that the comparative example sample into which boron ions were not implanted released an oxygen gas at a substrate temperature in the range of approximately 250° C. to 450° C. On the other hand, the amount of an oxygen gas released from example sample 5, into which boron ions were implanted, was smaller than that released from the comparative example sample.

According to FIG. 25, the amount of oxygen released from example sample 5 was $3.1\times10^{15}$ atoms/cm$^2$ ($1.0\times10^{20}$ atoms/cm$^3$). The amount of oxygen released from the comparative example sample was $1.1\times10^{16}$ atoms/cm$^2$ ($3.7\times10^{20}$ atoms/cm$^3$). Note that the oxygen release amount per unit volume was obtained by conversion using the thickness 300 nm of the second silicon oxide film.

It is found that reducing the amount of oxygen released by heating was achieved by implanting boron ions into the silicon oxide film at a concentration of $1\times10^{16}$ ions/cm$^2$ or more in the case where the acceleration voltage is 10 kV.

The results in FIG. 25 suggest that implanting boron ions into an insulating film that can release oxygen by heating can reduce the amount of oxygen released by heating.

The results in this example suggest that adding boron as an impurity to a silicon oxide film, which is an insulating film containing excess oxygen, can form an oxygen blocking region.

Example 3

In this example, phosphorus or boron was added to an oxide semiconductor as impurities, and heat treatment was performed. Then, the resistance value was measured.

A method for forming samples is as follows.

First, a glass substrate was prepared as a substrate 1001. Next, an insulating film 1002 was formed. As the insulating film 1002, a 300-nm-thick silicon oxide film was deposited by a sputtering method. The deposition conditions were as follows: quartz was used as the sputtering target; a mixed gas of argon (flow rate: 25 sccm) and oxygen (flow rate: 25 sccm) was used as the deposition gas; the substrate temperature was 100° C.; the distance between the substrate and the sputtering target was 60 mm; the pressure was 0.4 Pa; and the RF power was 1.5 kW.

Next, an oxide semiconductor film 1003 was deposited by a sputtering method using a polycrystalline oxide target having an atomic ratio of In:Ga:Zn=1:1:1. The deposition conditions were as follows: a mixed gas of argon (flow rate: 30 sccm) and oxygen (flow rate: 15 sccm) was used; the pressure was 0.4 Pa; the electric power was 0.5 kW; the distance between the target and the substrate was 60 mm; and the substrate temperature was 400° C. After that, heat treatment was performed in a nitrogen atmosphere at 450° C. for one hour.

Then, a resist mask was formed, and an unnecessary portion of the oxide semiconductor film 1003 was removed by wet etching. For the wet etching, ITO-07N (produced by KANTO CHEMICAL CO., INC.) was used.

Next, an insulating film 1004 was formed. As the insulating film 1004, a 20-nm-thick silicon oxynitride film was formed by a CVD method. The silicon oxynitride film was formed under the following conditions: 1 sccm of silane and 800 sccm of nitrous oxide were used as deposition gases; the pressure was 40 Pa; the deposition power was 150 W (60 MHz); the distance between electrodes was 28 mm; and the substrate temperature was 400° C.

Then, phosphorus ions ($P^+$) or boron ions ($B^+$) were implanted as impurities into the samples. Into Sample A, phosphorus ions were implanted under the conditions where the acceleration voltage was 40 kV and the concentration of implanted phosphorus ions was $1.0\times10^{15}$ cm$^{-2}$. Into Sample B, boron ions were implanted under the conditions where the acceleration voltage was 15 kV and the implantation concentration was $3.0\times10^{15}$ cm$^{-2}$. As a comparative sample, Sample C into which ions were not implanted was fabricated.

In this example, the 20-nm-thick insulating film was formed over the oxide semiconductor film and then phosphorus ions were implanted; however, the samples may be formed also in the following manner: an insulating film is not formed or is removed after formed to expose an oxide semiconductor film, and then phosphorus ions are implanted. Furthermore, the insulating film 1004 may have a thickness greater than 20 nm.

Next, an insulating film 1005 was formed. As the insulating film 1005, a 300-mm-thick silicon oxynitride film was formed by a CVD method. The silicon oxynitride film was formed under the following conditions: 5 sccm of silane and 1000 sccm of nitrous oxide were used as deposition gases; the pressure was 133.30 Pa; the deposition power was 35 W (13.56 MHz); the distance between electrodes was 20 mm; and the substrate temperature was 325° C.

Next, by heat treatment, water, nitrogen, hydrogen, or the like was released from the insulating films 1004 and 1005 and part of oxygen contained in the oxide insulating film 1004 was supplied to the oxide semiconductor film. Here, heat treatment was performed in an oxygen atmosphere at 450° C. for one hour.

Then, a resist mask was formed, and openings 1010 were provided in the insulating films 1004 and 1005 by dry etching. The dry etching step was performed using an ICP apparatus. As etching gases, the flow rates of trifluoromethane, helium, and methane introduced into a treatment chamber of the ICP apparatus were 22.5 sccm, 127.5 sccm, and 5 sccm, respectively. The pressure inside the treatment chamber was 3.5 Pa, the ICP power was 475 W, and the bias power was 300 W.

Next, a 150-nm-thick conductive film 1007 was deposited over the top surface of the insulating film and in the openings 1010 by a sputtering method. Titanium was used for forming the conductive film 1007. The titanium film was formed under the following conditions: the flow rate of argon was 20 sccm; the pressure was 0.1 Pa; the DC power was 12 kW; the distance between the substrate and the target was 400 mm; and the substrate temperature was room temperature.

Then, a resist mask was formed, and the conductive film 1007 was processed by dry etching to form an electrode 1007a and an electrode 1007b. The electrodes 1007a and 1007b are described later. The dry etching step was performed using an ICP apparatus. As etching gases, boron trichloride and chlorine were introduced into the treatment chamber of the ICP apparatus at 60 sccm and at 20 sccm, respectively. The pressure inside the treatment chamber was 2.0 Pa, the ICP power was 350 W, and the bias power was 20 W. After that, heat treatment was performed at 150° C. for 12 minutes in a nitrogen atmosphere.

As described above, Sample A, Sample B, and Sample C, which is a comparative sample, were fabricated.

Figure 30A:
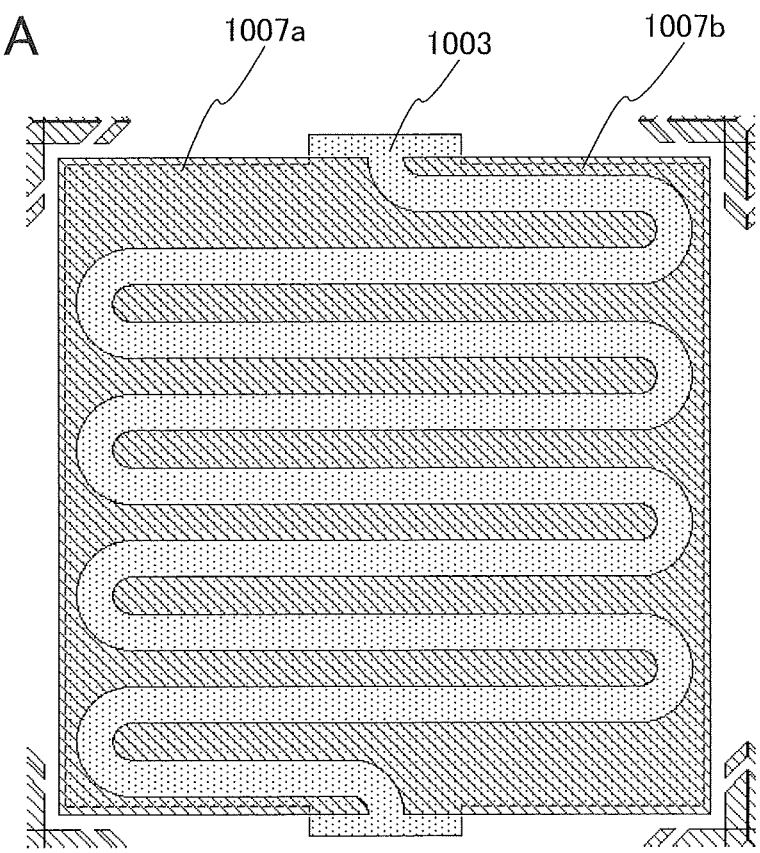
FIGS. 30A and 30B each illustrate an element for measuring the resistance of a semiconductor.
Figure 30B:
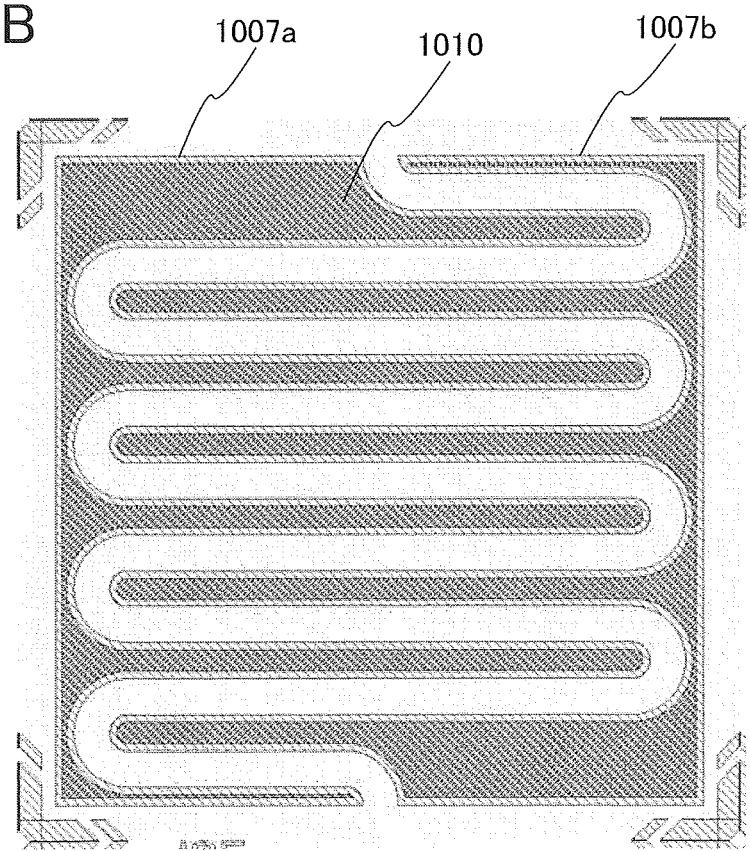

Next, the resistance values of Sample A and Sample B were measured. FIG. 30A illustrates the top view of an element used for the measurement. The oxide semiconductor film 1003 is formed in an island shape. The electrode 1007a and the electrode 1007b are arranged to have a space of 732 μm therebetween. FIG. 30B illustrates the relation between the openings 1010 of the insulating films 1004 and 1005 and the electrodes 1007a and 1007b.

The resistance value of the samples were measured by touching terminals to the electrodes 1007a and 1007b. The resistance values of Sample A, Sample B, and Sample C were $5.4 \times 10^5 [\Omega]$, $1.5 \times 10^4 [\Omega]$, and $2.1 \times 10^6 [\Omega]$, respectively.

Phosphorus or boron was added to the oxide semiconductor film 1003, so that the resistance of the oxide semiconductor film 1003 was able to be lowered.

This application is based on Japanese Patent Application serial No. 2013-163811 filed with Japan Patent Office on Aug. 7, 2013, the entire contents of which are hereby incorporated by reference.

What is claimed is:

1. A semiconductor device comprising:
   a base insulating film over a substrate, a second region of the base insulating film being more protruded than a first region of the base insulating film;
   a first oxide semiconductor film over the second region;
   a second oxide semiconductor film over the first oxide semiconductor film;
   a third oxide semiconductor film over the second oxide semiconductor film;
   a gate insulating film over the third oxide semiconductor film;
   a gate electrode over the gate insulating film; and
   a source electrode and a drain electrode,
   wherein the third oxide semiconductor film and the source electrode do not overlap with each other when viewed from a cross section cut in a channel length direction, and
   wherein an amount of oxygen that permeates the first region is less than 20% of an amount of oxygen that permeates the second region.

2. The semiconductor device according to claim 1, wherein a side surface of the third oxide semiconductor film is aligned with a side surface of the gate insulating film.

3. The semiconductor device according to claim 1, wherein a side surface of the first oxide semiconductor film is aligned with a side surface of the second oxide semiconductor film.

4. The semiconductor device according to claim 1, wherein the base insulating film contains phosphorus or boron.

5. A semiconductor device comprising:
   a base insulating film over a substrate, a second region of the base insulating film being more protruded than a first region of the base insulating film;
   a first oxide semiconductor film over the second region;
   a second oxide semiconductor film over the first oxide semiconductor film;
   a third oxide semiconductor film over the second oxide semiconductor film;
   a gate insulating film over the third oxide semiconductor film;
   a gate electrode over the gate insulating film; and
   a source electrode and a drain electrode in contact with a top surface of the second oxide semiconductor film,
   wherein a side surface of the third oxide semiconductor film is not overlapped with the source electrode or the drain electrode when viewed from a cross section cut in a channel length direction, and
   wherein an amount of oxygen that permeates the first region is less than 20% of an amount of oxygen that permeates the second region.

6. The semiconductor device according to claim 5, wherein the side surface of the third oxide semiconductor film is aligned with a side surface of the gate insulating film.

7. The semiconductor device according to claim 5, wherein a side surface of the first oxide semiconductor film is aligned with a side surface of the second oxide semiconductor film.

8. The semiconductor device according to claim 5, wherein the base insulating film contains phosphorus or boron.

9. A semiconductor device comprising:
   a base insulating film over a substrate, a second region of the base insulating film being more protruded than a first region of the base insulating film;
   a first oxide semiconductor film over the second region;
   a second oxide semiconductor film over the first oxide semiconductor film;
   a third oxide semiconductor film over the second oxide semiconductor film;
   a gate insulating film over the third oxide semiconductor film;
   a gate electrode over the gate insulating film; and
   a source electrode and a drain electrode,
   wherein the third oxide semiconductor film and the source electrode do not overlap with each other when viewed from a cross section cut in a channel length direction,
   wherein a portion of the second oxide semiconductor film is protruded, and the third oxide semiconductor film is over the portion, and
   wherein an amount of oxygen that permeates the first region is less than 20% of an amount of oxygen that permeates the second region.

10. The semiconductor device according to claim 9, wherein a side surface of the third oxide semiconductor film is aligned with a side surface of the gate insulating film.

11. The semiconductor device according to claim 9, wherein, a side surface of the first oxide semiconductor film is aligned with a side surface of the second oxide semiconductor film.

12. The semiconductor device according to claim 9, wherein the base insulating film contains phosphorus or boron.

* * * * *